US009865613B2

(12) United States Patent
Lee et al.

(10) Patent No.: US 9,865,613 B2
(45) Date of Patent: Jan. 9, 2018

(54) SEMICONDUCTOR DEVICES

(71) Applicant: Samsung Electronics Co., Ltd., Suwon-Si, Gyeonggi-do (KR)

(72) Inventors: Jong-min Lee, Ulsan (KR); Ho-jun Seong, Suwon-si (KR); Jae-ho Ahn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/058,273

(22) Filed: Mar. 2, 2016

(65) Prior Publication Data

US 2016/0300791 A1 Oct. 13, 2016

(30) Foreign Application Priority Data

Apr. 9, 2015 (KR) .................. 10-2015-0050239

(51) Int. Cl.
| | | |
|---|---|---|
| *H01L 23/48* | (2006.01) | |
| *H01L 27/11578* | (2017.01) | |
| *H01L 21/033* | (2006.01) | |
| *H01L 27/11524* | (2017.01) | |
| *H01L 27/1157* | (2017.01) | |
| *H01L 23/552* | (2006.01) | |
| *H01L 27/02* | (2006.01) | |
| *H01L 21/74* | (2006.01) | |

(52) U.S. Cl.
CPC .... *H01L 27/11578* (2013.01); *H01L 21/0337* (2013.01); *H01L 27/1157* (2013.01); *H01L 27/11524* (2013.01); *H01L 21/743* (2013.01); *H01L 23/552* (2013.01); *H01L 27/0203* (2013.01); *H01L 2924/01013* (2013.01); *H01L 2924/01079* (2013.01); *H01L 2924/14* (2013.01)

(58) Field of Classification Search
CPC .............. H01L 23/528; H01L 21/0271; H01L 21/02282; H01L 21/0337; H01L 27/11551; H01L 27/11578; H01L 21/3086; H01L 21/32139; H01L 27/11521
USPC ................. 257/773, 786, E21.476, E21.219; 438/761, 763, 942, 401
See application file for complete search history.

(56) References Cited

U.S. PATENT DOCUMENTS 7,892,982 B2    2/2011   Lee et al.
8,227,354 B2 *  7/2012   Kim ................. H01L 21/0337
                                                    257/E21.219

(Continued)

FOREIGN PATENT DOCUMENTS

JP    2012027237 A    2/2012
JP    2014500625 A    1/2014

*Primary Examiner* — Thinh T Nguyen
(74) *Attorney, Agent, or Firm* — Ward and Smith, P.A.

(57) ABSTRACT

There is provided a semiconductor device having an arrangement structure in which high-density line patterns having relatively small widths and relatively tight pitches may be formed. The semiconductor device includes a plurality of line patterns that are spaced apart from one another. The plurality of line patterns include a plurality of main lines that have a first gap therebetween and extend in a first direction and a plurality of sublines that are bent from one end of each of the plurality of main lines. The plurality of sublines have therebetween a distance that is greater than the first gap, and may be spaced apart from extension lines that extend from the one end of each of the plurality of main lines corresponding to the plurality of sublines in the first direction.

20 Claims, 70 Drawing Sheets

(56) References Cited

U.S. PATENT DOCUMENTS

| | | |
|---|---|---|
| 8,242,022 B2 | 8/2012 | Kim |
| 8,618,679 B2 | 12/2013 | Sim et al. |
| 8,764,999 B2 | 7/2014 | Dunn et al. |
| 8,835,321 B2 | 9/2014 | Ha |
| 8,874,253 B2 * | 10/2014 | Chen .................. H01L 21/0337 438/639 |
| 8,940,475 B2 | 1/2015 | Dunn et al. |
| 2010/0173492 A1 * | 7/2010 | Kim .................. H01L 21/0337 438/689 |
| 2010/0221904 A1 | 9/2010 | Brazzelli et al. |
| 2012/0241834 A1 * | 9/2012 | Nakajima ........... H01L 21/0337 257/316 |
| 2013/0048603 A1 | 2/2013 | Kim et al. |
| 2013/0105877 A1 | 5/2013 | Kim et al. |
| 2013/0175663 A1 | 7/2013 | You et al. |
| 2013/0316537 A1 * | 11/2013 | Chen .................. H01L 21/0337 438/689 |
| 2014/0073137 A1 | 3/2014 | Cinnor et al. |

* cited by examiner

FIG. 1
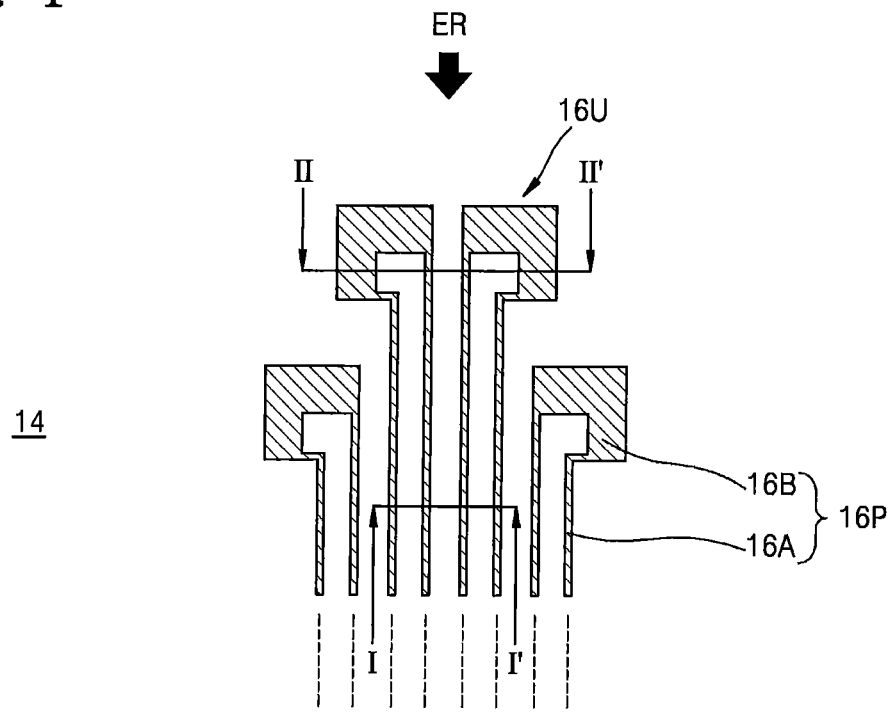
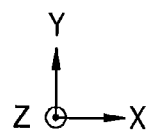

FIG. 16
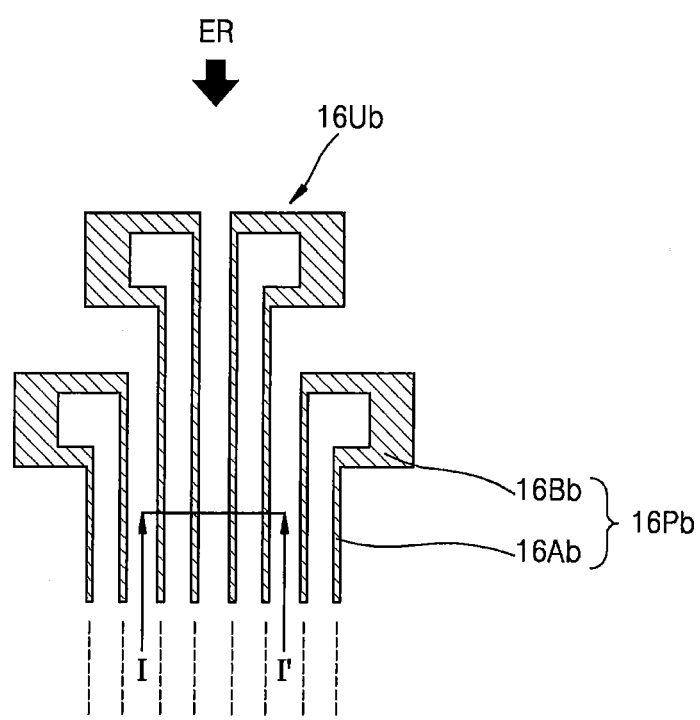
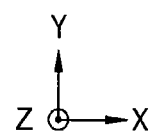

SEMICONDUCTOR DEVICES

CROSS-REFERENCE TO RELATED APPLICATION

This application claims the benefit of Korean Patent Application No. 10-2015-0050239, filed on Apr. 9, 2015, in the Korean Intellectual Property Office, the disclosure of which is incorporated herein in its entirety by reference.

BACKGROUND

In order to manufacture a highly integrated semiconductor device, a pattern may be miniaturized. In order to integrate many devices into a small area, each device may be as small as possible. To this end, a pitch of the pattern may be reduced. As design rules for semiconductor devices have greatly decreased, there is a limitation in forming a pattern having a fine pitch due to a resolution limit of photolithography. Accordingly, may be a demand for a technology of forming a fine pattern beyond a resolution limit of photolithography. Also, there may be a demand for a semiconductor device having a new arrangement structure using the technology.

SUMMARY

The inventive concept provides semiconductor devices having an arrangement structure in which high-density line patterns having relatively small widths and relatively tight pitches may be formed by using patterns having sizes within a resolution limit of photolithography.

According to an aspect of the inventive concept, there are provided semiconductor devices including a plurality of line patterns that are spaced apart from one another, each of the plurality of line patterns including a main line that extends in a first direction and a subline that is bent from one end of the main line and extends, wherein the plurality of line patterns include a plurality of line sets, wherein four line patterns that are continuously arranged form one line set, wherein at least one line set among the plurality of line sets includes: a first subline set including a first main line and a second main line that have a first gap therebetween and that extend in the first direction, and a first subline and a second subline that are bent respectively from one end of each of the first main line and the second main line and extend, have therebetween a second gap that is greater than the first gap, and include portions that extend in the first direction; and a second subline set including a third main line and a fourth main line that have the first gap therebetween and extend in the first direction, and a third subline and a fourth subline that have therebetween a third gap that is greater than the first gap and that extend in a second direction, which is different from the first direction, respectively from one end of each of the third main line and the fourth main line.

A direction which end portions of the first and second sublines face may be different from a direction which end portions of the third and fourth sublines face.

In the first subline and the second subline, lengths between the first and second main lines and the end portions of the first subline and the second subline may be different from each other.

In the third subline and the fourth subline, lengths between the third and fourth main lines and the end portions of the third subline and the fourth subline may be different from each other.

A sum of lengths of the first subline and the second subline between the first and second main lines and the end portions of the first subline and the second subline may be greater than a sum of lengths of the third subline and the fourth subline between the third and fourth main lines and the end portions of the third subline and the fourth subline.

Ends of the first subline and the second subline may be located on a straight line that extends in the second direction.

Ends of the third subline and the fourth subline may be located on a straight line that extends in the first direction.

In the at least one line set, first through fourth line patterns may be sequentially disposed, and a distance between an end of the second subline and an end of the third subline may be greater than the second gap or the third gap.

The first subline and the second subline may include first portions that respectively extend from the first main line and the second main line in the second direction and second portions that extend from the first portions in the first direction.

The first portions of the first subline and the second subline may have the first gap therebetween and extend in the second direction.

The second gap and the third gap may be the same size.

The second gap may be greater than the third gap.

The third gap may be greater than the second gap.

The first through fourth sublines may be bent in the same direction respectively from the one end of each of the first through fourth main lines and extend.

The semiconductor device may further include first through fourth pad patterns, wherein the at least one line set extends from the other ends of the first through fourth main lines and is connected to the first through fourth pad patterns.

Lengths of the second and third pad patterns may be greater than lengths of the first and fourth pad patterns in the first direction.

The first through fourth main lines and the first through fourth sublines may have the same width.

According to another aspect of the inventive concept, there is provided a semiconductor device including a plurality of line patterns that are spaced apart from one another and include a plurality of main lines that have a first gap therebetween and extend in a first direction and a plurality of sublines that are bent from one end of each of the plurality of main lines and extend, wherein ends of the plurality of sublines have therebetween a distance that is greater than the first gap, and are spaced apart from extension lines that extend in the first direction from the one end of each of the plurality of main lines.

At least some of the plurality of sublines may include portions that extend in the first direction.

A direction which end portions of some sublines of the plurality of sublines face may be different from a direction which end portions of other sublines of the plurality of sublines face.

Directions which end portions of two adjacent sublines among the plurality of sublines face may be the same.

In the two adjacent sublines whose end portions face the same direction, lengths between the ends of the main lines corresponding to the two adjacent sublines and the end portions of the two adjacent sublines may be different from each other.

Ends of the two adjacent sublines whose end portions face the same direction may be located on a straight line that is perpendicular to the direction which the end portions of the two adjacent sublines face.

In four continuous sublines among the plurality of sublines, a direction which end portions of two sublines face and a direction which end portions of the other two sublines face may be perpendicular to each other.

Each of the plurality of line patterns may further include pad lines that a pad pattern that connected to the other end of the main line.

The plurality of line patterns may constitute a plurality of flash memory devices, and at least one of the plurality of flash memory devices may include a three-dimensional (3D) memory array.

The 3D memory array may include a nonvolatile memory that is monolithically formed as at least one physical level of memory cells having active regions disposed on a silicon substrate.

According to another aspect of the inventive concept, there is provided a semiconductor device including a plurality of line patterns that are spaced apart from one another, each of the plurality of line patterns including a main line that extends in a first direction and a subline that is bent in a direction, which is different from a first direction, from one end of the main line and extends to an end of each of the plurality of line patterns, wherein the plurality of line patterns include a first subline set including first and second line patterns that are adjacent one another and a second subline set including third and fourth line patterns that are adjacent one another among four line patterns that are continuously arranged, wherein a direction which end portions of sublines of the first and second line patterns face is the first direction and a direction which end portions of sublines of the third and fourth line patterns face is a second direction that is perpendicular to the first direction.

Ends of sublines of the first and second line patterns may be located on a straight line that extends in the second direction, and ends of sublines of the third and fourth line patterns may be located on a straight line that extends in the first direction.

Main lines of the first through fourth line patterns may have a first gap therebetween and may extend in the first direction, wherein each of a distance between ends of sublines of the first and second line patterns, a distance between ends of sublines of the second and third line patterns, and a distance between ends of sublines of the third and fourth line patterns is greater than the first gap.

Some embodiments of the present inventive concept include semiconductor devices that include a plurality of line patterns that are spaced apart from one another and that include a plurality of main lines that extend in a first direction, a plurality of sublines that are bent from respective ends of the plurality of main lines, and a plurality of pad patterns that are connected to other respective ends of the main line. In some embodiments, ends of the plurality of sublines have therebetween a distance that is greater than a gap that is between the plurality of main lines.

In some embodiments, the at least some of the plurality of sublines comprise portions that extend in a different direction from the first direction. Some embodiments provide that at least some of the plurality of sublines comprise portions that extend in the first direction. Some embodiments provide that a direction that end portions of some sublines of the plurality of sublines face is different from a direction that end portions of other sublines of the plurality of sublines face. In some embodiments, in four continuous sublines among the plurality of sublines, a direction that end portions of two sublines face and a direction that end portions of the other two sublines face are perpendicular to each other.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Example embodiments of the inventive concept will be more clearly understood from the following detailed description taken in conjunction with the accompanying drawings in which:

FIGS. 1 through 13 show plan views and cross-sectional views for explaining a method of manufacturing a semiconductor device according to some embodiments of the present inventive concept;

FIGS. 16 through 19 show plan views for explaining methods of manufacturing a semiconductor device according to some embodiments of the present inventive concept;

DETAILED DESCRIPTION

Figure 2:
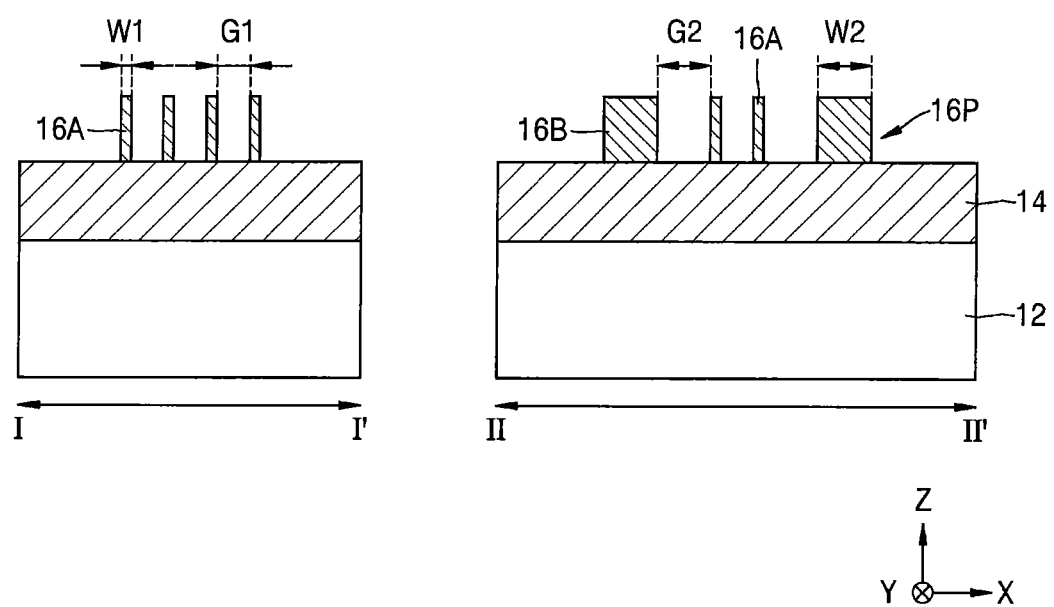

The inventive concept now will be described more fully hereinafter with reference to the accompanying drawings, in which elements of the inventive concept are shown. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art. In the drawings, the thicknesses of layers and regions and the sizes of components may be exaggerated for clarity.

It will be understood that when an element is referred to as being "on", "connected to" or "coupled to" another element, it may be directly on, connected or coupled to the other element or intervening elements may be present. Other words used to describe the relationship between elements should be interpreted in a like fashion (e.g., "between" versus "directly between", etc.).

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the inventive concept.

As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, components, or groups thereof, but do not preclude the presence or addition of one or more other features, integers, steps, operations, elements, components, or groups thereof.

Unless otherwise defined, all terms used herein have the same meaning as commonly understood by one of ordinary skill in the art to which this inventive concept belongs.

As used herein, the term "and/or" includes any and all combinations of one or more of the associated listed items. Expressions such as "at least one of" when preceding a list of elements, modify the entire list of elements and do not modify the individual elements of the list.

The inventive concept will now be described more fully with reference to the accompanying drawings, in which exemplary embodiments of the inventive concept are shown.

FIGS. 1 through 13 show plan views and cross-sectional views for explaining methods of manufacturing a semiconductor device according to an some embodiments of the present inventive concept.

FIGS. 1 and 2 show a plan view and cross-sectional views for explaining an operation of forming a base pattern 16P to manufacture a semiconductor device according to some embodiments of the present inventive concept. In detail, FIG. 2 shows cross-sectional views taken along lines I-I' and II-II' of FIG. 1.

Referring to FIGS. 1 and 2, a feature layer 14 and the base pattern 16P are sequentially formed on a substrate 12.

The substrate 12 may include a semiconductor material. The substrate 12 may include, for example, silicon (Si). In some embodiments, the substrate 12 may include a semiconductor element such as germanium (Ge) or a compound semiconductor material such as silicon carbide (SiC), gallium arsenide (GaAs), indium arsenide (InAs), and/or indium phosphide (InP). In some embodiments, the substrate 12 may include a conductive film and/or an insulating film that is formed on the semiconductor material, and may be formed of, for example, a metal, a semiconductor, and/or an insulating material. The substrate 12 may be formed, for example, on the semiconductor material, and may have a multi-layer structure for forming a tunneling insulating layer, a charge storage layer, a blocking insulating layer, and/or a gate electrode layer. In some embodiments, the substrate 12 may have a silicon-on-insulator (SOI) structure. For example, the substrate 12 may include a buried oxide (BOX) layer. The substrate 12 may include a conductive region, for example, a well doped with impurities. The substrate 12 may have any of various device isolation structures such as a shallow trench isolation (STI) structure.

The feature layer 14 may be formed of any of various materials. For example, the feature layer 14 may be formed of, but is not limited to, a metal, an alloy, metal carbide, metal nitride, metal oxynitride, metal oxycarbide, semiconductor, polysilicon, oxide, nitride, oxynitride, a hydrocarbon compound, and/or a combination thereof. The feature layer 14 may constitute an active region and/or another region of the substrate 12, for example, a semiconductor substrate. The feature layer 14 may constitute a mask layer that is used to define a pattern on the substrate 12 or a material layer (not shown) that is disposed under the feature layer 14. In some embodiments, the feature layer 14 may be a conductive film or an insulating film that is formed on the substrate 12, and may be formed of, for example, a metal, a semiconductor, and/or an insulating material. The feature layer 14 may be formed, for example, on the substrate 12, and have a multi-layer structure for forming a tunneling insulating layer, a charge storage layer, a blocking insulating layer, and/or a gate electrode layer.

The base pattern 16P may be formed of a material having an etch selectivity with respect to the feature layer 14 and a spacer layer 24A that will be described below with reference to FIGS. 4 and 5 in a subsequent process. In some exemplary embodiments, the base pattern 16P may be formed of, but is not limited to, a carbon-containing film, a silicon nitride film, a silicon oxide film, and/or a polysilicon film. For example, the base pattern 16P may be formed of a spin-on hardmask (SOH) material. In some exemplary embodiments, the SOH material may be formed of a hydrocarbon compound having a relatively high carbon content ranging from about 85 weight % to about 99 weight % based on a total weight of the SOH material and/or a derivative of the hydrocarbon compound.

A process of forming the base pattern 16P made of an SOH material will now be explained. First, an organic compound layer having a thickness ranging from about 1000 Å to about 5000 Å is formed on the feature layer 14. In this case, spin coating and/or another deposition process may be used, if necessary. An organic compound may be formed of a hydrocarbon compound including an aromatic ring such as phenyl, benzene, and/or naphthalene and/or a derivative of the hydrocarbon compound. The organic compound may be formed of a material having a relatively high carbon content ranging from about 85 weight % to about 99 weight % based on a total weight of the material. A carbon-containing film may be formed by first baking the organic compound layer at a temperature ranging from about 150° to about 350°. The first baking may be performed for about 60 seconds. Next, the carbon-containing film is second baked at a temperature ranging from about 300° to about 550° and is hardened. The second baking may be performed for about 30 seconds to about 300 seconds. As such, since the carbon-containing film is hardened by the second baking, even when a deposition process is performed at a relatively high temperature of about 400° or more in order to form another film on the carbon-containing film, the deposition process does not adversely affect the carbon-containing film. The base pattern 16P may be formed by patterning the hardened carbon-containing film by using photolithography.

However, according to the inventive concept, a material of the base pattern 16P is not limited to that above. For example, the base pattern 16P may include a first base pattern layer and a second base pattern layer that is formed on the first base pattern layer. The second base pattern layer may be formed of a material having an etch selectivity with respect to the first base pattern layer, the feature layer 14, and a spacer layer 24A that will be described below with reference to FIGS. 4 and 5 in a subsequent process. In some exemplary embodiments, when the first base pattern layer is formed of an SOH material, the second base pattern layer may be formed of any of silicon-containing materials such as silicon oxynitride, silicon oxide, silicon nitride, silicon carbonitride, and/or polysilicon. In some embodiments, the second base pattern layer may be formed of a metal or an organic material.

The base pattern 16P may be formed by forming a base pattern material layer, forming a mask pattern on the base pattern material layer, and etching the base pattern material layer by using the mask pattern as an etching mask.

The base pattern 16P may include a plurality of main base patterns 16A and a sub-base pattern 16B that connects two adjacent main base patterns 16A among the plurality of main base patterns 16A. The sub-base pattern 16B may be connected to the main base patterns 16A to contact an edge area ER.

The plurality of main base patterns 16A may be spaced apart from one another to have a first gap G1 therebetween in a first direction X and may be continuously arranged. Each of the plurality of main base patterns 16A may have a first width W1 and may extend in a second direction Y.

In some exemplary embodiments, the first width W1 may be 1 F that is a minimum feature size of the semiconductor device to be formed and the first gap G1 may be greater than 1 F. For example, the first gap G1 may be 3 F. In some exemplary embodiments, the first width W1 may range from several nanometers (nm) to tens of nm.

One sub-base pattern 16B may extend from one end of each of two adjacent main base patterns 16A, may connect the two adjacent main base patterns 16A, and may constitute a unit base pattern 16U along with the two adjacent main base patterns 16A that are connected to the one sub-base pattern 16B. Portions of the unit base pattern 16U that extend to each have the first width W1 may be defined as the main base patterns 16A and a portion of the unit base pattern 16U that extends to have a width greater than the first width W1 may be defined as the sub-base pattern 16B. The main base pattern 16A that is connected to a portion of the sub-base pattern 16B that extends in the second direction Y may have a portion that extends in the first direction X.

The sub-base pattern 16B may extend to have a second width W2 that is greater than the first width W1. A width of a portion of the sub-base pattern 16B that extends in the first direction X and a width of the portion of the sub-base pattern 16B that extends in the second direction Y may be the same or different from each other. Even when the width of the portion of the sub-base pattern 16B that extends in the first direction X and the width of the portion of the sub-base pattern 16B that extends in the second direction Y are different from each other, the widths may be each greater than the first width W. For example, the second width W2 may range from about 2 F to about 6 F.

A distance between the main base pattern 16A and the sub-base pattern 16B that is connected to the main base pattern 16A in the first direction X may be a second gap G2 that is greater than the first gap G. The second gap G2 may be the same as or greater than a sum (W1+G1) of the first width W1 and the first gap Gf1. For example, the second gap G2 may range from about 4 F to about 8 F.

However, the second width W2 and the second gap G2 are not limited thereto, and may be respectively greater than 6 F and 8 F according to a length of the portion of the sub-base pattern 16B that extends in the first direction X and a length of the portion of the sub-base pattern 16B that extends in the second direction Y.

In one unit base pattern 16U, the sub-base pattern 16B may protrude beyond one main base pattern 16A among two adjacent main base patterns 16A in the first direction X. That is, in one unit base pattern 16U, the sub-base pattern 16B may extend from the main base pattern 16A whose length in the second direction Y is relatively long to protrude beyond the main base pattern 16A whose length in the second direction Y is relatively short.

In one unit base pattern 16U, one end of one main base pattern 16A whose length in the second direction Y is relatively long among two adjacent main base patterns 16A may be directly connected to the portion of the sub-base pattern 16B that extends in the first direction X, one main base pattern whose length in the second direction Y is relatively short may be bent into the first direction X, may extend, and may be directly connected to the portion of the sub-base pattern 16B that extends in the second direction Y, and the portion of the sub-base pattern 16B that extends in the first direction X and the portion of the sub-base pattern 16B that extends in the second direction Y may be directly connected to each other. In some embodiments, the sub-base pattern 16B having a width that is greater than the first width W1 may be formed between one end of the main base pattern 16A whose length in the second direction Y is relatively short and the portion of the sub-base pattern 16B that extends in the second direction Y.

That is, one unit base pattern 16U may include the sub-base pattern 16B having an L-shape and two adjacent main base patterns 16A that are connected to both ends of the sub-base pattern 16B having the L-shape, and the main base pattern 16A whose length in the second direction Y is relatively long may extend in the second direction Y and may be directly connected to one end of the sub-base pattern 16B having the L-shape and the main base pattern 16A whose length in the second direction Y is relatively short may extend in the second direction Y, may be bent into the first direction X, and may be directly connected to the other end of the sub-base pattern 16B having the L-shape.

In two adjacent unit base patterns 16P, the sub-base patterns 16B may be located at different levels in the second direction Y. Also, a plurality of the unit base patterns 16P may be arranged to be symmetric with respect to an extension line that extends in the second direction Y.

Figure 3:
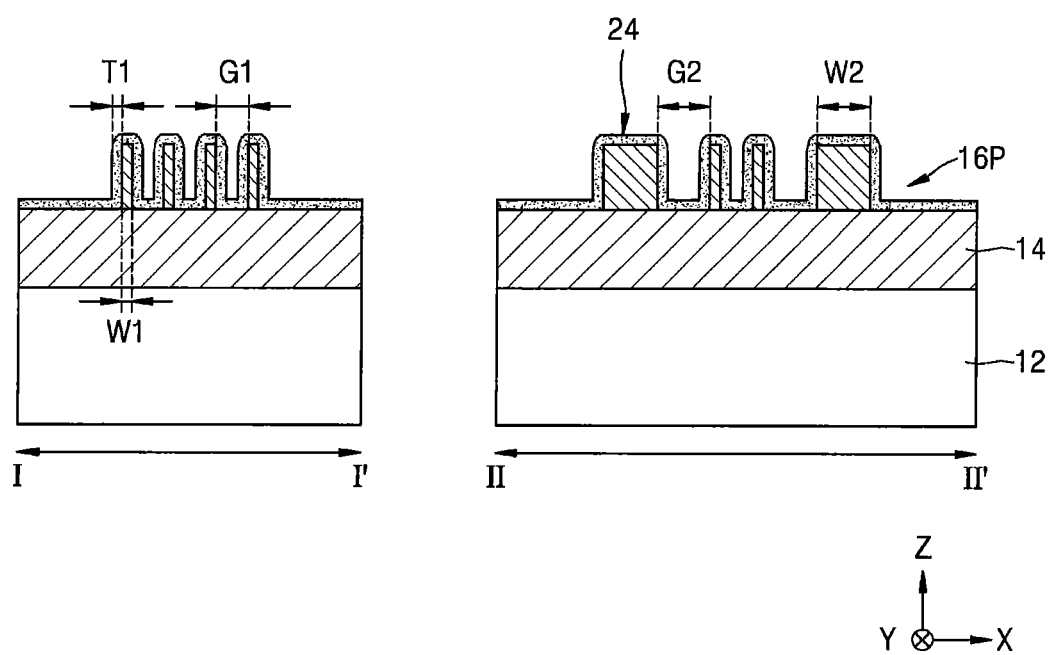

FIG. 3 shows cross-sectional views for explaining an operation of forming a spacer material layer 24 to manufacture a semiconductor device according to some embodiments. In detail, FIG. 3 shows cross-sectional views taken along lines I-I' and II-II' of FIG. 1.

Referring to FIG. 3, the spacer material layer 24 is formed on the substrate 12 including the base pattern 16P. The spacer material layer 24 may be formed to a uniform thickness to cover an exposed surface of the base pattern 16P and an exposed surface of the feature layer 14. For example, the spacer material layer 24 may have a first thickness T1. The first thickness T1 may be the same as or similar to, for example, the first width W1. The spacer material layer 24 may be formed of a material having an etch selectivity with respect to the feature layer 14 and the base pattern 16P. In some embodiments, the spacer material layer 24 may be formed of a silicon oxide film that is formed by using atomic layer deposition (ALD).

FIGS. 4 through 7 show plan views and cross-sectional views for explaining an operation of forming the spacer layer 24A to manufacture a semiconductor device according to some embodiments. In detail, FIGS. 5 and 7 respectively show cross-sectional views taken along lines I-I' and II-II' of FIGS. 4 and 6.

Figure 4:
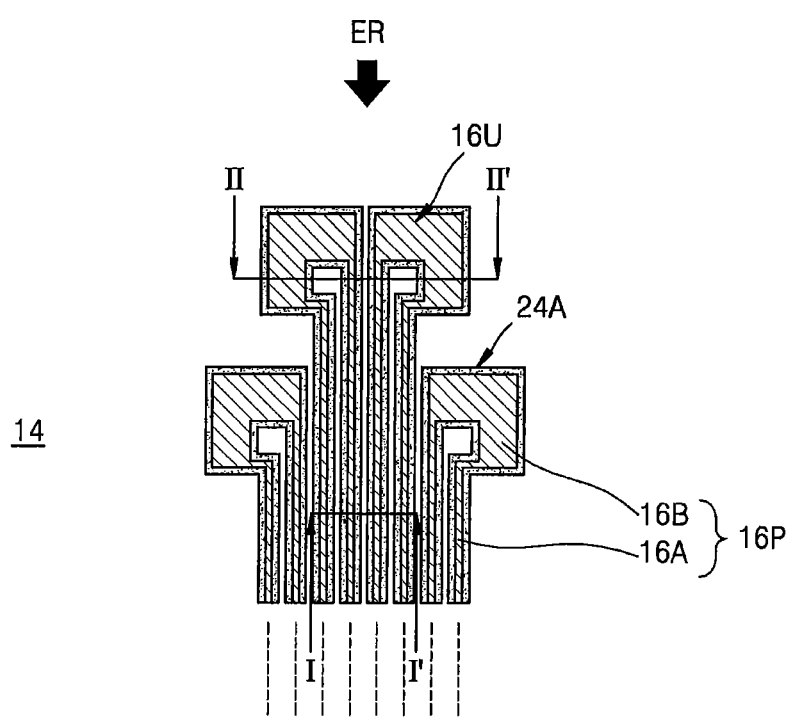
Figure 5:
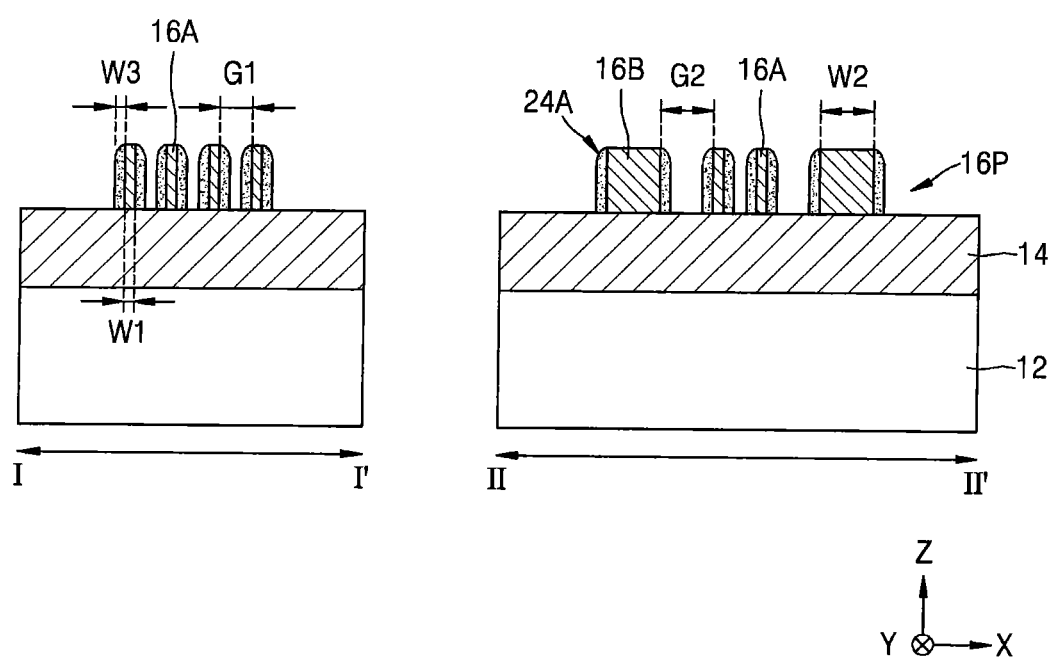

Referring to FIGS. 4 and 5, the spacer layer 24A that covers side walls of the base pattern 16P is formed by performing etch-back on the spacer material layer 24 of FIG. 3. The spacer layer 24A may expose a part of a top surface of the feature layer 14 and a top surface of the base pattern 16P. The spacer layer 24A may have a third width W3. The third width W3 may be the same as the first thickness T1 of FIG. 3, and may be the same as or similar to the first width W1. In some embodiments, the third width W3 may be 1 F.

Figure 6:
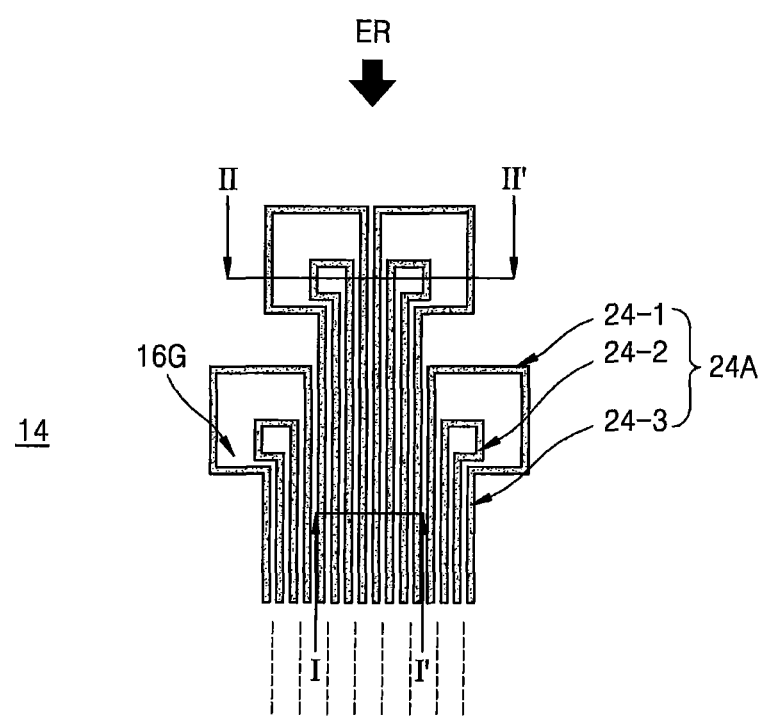
Figure 7:
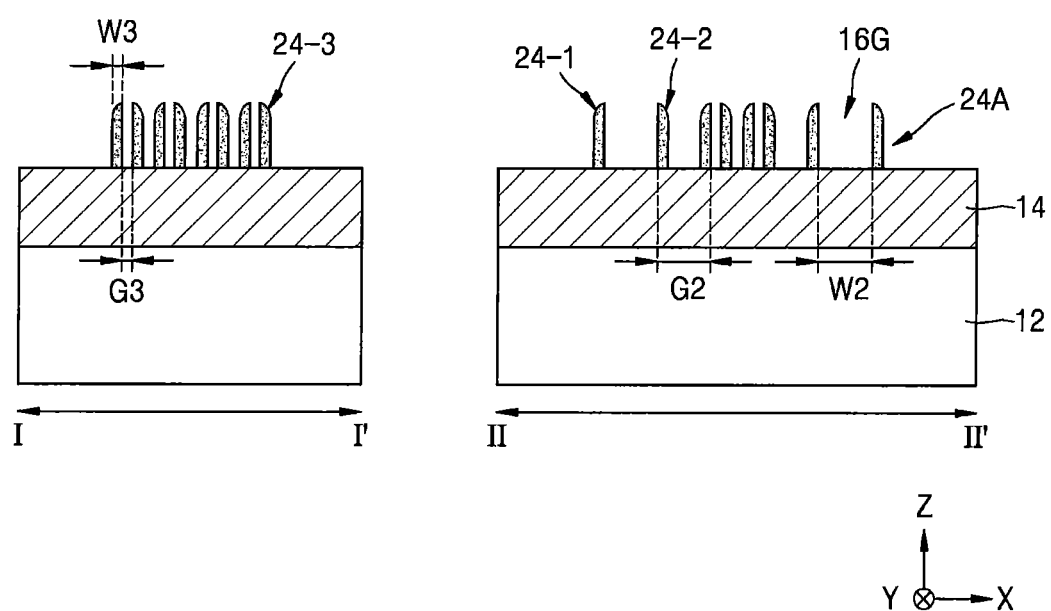

Referring to FIGS. 6 and 7, the spacer layer 24A is caused to remain on the feature layer 14 by removing the base pattern 16P of FIGS. 4 and 5. When the base pattern 16P is formed of an SOH film, for example, ashing or stripping may be used in order to remove the base pattern 16P. In some embodiments, the base pattern 16P may be removed by using dry or wet etching according to a material of the base pattern 16P. A base space 16G may be formed in a portion obtained by removing the base pattern 16P.

The spacer layer 24A may include an outer spacer layer 24-1, an inner spacer layer 24-2, and main spacer layers 24-3. The outer spacer layer 24-1 and the inner spacer layer 24-2 may be portions of the spacer layer 24A that cover an outer side wall and an inner side wall of the sub-base pattern 16B of FIG. 4, and the main spacer layers 24-3 may be portions of the spacer layer 24A that cover both side walls of the main base patterns 16A of FIG. 4.

Among four continuous main spacer layers 24-3, two outer main spacer layers 24-3 may be connected to each other by the outer spacer layer 24-1 and two inner main spacer layers 24-3 may be connected to each other by the inner spacer layer 24-2.

The spacer layer 24A may have the third width W3. The plurality of main spacer layers 24-3 may have a third gap G3 therebetween and may extend in the second direction Y. The third gap G3 may be the same as or similar to the first width W1. In some embodiments, the third gap G3 may be 1 F.

Figure 8:
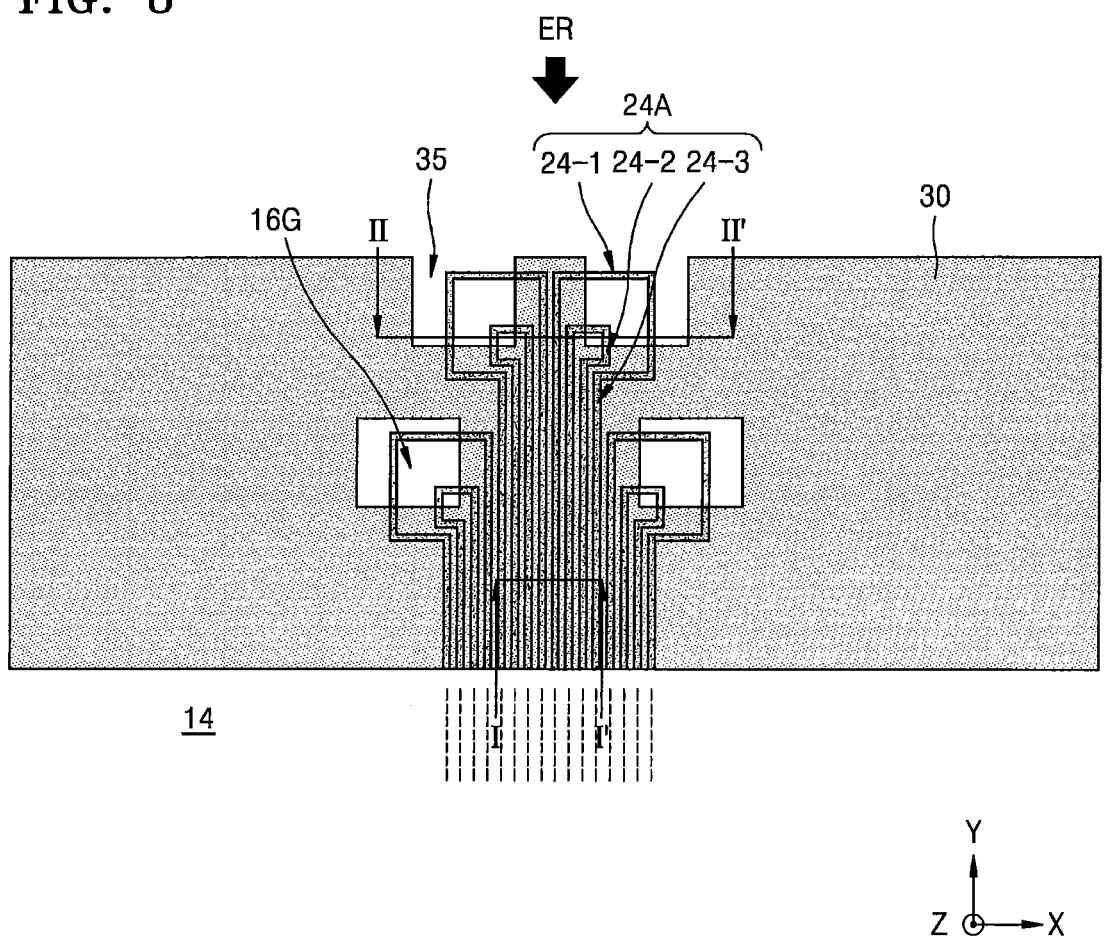
Figure 9:
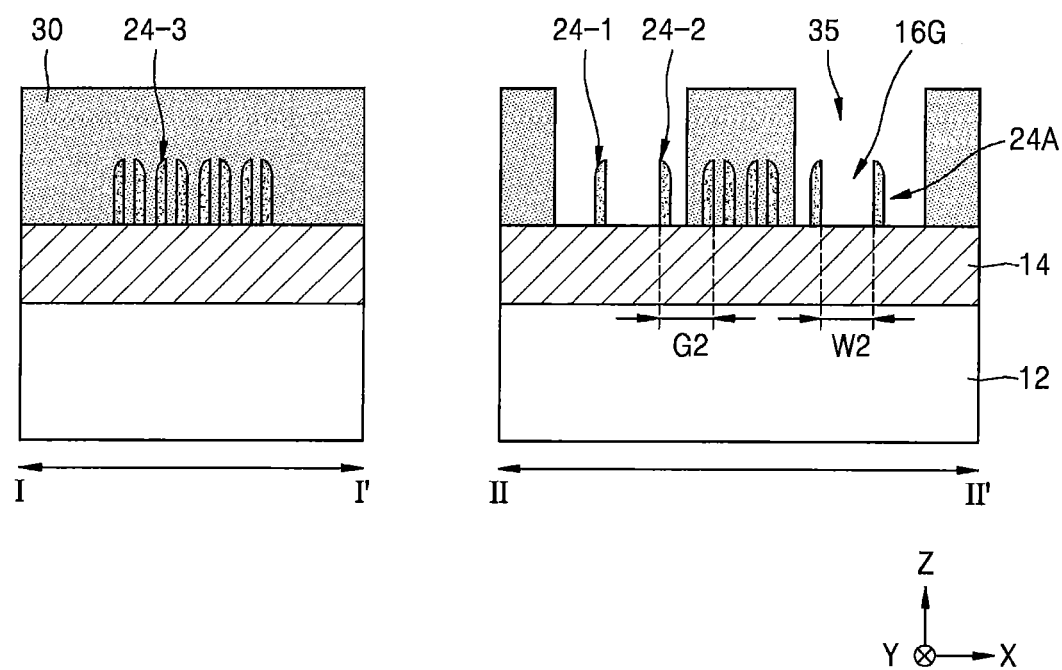

FIGS. 8 and 9 show a plan view and cross-sectional views for explaining an operation of forming a mask pattern 30 to manufacture a semiconductor device according to some embodiments. In detail, FIG. 9 shows cross-sectional views taken along lines I-I' and II-II' of FIG. 8.

Referring to FIGS. 8 and 9, the mask pattern 30 having an opening 35 is formed on the substrate 12 including the spacer layer 24A. The opening 35 may expose portions of the outer spacer layer 24-1 and the inner spacer layer 24-2 that are adjacent one another. The mask pattern 30 may entirely cover the main spacer layers 24-3, and may cover a portion of the outer spacer layer 24-1 and a portion of the inner spacer layer 24-2 that are connected to the main spacer layers 24-3.

A portion of the base space 16G that is formed between the outer spacer layer 24-1 and the inner spacer layer 24-2 may be exposed through the opening 35 of the mask pattern 30.

The mask pattern 30 may be formed of a photoresist that is formed by using, for example, photolithography.

Figure 10:
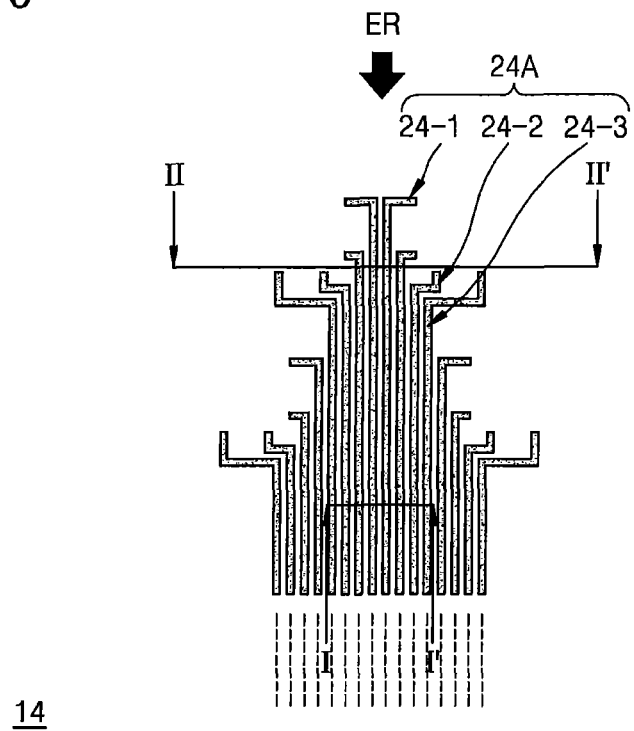
Figure 11:
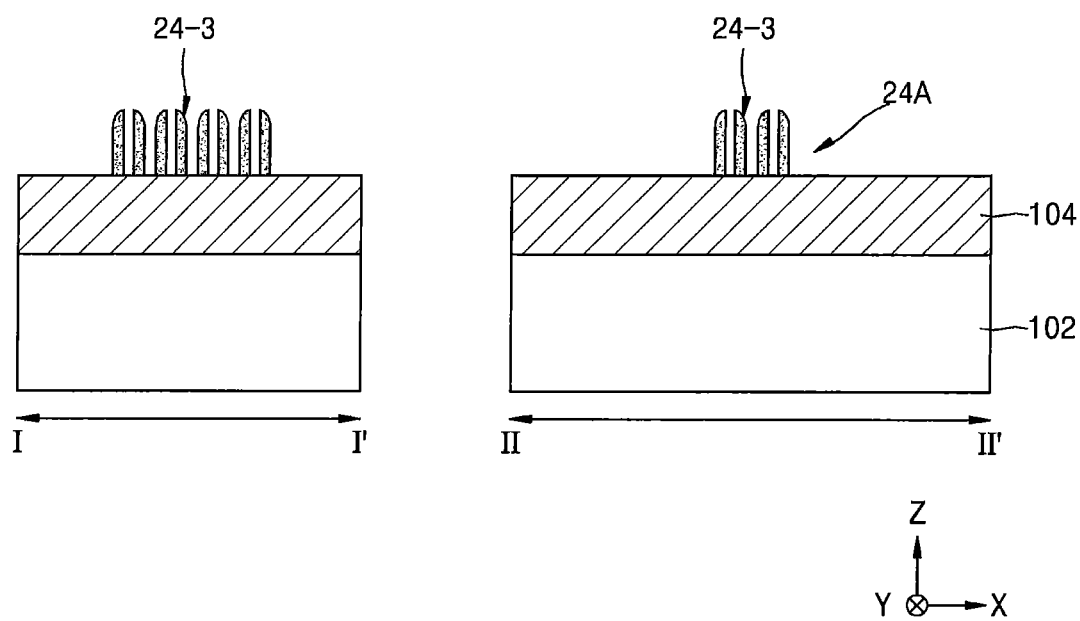

FIGS. 10 and 11 show a plan view and cross-sectional views for explaining an operation of removing a portion of the spacer layer 24A to manufacture a semiconductor device according to some embodiments. In detail, FIG. 11 shows cross-sectional views taken along lines I-I' and II-II' of FIG. 10.

Referring to FIGS. 10 and 11, the outer spacer layer 24-1 and the inner spacer layer 24-2 are respectively cut by performing a trimming process for removing the portions of the outer spacer layer 24-1 and the inner spacer layer 24-2 that are exposed through the opening 35 by using the mask pattern 30 of FIGS. 8 and 9 as an etching mask. Accordingly, two main spacer layers 24-3 that are connected to each other by the outer spacer layer 24-1 or the inner spacer layer 24-2 may be separated from each other.

Among four continuous main spacer layers 24-3, each of two outer main spacer layers 24-3 may be connected to a portion of the outer spacer layer 24-1 and each of two inner main spacer layers 24-3 may be connected to a portion of the inner spacer layer 24-2.

The mask pattern 30 may be removed after the portions of the outer spacer layer 24-1 and the inner spacer layer 24-2 are removed.

Figure 12:
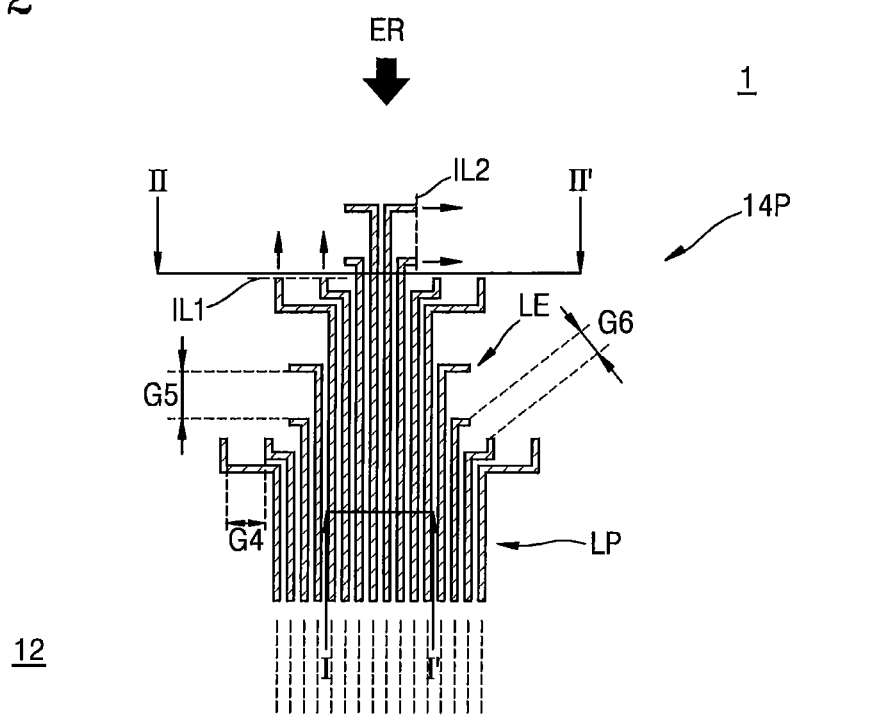
Figure 13:
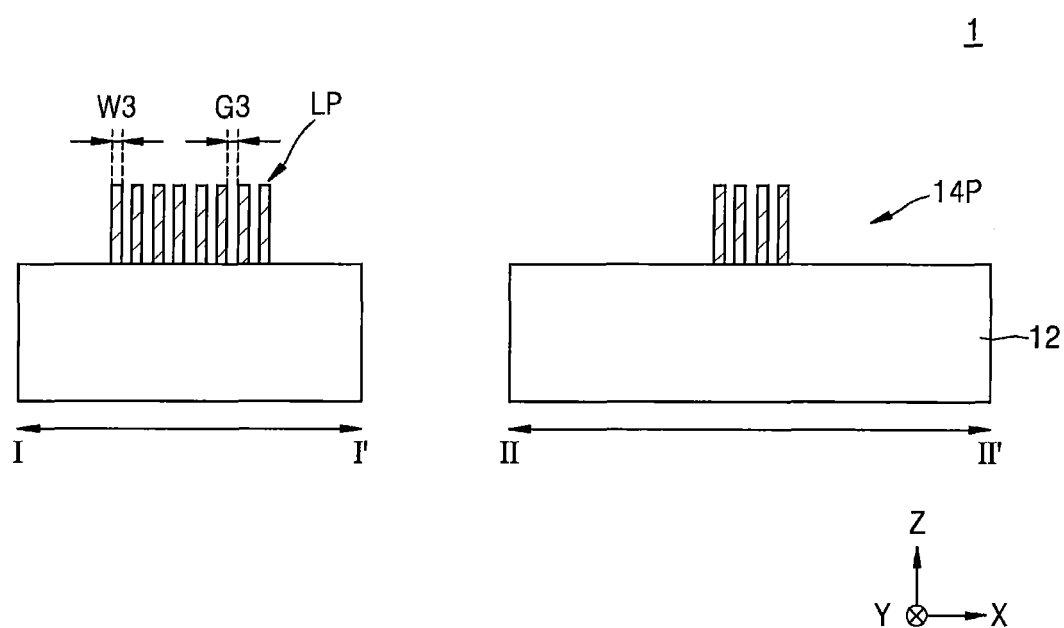

FIGS. 12 and 13 show a plan view and cross-sectional views illustrating a feature pattern 14P included in a semiconductor device 1 according to some embodiments. In detail, FIG. 13 shows cross-sectional views taken along lines I-I' and II-II' of FIG. 12.

Referring to FIGS. 12 and 13, the semiconductor device 1 includes the feature pattern 14P. The feature pattern 14P may be formed by etching the feature layer 14 by using the spacer layer 24A including the outer spacer layer 24-1, the inner spacer layer 24-2, and the main spacer layers 24-3 as an etching mask. The feature pattern 14P may have a shape obtained by transferring a shape of the spacer layer 24A of FIGS. 10 and 11. The feature pattern 14P may include a plurality of line patterns LP that are spaced apart from one another.

The plurality of line patterns LP each having the third width W3 may have the third gap G3 therebetween and may extend in the second direction Y. A line end LE of each of the plurality of line patterns LP may be spaced apart from an extension line that extends in the second direction Y from the line pattern LP.

Among four continuous line patterns LP, a direction which the line ends LE of one adjacent pair of line patterns LP face and a direction which the line ends LE of another adjacent pair of line patterns LP face may be different from each other.

Among four continuous line patterns LP, a direction which the line ends LE of one adjacent pair of line patterns LP face may be the first direction X and a direction which the line ends LE of another adjacent pair of line patterns LP face may be the second direction Y. That is, among four continuous line patterns LP, one adjacent pair of line patterns LP may extend in the second direction Y, may be bent, and may extend in the first direction X, and may have the line ends LE face the first direction X, and another adjacent pair of line patterns LP may extend in the second direction Y, may be bent, may extend in the first direction, may be bent, and may extend in the second direction Y, and may have the line ends LE face the second direction Y. Among the adjacent pair of line patterns LP whose line ends LE face the second direction Y, portions that extend in the first direction X may have the third gap G3 therebetween.

When a direction which the line ends LE of one adjacent pair of line patterns LP among four continuous line patterns LP face is the first direction X, the line ends LE of the adjacent pair of line patterns LP may be located on a straight line IL1 that extends in the second direction Y that is perpendicular to the first direction X. When a direction which the line ends LE of another adjacent pair of line patterns LP among the four continuous line patterns LP face is the second direction Y, the line ends LE of the adjacent pair of line patterns LP may be located on a straight line IL2 that extends in the first direction X that is perpendicular to the second direction Y.

In one pair of line patterns LP that have the third gap G3 therebetween and whose line ends LE face the same direction, lengths between portions that extend in the second direction Y and the line ends LE of the line patterns LP may be different from each other.

In one adjacent pair of line patterns LP that extend in the second direction Y, are bent, and extend in the first direction X, and have the line ends LE face the first direction X, lengths of portions that extend in the first direction X may be different from each other. In another adjacent pair of line patterns LP that extend in the second direction Y, are bent, extend in the first direction X, are bent, and extend in the second direction Y, and have the line ends LE face the second direction Y, lengths of portions that extend in the first direction X, are bent, and extend in the second direction Y to the line ends LE may be different from each other.

In two pairs of line patterns LP whose line ends LE face different directions and that have the third gap G3 therebetween among four continuous line patterns LP, sums of lengths between portions that extend in the second direction Y and the line ends LE of the line patterns LP may be different from each other. For example, a sum of lengths between portions that extend in the second direction Y and the line ends LE of the line patterns LP in one pair of line patterns LP whose line ends LE face the first direction X and that have the third gap G3 therebetween may be less than a sum of lengths between portions that extend in the second direction Y and the line ends LE of the line patterns LP in another pair of line patterns LP whose line ends LE face the second direction Y and that have the third gap G3 therebetween.

When a direction which the line ends LE of one adjacent pair of line patterns LP among four continuous line patterns LP face is the second direction Y, a distance between the line ends LE of the adjacent pair of line patterns LP may be a fourth gap G4. When a direction which the line ends LE of another adjacent pair of line patterns LP among the four continuous line patterns LP face is the first direction X, a distance between the line ends LE of the adjacent pair of line patterns LP may be a fifth gap G5. A distance between the line ends LE of two inner line patterns LP among the four continuous line patterns LP may be a sixth gap G6.

The fourth through sixth gaps G4, G5, and G6 may be greater than the third gap G3. The sixth gap G6 may be greater than the fourth gap G4 or the fifth gap G5. The fourth gap G4 and the fifth gap G5 may be the same, but the present embodiment is not limited thereto and the fourth gap G4 may be greater or less than the fifth gap G5. The fourth gap G4, the fifth gap G5, and the sixth gap G6 may range, for example, from about 2 F to about 6 F.

Accordingly, the plurality of line patterns LP may have the third gap G3 in the first direction X, may be continuously arranged, and may extend in the second direction Y, and the line ends LE of the plurality of line patterns LP may have therebetween the fourth gap G4, the fifth gap G5, or the sixth gap G6 that is greater than the third gap G3. Accordingly, when the feature layer 14 is etched by using the spacer layer 24A that has been trimmed in FIGS. 10 and 11 as an etching mask, even though an end portion of the feature pattern 14P, that is, the line end LE of each line pattern LP, has a thickness greater than the third width W3, bridge failure may be prevented.

Figure 14:
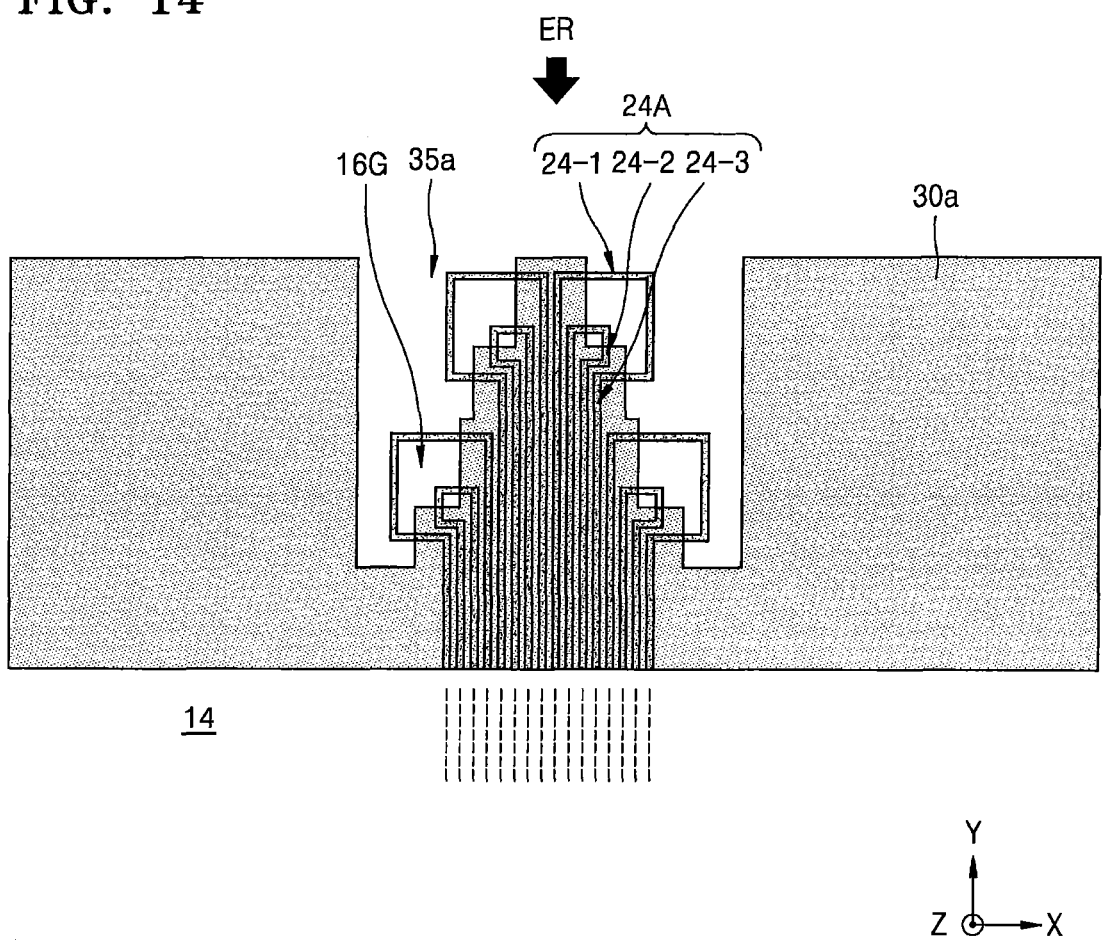
FIGS. 14 and 15 show plan views for explaining methods of manufacturing a semiconductor device according to some embodiments of the present inventive concept.
Figure 15:
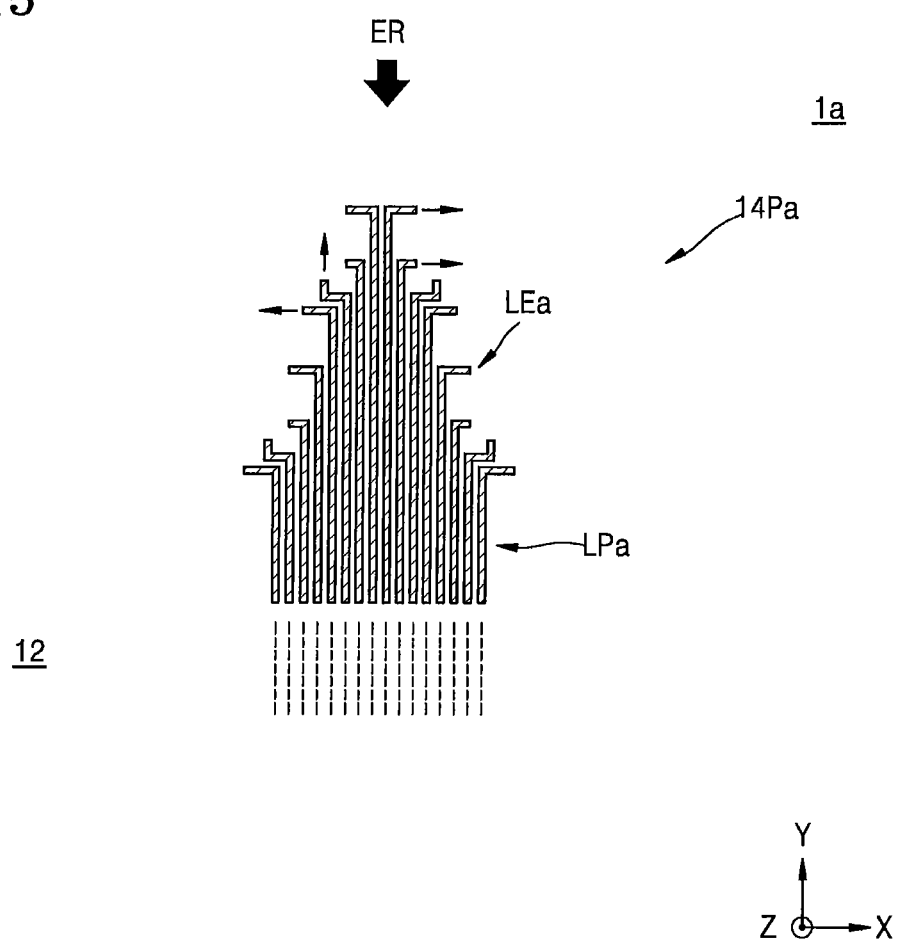

FIGS. 14 and 15 show plan views for explaining methods of manufacturing a semiconductor device according to some embodiments.

FIG. 14 shows a plan view for explaining an operation of forming a mask pattern 30a to manufacture a semiconductor device according to some embodiments.

Referring to FIG. 14, the mask pattern 30a having an opening 35a is formed on the substrate 12 including the spacer layer 24A. The opening 35a may expose portions of the outer spacer layer 24-1 and the inner spacer layer 24-2 that are adjacent one another. The mask pattern 30a may entirely cover the main spacer layers 24-3, and may cover a portion of the outer spacer layer 24-1 and a portion of the inner spacer layer 24-2 that are connected to the main spacer layers 24-3.

A portion of the base space 16G that is formed between the outer spacer layer 24-1 and the inner spacer layer 24-2 may be exposed through the opening 35a of the mask pattern 30a.

The mask pattern 30a may be formed of a photoresist that is formed by using, for example, photolithography.

The mask pattern 30a of FIG. 14 may cover a smaller portion of the outer spacer layer 24-1 than the mask pattern 30 of FIG. 8. That is, a portion of the outer spacer layer 24-1 that is exposed through the opening 35a of the mask pattern 30a of FIG. 14 may be larger than that of the opening 35 of the mask pattern 30 of FIG. 8.

Next, the outer spacer layer 24-1 and the inner spacer layer 24-2 are cut by performing a trimming process for removing the portions of the outer spacer layer 24-1 and the inner spacer layer 24-2 that are exposed through the opening 35a by using the mask pattern 30a as an etching mask in a method similar to that described with reference to FIGS. 10 and 11.

FIG. 15 shows a plan view illustrating a feature pattern 14Pa included in a semiconductor device 1a according to an exemplary embodiment.

Referring to FIG. 15, the semiconductor device 1a includes the feature pattern 14Pa. The feature pattern 14Pa may be formed by removing portions of the outer spacer layer 24-1 and the inner spacer layer 24-2 by using the mask pattern 30a of FIG. 14 as an etching mask and etching the feature layer 14 by using a remaining portion of the spacer layer 24A as an etching mask.

In the feature pattern 14Pa of FIG. 15, unlike in the feature pattern 14P of FIG. 10, directions which line ends LEa of three line patterns LPa among four continuous line patterns LPa face are parallel to one another and a direction which the line end LEa of the remaining one line pattern LPa faces may be different. That is, directions which the line ends LEa of three line patterns LPa among four continuous line patterns LPa face may be the first direction X or a direction that is opposite to the first direction X, and a direction which the line end LEa of the remaining one line pattern LPa faces may be the second direction Y.

Accordingly, in the feature pattern 14Pa, since directions which the line ends LEa of four adjacent line patterns LPa face are distributed, even when the line end LE of each line pattern LP is relatively thick, bridge failure may be prevented.

FIGS. 16 through 19 show plan views for explaining methods of manufacturing a semiconductor device according to some embodiments.

FIG. 16 shows a plan view for explaining an operation of forming a base pattern 16Pb to manufacture a semiconductor device according to some embodiments.

Referring to FIG. 16, the base pattern 16Pb is formed on the feature layer 14. The base pattern 16Pb may include a plurality of main base patterns 16Ab and a sub-base pattern 16Bb that connects two adjacent main base patterns 16Ab among the plurality of main base patterns 16Ab.

One sub-base pattern 16Bb may extend from ones of two adjacent main base patterns 16Ab, may connect the two adjacent main base patterns 16Ab, and may constitute a unit base pattern 16Ub along with the two adjacent main base patterns 16Ab that are connected to the sub-base pattern 16Bb.

The sub-base pattern 16Bb may include two portions that extend in the first direction X to have different lengths and a portion that extends in the second direction Y to connect the two portions that extend in the first direction X to have different lengths.

Figure 17:
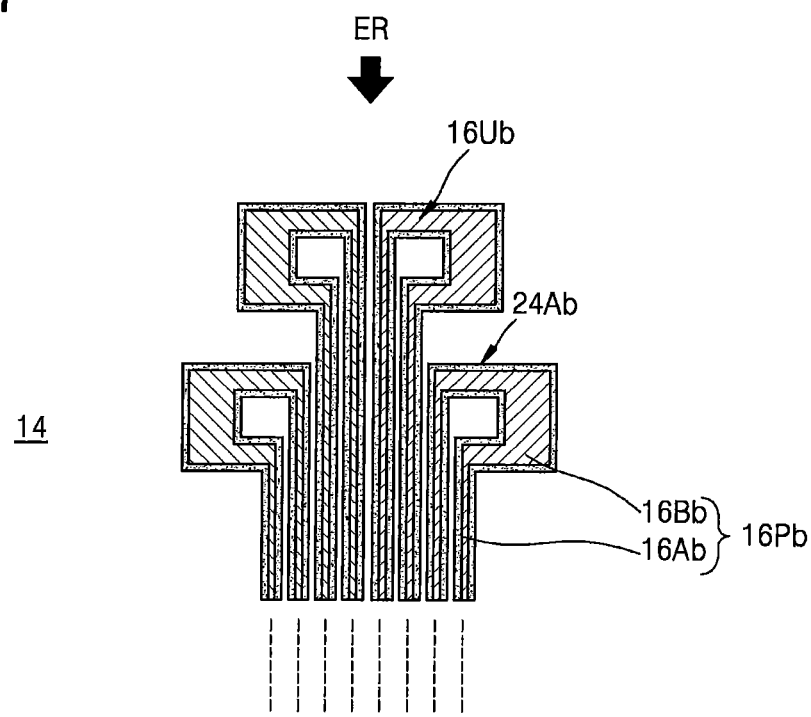

In one unit base pattern 16Ub, one end of one main base pattern 16Ab whose length in the second direction Y is relatively long among two adjacent main base patterns 16Ab may be directly connected to a portion of the sub-base pattern 16Bb that extends in the first direction X and is relatively long, and one end of another main base pattern 16Ab whose length in the second direction Y is relatively short among the two adjacent main base patterns 16Ab may be directly connected to a portion of the sub-base pattern 16Bb that extends in the first direction X and is relatively short. FIG. 17 shows a plan view for explaining an operation of forming a spacer layer 24Ab to manufacture a semiconductor device according to some embodiments.

Referring to FIG. 17, the spacer layer 24Ab that covers side walls of the base pattern 16Pb is formed. Methods of forming the spacer layer 24Ab are the same as those described with reference to FIGS. 3 through 5, and thus a detailed explanation thereof will not be given.

The spacer layer 24Ab may be caused to remain on the feature layer 14 by removing the base pattern 16Pb by using the same methods as that described with reference to FIGS. 6 and 7.

Figure 18:
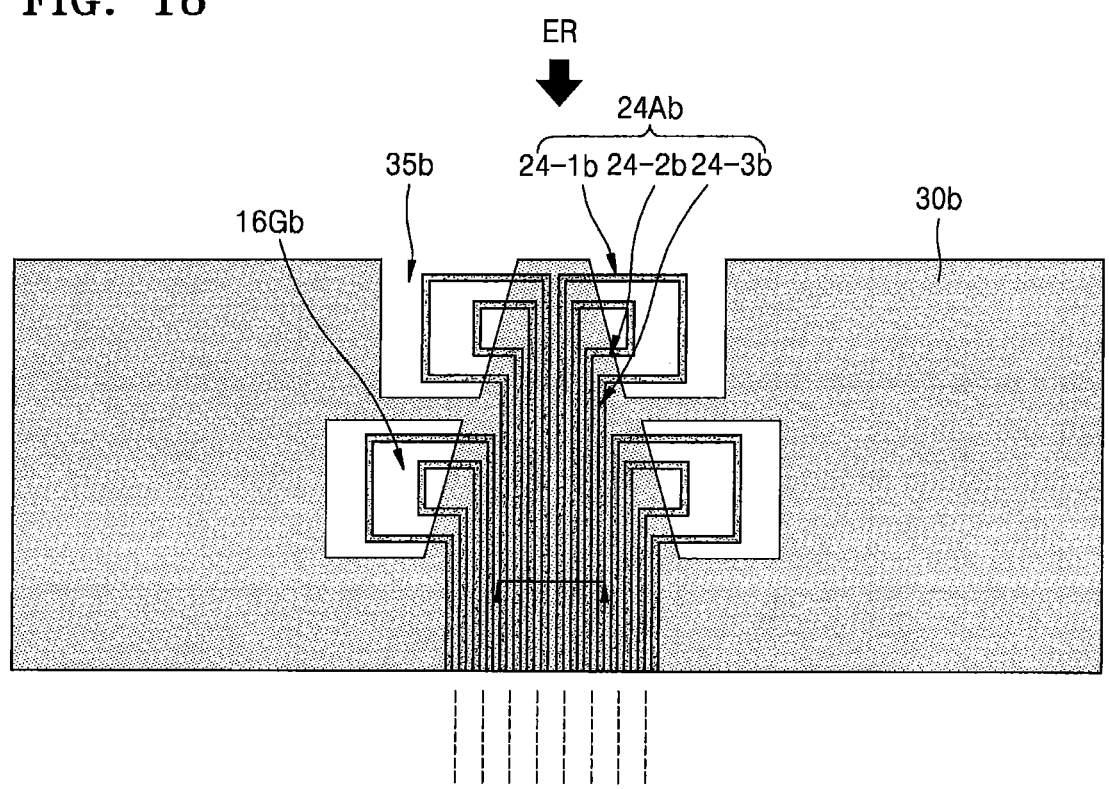

FIG. 18 shows a plan view for explaining an operation of forming a mask pattern 30b to manufacture a semiconductor device according to some embodiments.

Referring to FIG. 18, the mask pattern 30b having an opening 35b is formed on the feature layer 14 including the spacer layer 24Ab.

The opening 35b may expose portions of an outer spacer layer 24-1b and an inner spacer layer 24-2b that are adjacent one another. The mask pattern 30b may entirely cover main spacer layers 24-3b, and may cover a portion of the outer spacer layer 24-1b and a portion of the inner spacer layer 24-2b that are connected to the main spacer layers 24-3b.

The opening 35b may entirely expose portions of the outer spacer layer 24-1b and the inner spacer layer 24-2b that extend in the second direction Y and may partially expose portions of the outer spacer layer 241b and the inner spacer layer 24-2b that extend in the first direction X.

Next, the outer spacer layer 24-1b and the inner spacer layer 24-2b are cut by performing a trimming process for removing the portions of the outer spacer layer 24-1b and the inner spacer layer 24-2b that are exposed through the opening 35b by using the mask pattern 30b as an etching mask in the same method as that described with reference to FIGS. 10 and 11.

Figure 19:
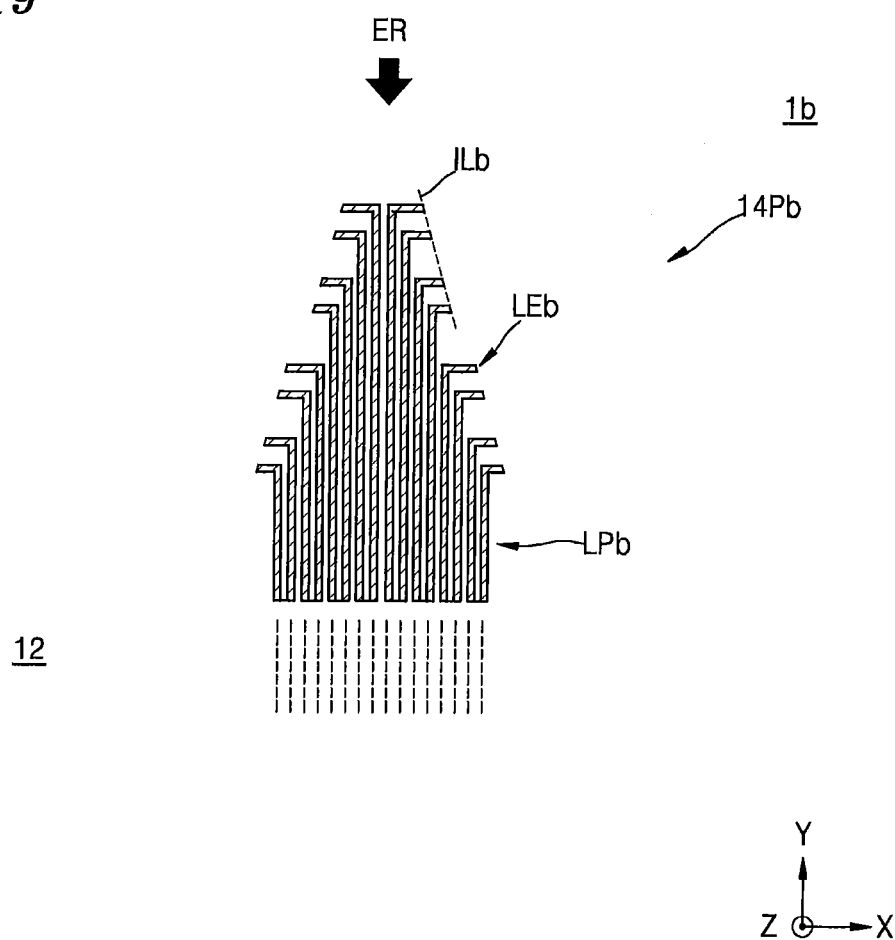

After the portions of the outer spacer layer 24-1b and the inner spacer layer 24-2b are removed, the mask pattern 30b may be removed. FIG. 19 shows a plan view illustrating a feature pattern 14Pb included in a semiconductor device 1b according to some embodiments.

Referring to FIG. 19, the semiconductor device 1b includes the feature pattern 14Pb. As described with reference to FIG. 18, the feature pattern 14Pb may be formed by etching the feature layer 14 by using the spacer layer 24Ab including the outer spacer layer 24-1b and the inner spacer layer 24-2b whose portions are removed as an etching mask. The feature pattern 14Pb may have a shape obtained by transferring a shape of the spacer layer 24Ab including the outer spacer layer 24-1b and the inner spacer layer 24-2b whose portions are removed.

The feature pattern 14Pb may include a plurality of line patterns LPb that are spaced apart from one another. The line patterns LPb may extend in the second direction Y and then may extend in the first direction X, and may have line ends LEb face the first direction X. In the plurality of line patterns LPb, a distance between portions that extend in the first direction X may be greater than a distance between portions that extend in the second direction Y.

The line ends LEb of four continuous line patterns LPb may be located on a straight line ILb that extends in a direction that is different from the first direction X and the second direction Y, but the present exemplary embodiment is not limited thereto and the line ends LEb of four continuous line patterns LPb may be located according to a shape of the opening 35b of the mask pattern 30b of FIG. 18.

FIGS. 20 through 41 show plan views and cross-sectional views for explaining methods of manufacturing a semiconductor device according to some embodiments.

Figure 20:
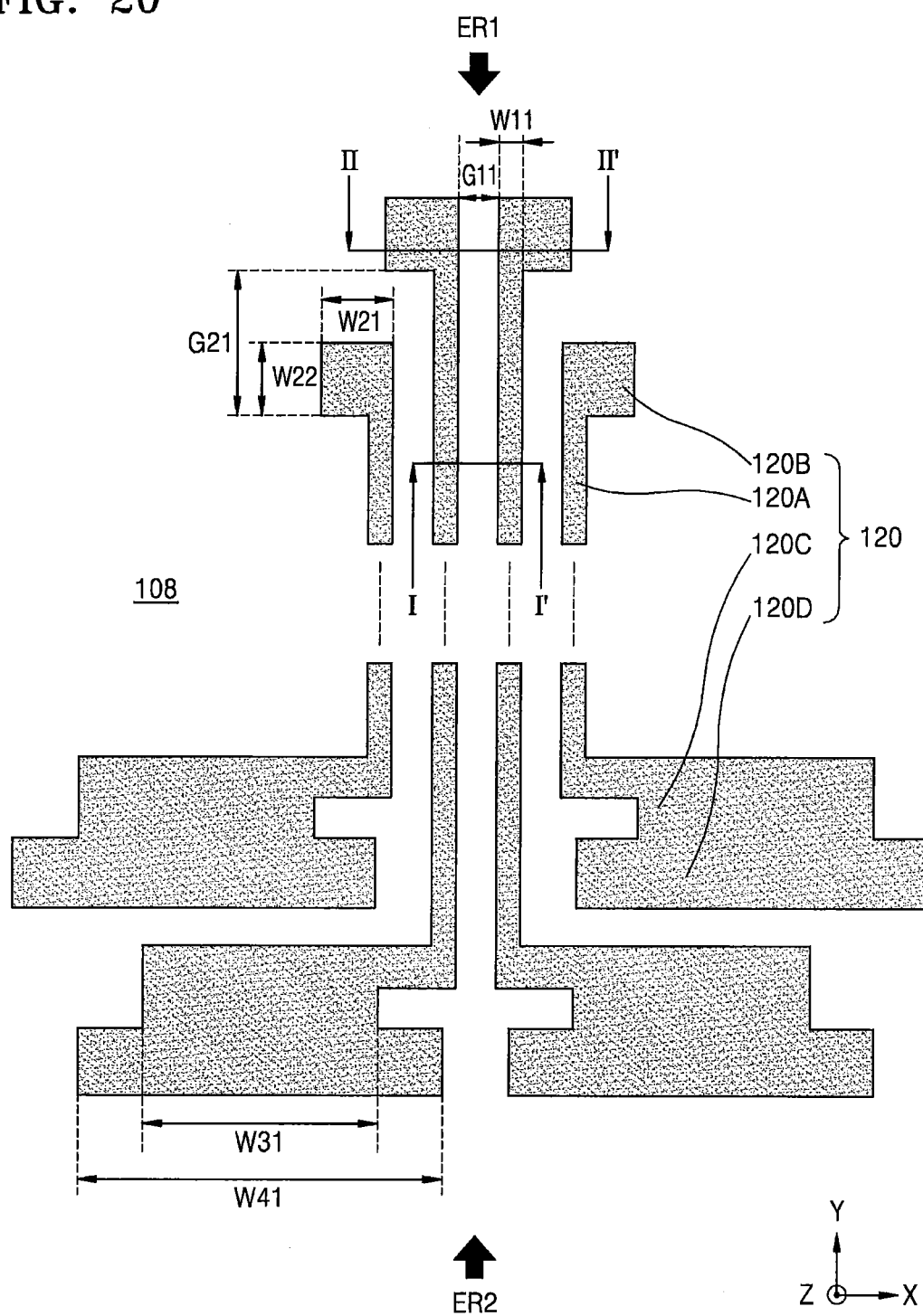
FIGS. 20 through 41 show plan views and cross-sectional views for explaining methods of manufacturing a semiconductor device according to some embodiments of the present inventive concept.
Figure 21:
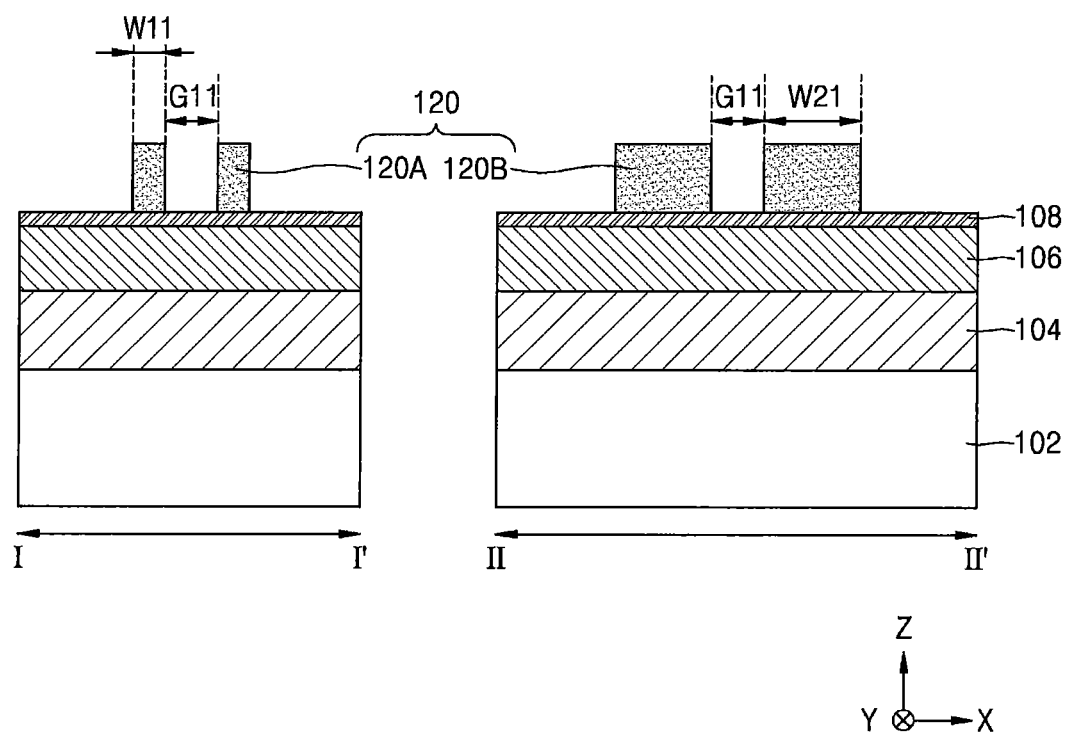

FIGS. 20 and 21 show a plan view and cross-sectional views for explaining an operation of forming a first base pattern 120 to manufacture a semiconductor device according to an some embodiments. In detail, FIG. 21 shows cross-sectional views taken along lines I-I' and II-II' of FIG. 20.

Referring to FIGS. 20 and 21, a feature layer 104, a first mask layer 106, a second mask layer 108, and the first base pattern 120 are sequentially formed on a substrate 102.

The substrate 102 may include a semiconductor material. The substrate 102 may include, for example, Si. In some embodiments, the substrate 102 may include a semiconductor element such as Ge or a compound semiconductor material such as SiC, GaAs, InAs, and/or InP. In some embodiments, the substrate 102 may include a conductive film or an insulating film that is formed on the semiconductor material, and may be formed of, for example, a metal, a semiconductor, and/or an insulating material. The substrate 102 may be formed, for example, on the semiconductor material, and may have a multi-layer structure for forming a tunneling insulating layer, a charge storage layer, a blocking insulating layer, and/or a gate electrode layer. In some embodiments, the substrate 102 may have an SOI structure. For example, the substrate 102 may include a BOX layer. The substrate 102 may include a conductive region, for example, a well doped with impurities. The substrate 102 may have any of various device isolation structures such as an STI structure.

The feature layer 104 may be formed of any of various materials. For example, the feature layer 104 may be formed of, but is not limited to, a metal, an alloy, metal carbide, metal nitride, metal oxynitride, metal oxycarbide, semiconductor, polysilicon, oxide, nitride, oxynitride, a hydrocarbon compound, and/or a combination thereof. The feature layer 104 may constitute an active region or another region of the substrate 102, for example, a semiconductor substrate. The feature layer 104 may constitute a mask layer that is used to define a pattern on the substrate 102 or a material layer (not shown) that is disposed under the feature layer 104. In some embodiments, the feature layer 104 may be a conductive film or an insulating film that is formed on the substrate 102, and may be formed of, for example, a metal, a semiconductor, and/or an insulating material. The feature layer 104 may be formed, for example, on the substrate 102, and have a multi-layer structure for forming a tunneling insulating layer, a charge storage layer, a blocking insulating layer, and/or a gate electrode layer.

The first mask layer 106 may be formed of any of various films according to a type of the feature layer 104. For example, the first mask layer 106 may be formed of, but is not limited to, a carbon-containing film, a silicon nitride film, a silicon oxide film, and/or a polysilicon film. In some embodiments, the first mask layer 106 may be formed of an SOH material. In some embodiments, the SOH material may be formed of a hydrocarbon compound having a relatively high carbon content ranging from about 85 weight % to about 99 weight % based on a total weight of the SOH material or a derivative of the hydrocarbon compound.

The second mask layer 108 may be formed of a material having an etch selectivity that is different from that of the first mask layer 106 in order to be used as an etching mask for the first mask layer 106. For example, the second mask layer 108 may be formed of any silicon-containing material selected from silicon oxynitride, silicon oxide, silicon nitride, silicon carbonitride, and/or polysilicon. In some embodiments, the second mask layer 108 may be formed of a metal or an organic material.

The first base pattern 120 may be formed of a material having an etch selectivity with respect to the second mask layer 108 and a first spacer layer 130A that will be described below with reference to FIGS. 17 and 18 in a subsequent process. In some embodiments, the first base pattern 120 may be formed of, but is not limited to, a carbon-containing film, a silicon nitride film, a silicon oxide film, and/or a polysilicon film. For example, the first base pattern 120 may be formed of an SOH material. In some embodiments, the SOH material may be formed of a hydrocarbon compound having a relatively high carbon content ranging from about 85 weight % to about 99 weight % based on a total weight of the SOH material or a derivative of the hydrocarbon compound.

The first base pattern 120 may be formed by forming a first base pattern material layer, forming a mask pattern on the first base pattern material layer by using photolithography, and etching the first base pattern material layer by using the mask pattern as an etching mask.

The first base pattern 120 may include a plurality of first main base patterns 120A and first sub-base patterns 120B that are connected to one end of each of the plurality of first main base patterns 120A. The first sub-base patterns 120B may be connected to the first main base patterns 120A at a first edge area ER1.

The plurality of first main base patterns 120A may be continuously arranged to be spaced apart from each other by a first gap G11 in the first direction X. The plurality of first main base patterns 120A may each have a first width W11 and may extend in the second direction Y.

In some embodiments, the first width W11 may be 3 F that is three times a minimum feature size of the semiconductor device to be formed, and the first gap G11 may be greater than 3 F. For example, the first gap G11 may be 5 F. In some embodiments, the first width W11 may range from several nm to tens of nm.

The plurality of first sub-base patterns 120B may respectively extend from one end of each of the plurality of first main base patterns 120A. Each of the first sub-base patterns 120B may have a second width W21 and a second length W22 respectively in the first direction X and the second direction Y. The second width W21 and the second length W22 may be greater than the first width W11. The second width W21 and the second length W22 may be the same, and may each range, for example, from about 5 F to about 15 F. In some embodiments, the second width W21 and the second length W22 may be different from each other, and may each be selected from about 5 F to about 15 F.

One first sub-base pattern 120B may protrude from an extension line that extends in the second direction Y from one side of the first main base pattern 120A that is connected to the first sub-base pattern 120B. One side, among both sides of the first sub-base pattern 120B that face the first direction X, may be located on an extension line that extends in the second direction Y from the other side of the first main base pattern 120A that is connected to the first sub-base pattern 120B.

The first base pattern 120 may further include first auxiliary base patterns 120C and first pad base patterns 120D that are connected to the other ends of the plurality of first main base patterns 120A. The first auxiliary base patterns 120C and the first pad base patterns 120D may be connected to the first main base patterns 120A at a second edge area ER2.

Each of the first auxiliary base patterns 120C and the second pad base patterns 120D may have a third width W31 and a fourth width W41 in the first direction X. The third width W31 and the fourth width W41 may be greater than the first width W11, and may be, for example, several times greater than the second width W21. The fourth width W41 may be greater than the third width W31.

In two adjacent first base patterns 120, the first sub-base patterns 120B may be located at different levels in the second direction Y. Also, a plurality of the first base patterns 120 may be arranged to be symmetric with respect to an extension line that extends in the second direction Y.

Figure 22:
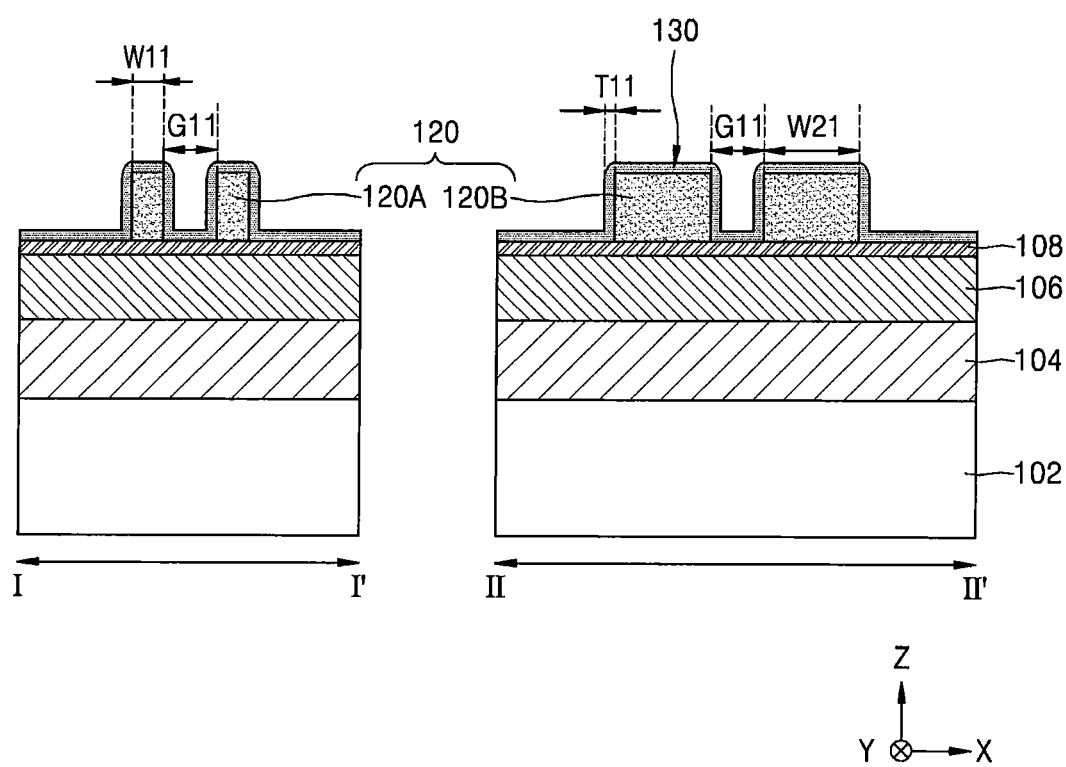

FIG. 22 shows cross-sectional views for explaining an operation of forming a first spacer material layer 130 to manufacture a semiconductor device according to some embodiments. In detail, FIG. 16 shows cross-sectional views taken along lines I-I' and II-II' of FIG. 14.

Referring to FIG. 22, the first spacer material layer 130 is formed on the substrate 102 including the first base pattern

120. The first spacer material layer 130 may be formed to a uniform thickness to cover an exposed surface of the first base pattern 120 and an exposed surface of the second mask layer 108. For example, the first spacer material layer 130 may have a first thickness T1. The first thickness T11 may be, for example, 1 F. The first spacer material layer 130 may be formed of a material having an etch selectivity with respect to the second mask layer 108 and the first base pattern 120. In some embodiments, the first spacer material layer 130 may be formed of a silicon oxide film that is formed by using ALD.

Figure 23:
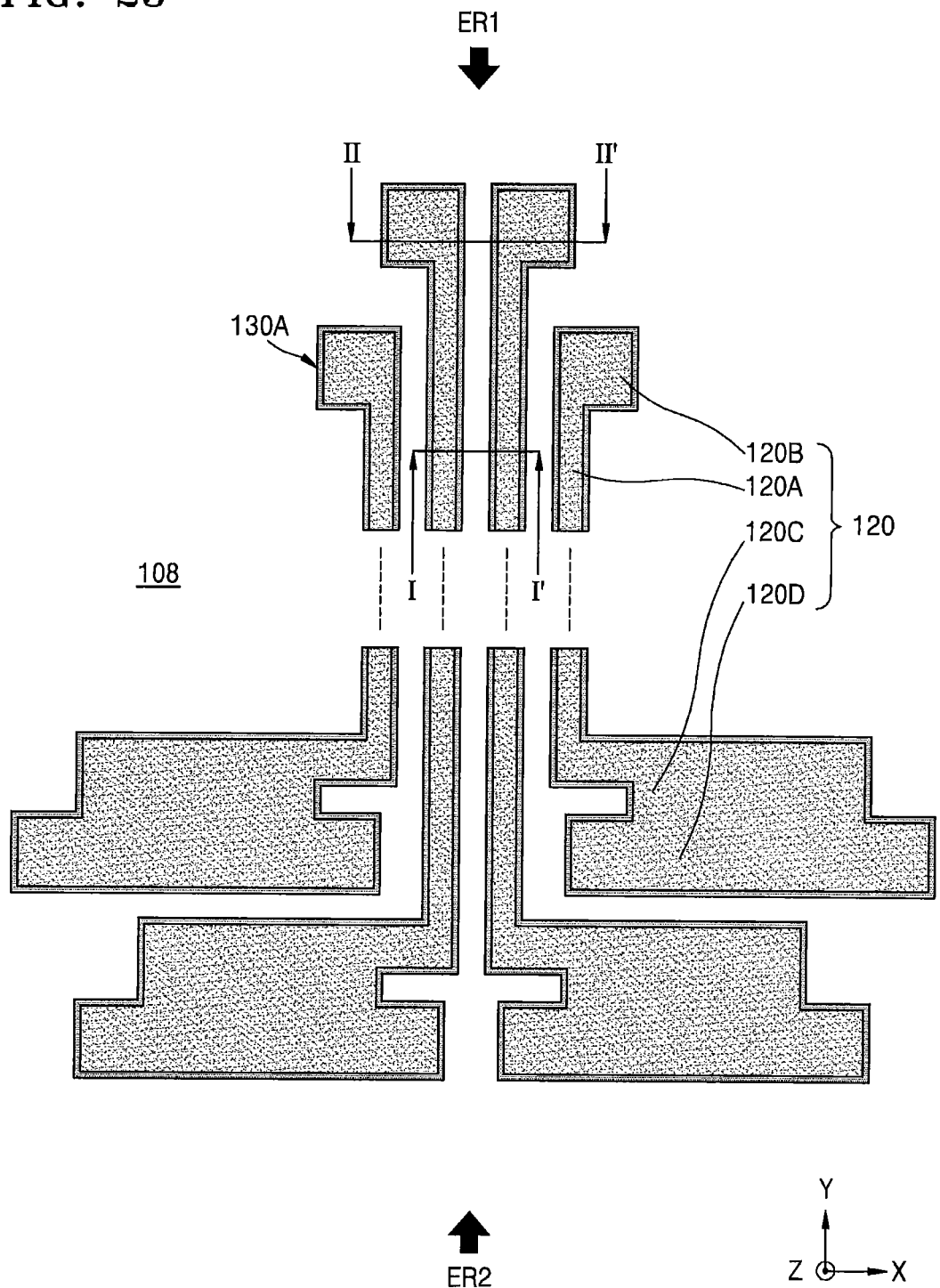
Figure 24:
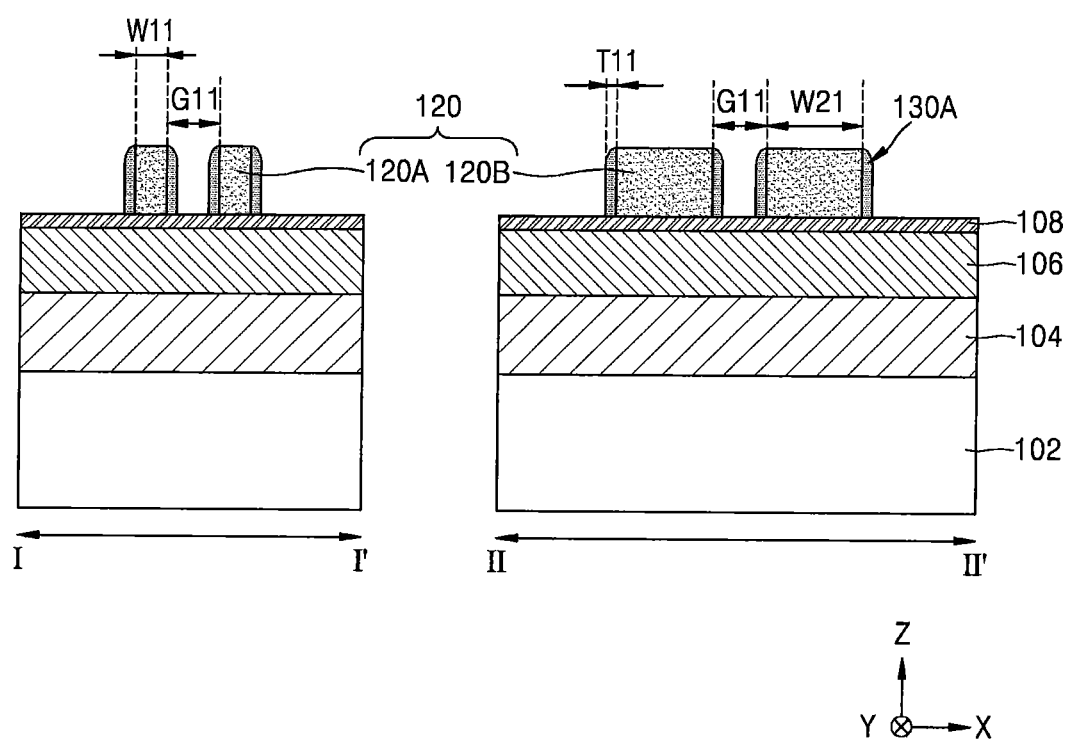

FIGS. 23 and 24 show a plan view and cross-sectional views for explaining an operation of forming a first spacer layer 130A to manufacture a semiconductor device according to some embodiments. In detail, FIG. 24 shows cross-sectional views taken along lines I-I' and II-II' of FIG. 23.

Referring to FIGS. 23 and 24, the first spacer layer 130A that covers side walls of the first base pattern 120 is formed by performing etch-back on the first spacer material layer 130 of FIG. 22. The first spacer layer 130A may expose a part of a top surface of the second mask layer 108 and a top surface of the first base pattern 120. The first spacer layer 130A may have the first thickness T11 from the side walls of the first base pattern 120.

Figure 25:
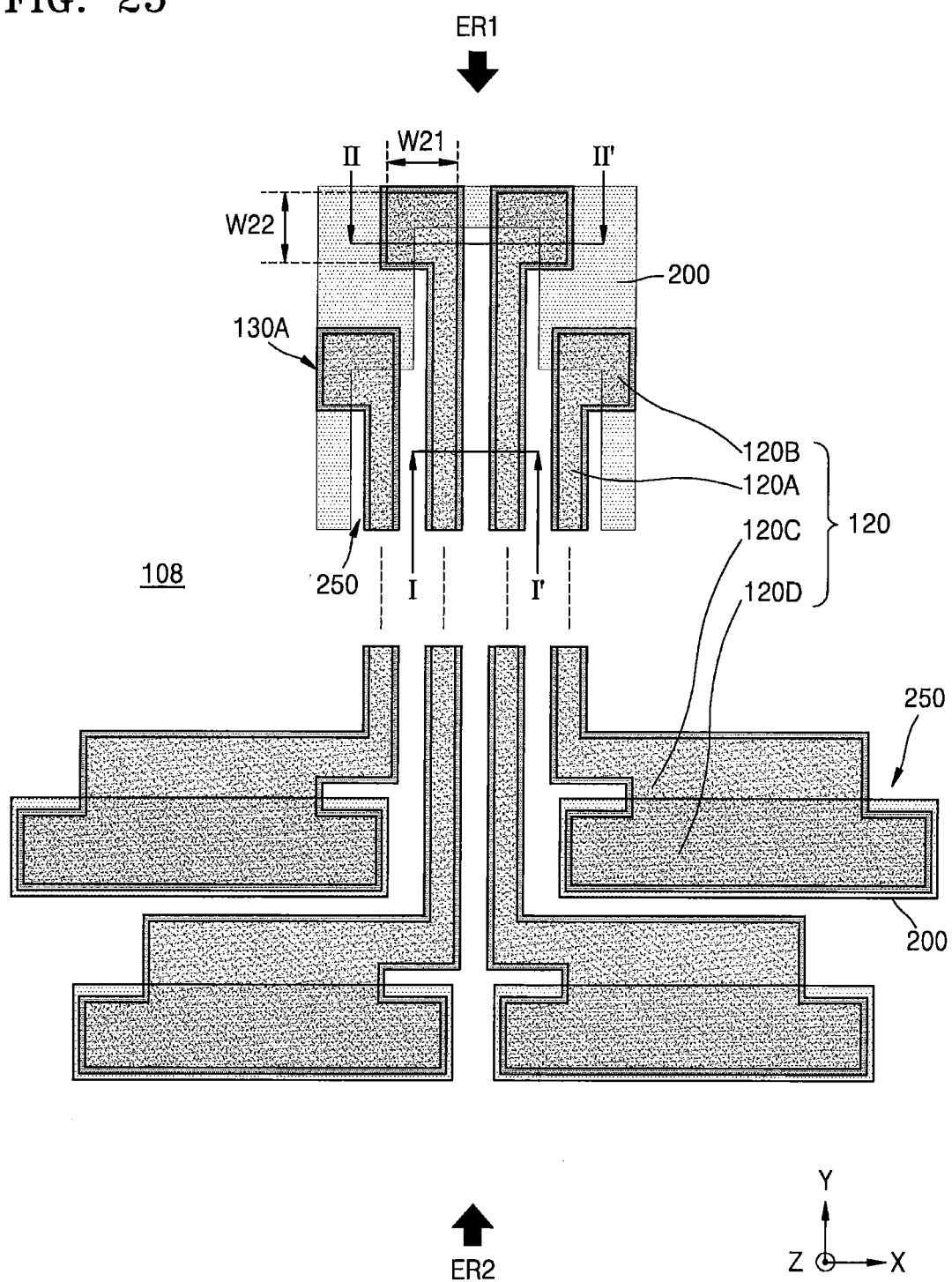
Figure 26:
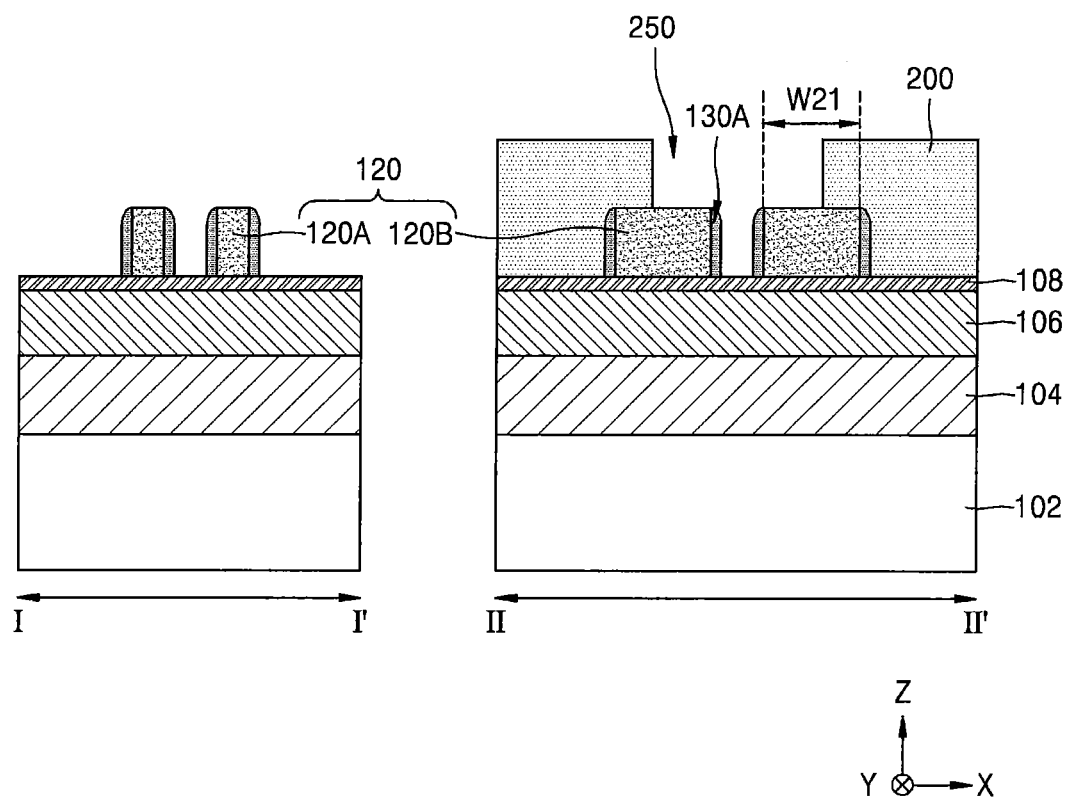

FIGS. 25 and 26 show a plan view and cross-sectional views for explaining an operation of forming a first mask pattern 200 to manufacture a semiconductor device according to some embodiments. In detail, FIG. 26 shows cross-sectional views taken along lines I-I' and II-II' of FIG. 25.

Referring to FIGS. 25 and 26, the first mask pattern 200 having a first opening 250 is formed on the substrate 102 including the first spacer layer 130A. The first opening 250 may expose each of the first main base patterns 120A. The first opening 250 may expose a portion of each of the first sub-base patterns 120B that contacts the first main base pattern 120A. The first opening 250 may expose a portion of each of the first auxiliary base patterns 120C. The first mask pattern 200 may cover a portion of the first sub-base pattern 120B that is spaced apart from the first main base pattern 120A. The first mask pattern 200 may cover each of the first pad base pattern 120D and a portion of the first auxiliary base pattern 120C that contacts the first pad base pattern 120D.

The first mask pattern 200 may be formed of a photoresist that is formed by using, for example, photolithography.

Figure 27:
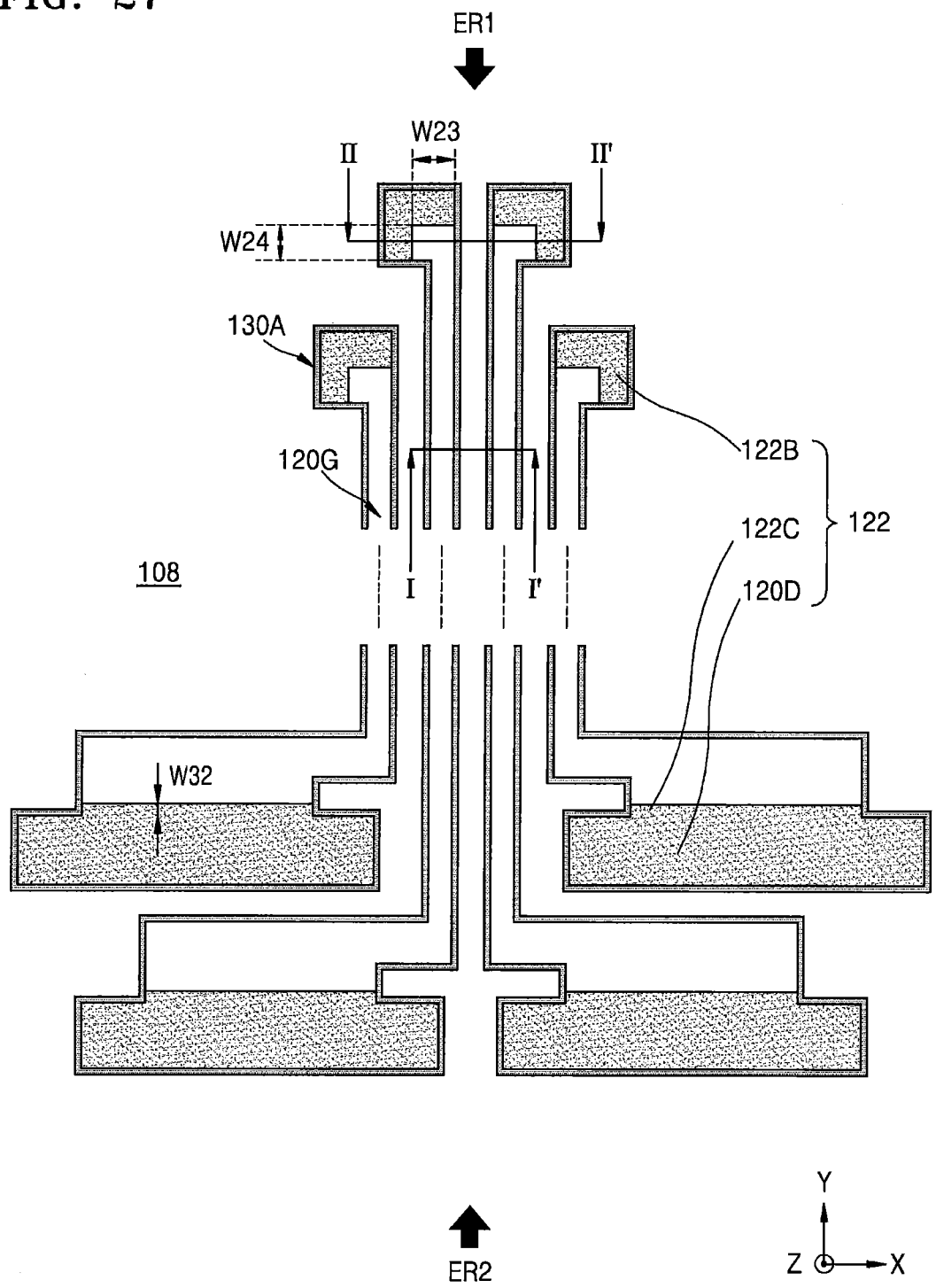
Figure 28:
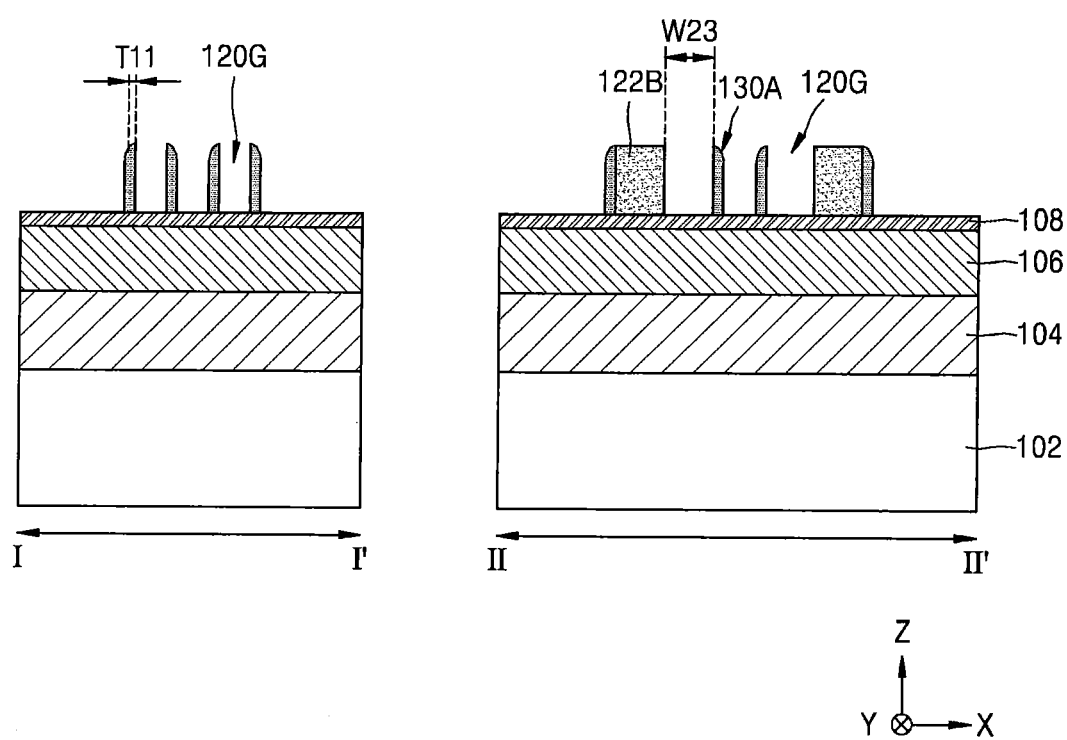

FIGS. 27 and 28 show a plan view and cross-sectional views for explaining an operation of removing a portion of the first base pattern 120 according to some embodiments. In detail, FIG. 28 shows cross-sectional views taken along lines I-I' and II-II' of FIG. 27.

Referring to FIGS. 27 and 28, a first base space 120G is formed by removing a portion of the first base pattern 120 by using the first mask pattern 200 of FIGS. 25 and 24 as an etching mask. Due to the first base space 120G, only a portion 122B of the first sub-base pattern 120B, a portion 122C of the first auxiliary base pattern 120C, and the first pad base pattern 120D of a first base pattern 122 may remain.

A portion of the first base space 120G formed by removing a portion of the first sub-base pattern 120 may have a fifth width W23 and a sixth width W24 respectively in the first direction X and the second direction Y. Each of the fifth width W23 and the sixth width W24 may be the same as or greater than a sum (W11+T11) of the first width W11 (see FIG. 24) and the first thickness T11 (see FIG. 24). For example, each of the fifth width W23 and the sixth width W24 may range from about 4 F to about 8 F.

The remaining portion 122C of the first auxiliary base pattern 120C may have a seventh width W32 in the second direction Y. The seventh width W32 may be the same as or greater than the first thickness T11 (see FIG. 24). The seventh width W32 may range from about 1 F to about 3 F.

Figure 29:
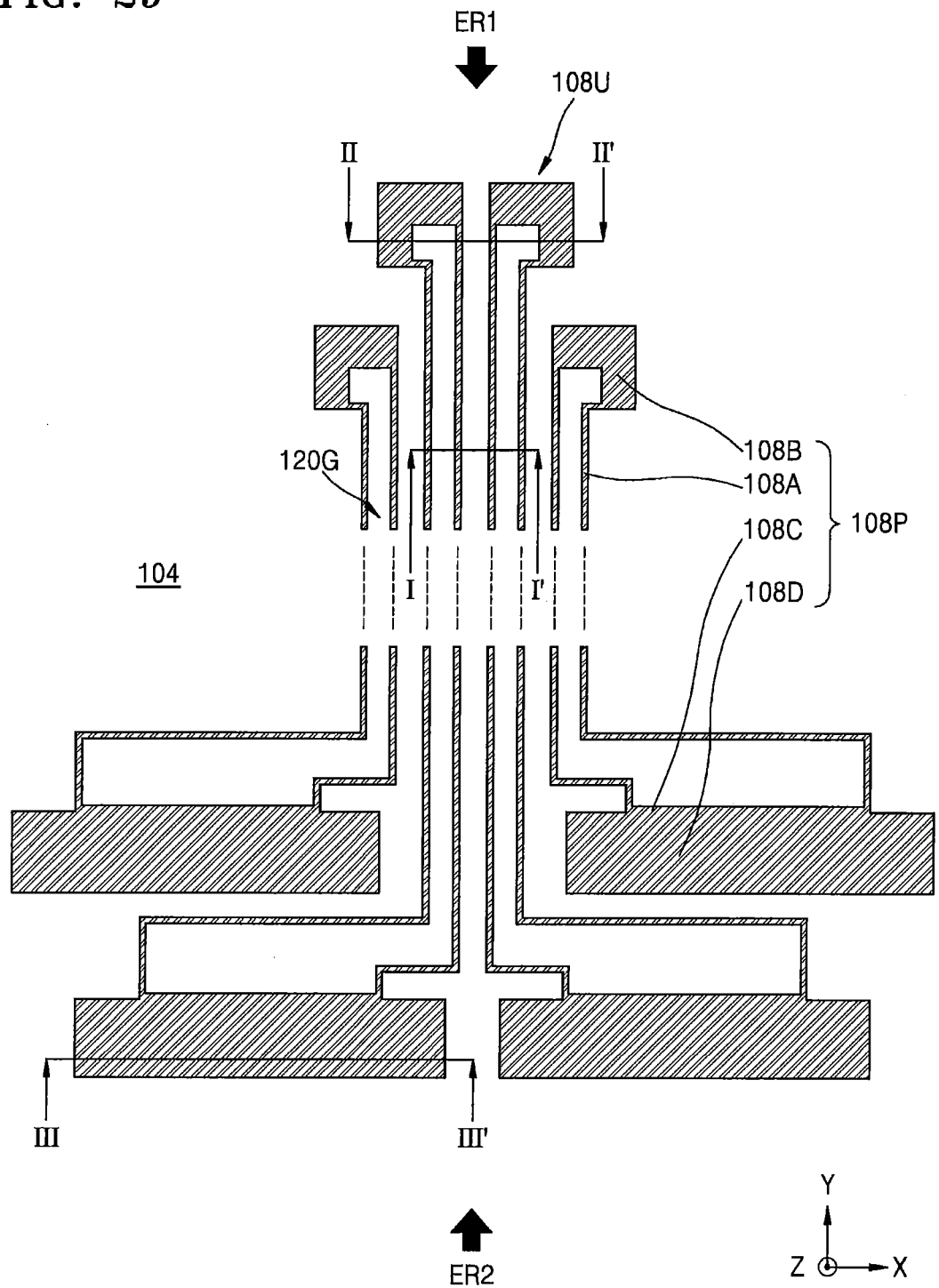
Figure 30:
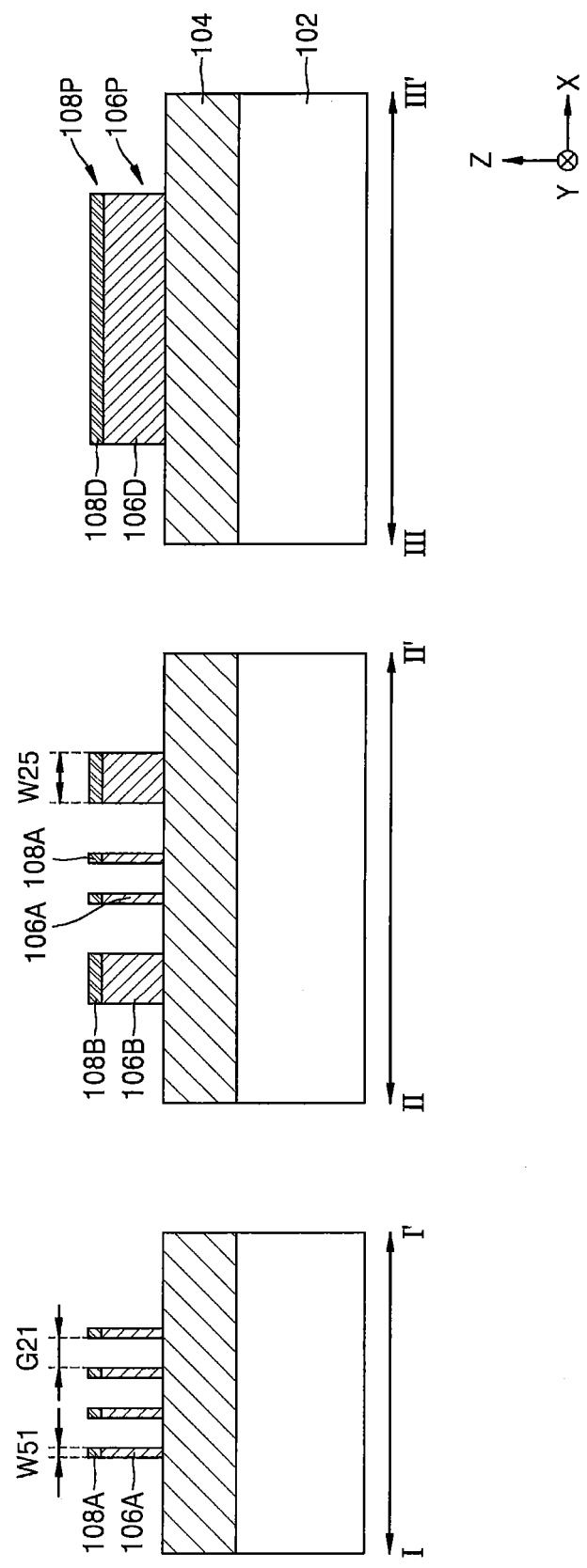

FIGS. 29 and 30 show a plan view and cross-sectional views for explaining an operation of forming a second base pattern 106P to manufacture a semiconductor device according some embodiments. In detail, FIG. 30 shows cross-sectional views taken along lines I-I', II-II', and III-III' of FIG. 29.

Referring to FIGS. 29 and 30, the second base pattern 106P and a cover base pattern 108P that covers a top surface of the second base pattern 106P are formed by etching the first and second mask layers 106 and 108 by using remaining portions of the first base pattern 122 and the first spacer layer 130A of FIGS. 27 and 28 as an etching mask. The second base pattern 106P and the cover base pattern 108P may have shapes obtained by transferring shapes of the remaining portions of the first base pattern 122 and the first spacer layer 130A of FIGS. 27 and 28. Accordingly, the second base pattern 106P and the cover base pattern 108P have the same planar shape, and thus a planar shape of the cover base pattern 108P of FIG. 29 may apply to the second base pattern 106P.

The cover base pattern 108P may include a plurality of main cover base patterns 108A and a sub-cover base pattern 108B that connects two adjacent main cover base patterns among the plurality of main cover base patterns 108A. The sub-cover base pattern 108B may be connected to the main cover base patterns 108A to contact the first edge area ER1.

The plurality of main cover base patterns 108A may be continuously arranged to be spaced apart from each other by a second gap G21 in the first direction X. The plurality of main cover base patterns 108A may each have an eighth width W51 and may extend in the second direction Y.

In some embodiments, the eighth width W51 may be 1 F that is a minimum feature size of the semiconductor device to be formed, and the second gap G21 may be greater than 1 F. For example, the second gap G21 may be 3 F. In some embodiments, the eighth width W51 may range from several nm to tens of nm.

One sub-cover base pattern 108B may extend from one end of each of two adjacent main cover base patterns 108A, may connect the two adjacent main cover base patterns 108A, and may be connected to the two adjacent main cover base patterns 108A.

Each of the main cover base patterns 108A may have a shape obtained by transferring a shape of a portion of the first spacer layer 130A of FIG. 27 that remains and does not contact the first base pattern 122. The sub-cover base pattern 108 may have a shape obtained by transferring shapes of the portion 122B of the first sub-base pattern 120B and a portion of the first spacer layer 130A that contacts the portion 122B of the first sub-base pattern 120B of FIG. 27.

The cover base pattern 108P may further include an auxiliary cover base pattern 108C and a pad cover base pattern 108D. The auxiliary cover base pattern 108C may have a shape obtained by transferring a shape of the portion 122C of the first auxiliary base pattern 120C of FIG. 27. The pad cover base pattern 108D may have a shape obtained by transferring shapes of the first pad base pattern 120D and a portion of the first spacer layer 130A that contacts the first pd base pattern 120D of FIG. 27.

Two adjacent main base patterns 108A, one sub-cover base pattern 108B that is connected to the two adjacent main base patterns 108A, one auxiliary cover base pattern 108C, and one pad cover base pattern 108D may constitute a unit cover base pattern 108U. A portion of the unit cover base pattern 108U that extends to have the eighth width W51 may be defined as the main cover base pattern 108A, and a portion of the unit cover base pattern 108U that is connected to the main cover base pattern 108A to contact the first edge area ER1 and extends to have a width greater than the eighth width W51 may be defined as the sub-cover base pattern 108B.

The sub-cover base pattern 108B may extend to have a ninth width W25 that is greater than the eighth width W51. In the sub-cover base pattern 108B, a width of a portion that extends in the first direction X and a width that extends in the second direction Y may be the same or different from each other. Even when the width of the portion of the sub-cover base pattern 108B that extends in the first direction X and the width of the portion of the sub-cover base pattern 108B that extends in the second direction Y are different from each other, the widths may each be greater than the eighth width W51. For example, the ninth width W25 may range from about 2 F to about 6 F.

Portions that are connected to the main cover base pattern 108A to contact the second edge area ER2 may be defined as the auxiliary cover base pattern 108C and the pad cover base pattern 108D. The auxiliary cover base pattern 108C refers to a portion that slightly protrudes in the second direction Y from the pad cover base pattern 108D.

In one unit cover base pattern 108U, the sub-cover base pattern 108B may protrude beyond one main cover base pattern 108A among two adjacent main cover base patterns 108A in the first direction X. That is, in one unit cover base pattern 108U, the sub-cover base pattern 108B may extend in the first direction X from the main cover base whose length in the second direction Y is relatively long to protrude beyond the man cover base pattern 108A whose length in the second direction Y is relatively short.

In one unit cover base pattern 108U, one end of one main cover base pattern 108A whose length in the second direction Y is relatively long among two adjacent main cover base patterns 108A may be directly connected to a portion of the sub-cover base pattern 108B that extends in the first direction X, another main cover base pattern 108A whose length in the second direction Y is relatively short among the two adjacent main cover base patterns 108A may be bent into the first direction X, may extend, and may be directly connected to a portion of the sub-cover base pattern 108B that extends in the second direction Y, and the portion of the sub-cover base pattern 108B that extends in the first direction X and the portion of the sub-cover base pattern 108B that extends in the second direction Y may be directly connected to each other.

That is, one unit cover base pattern 108U may include the sub-cover base pattern 108B having an L-shape and two adjacent main cover base patterns 108A that are connected to both ends of the sub-cover base pattern 108B having the L-shape, the main cover base pattern 108A whose length in the second direction Y is relatively long may extend in the second direction Y and may be directly connected to one end of the sub-cover base pattern 108B having the L-shape, and the main cover base pattern 108A whose length in the second direction Y is relatively short may extend in the second direction Y, may be bent into the first direction X, may extend, and may be directly connected to the other end of the sub-cover base pattern 108B having the L-shape.

Portions of the second base pattern 106P that are located under the main cover base pattern 108A, the sub-cover base pattern 108B, the auxiliary cover base pattern 108C, and the pad cover base pattern 108D may be respectively defined as a second main base pattern 106A, a second sub-base pattern 106B, a second auxiliary base pattern 106C, and a second pad base pattern 106D.

In two adjacent unit cover base patterns 108P, the sub-cover base patterns 108B, the auxiliary cover base patterns 108C, and the pad cover base patterns 108D may be located at different levels in the second direction Y. Also, the plurality of unit cover base patterns 108P may be arranged to be symmetric with respect to an extension line that extends in the second direction Y.

Figure 31:
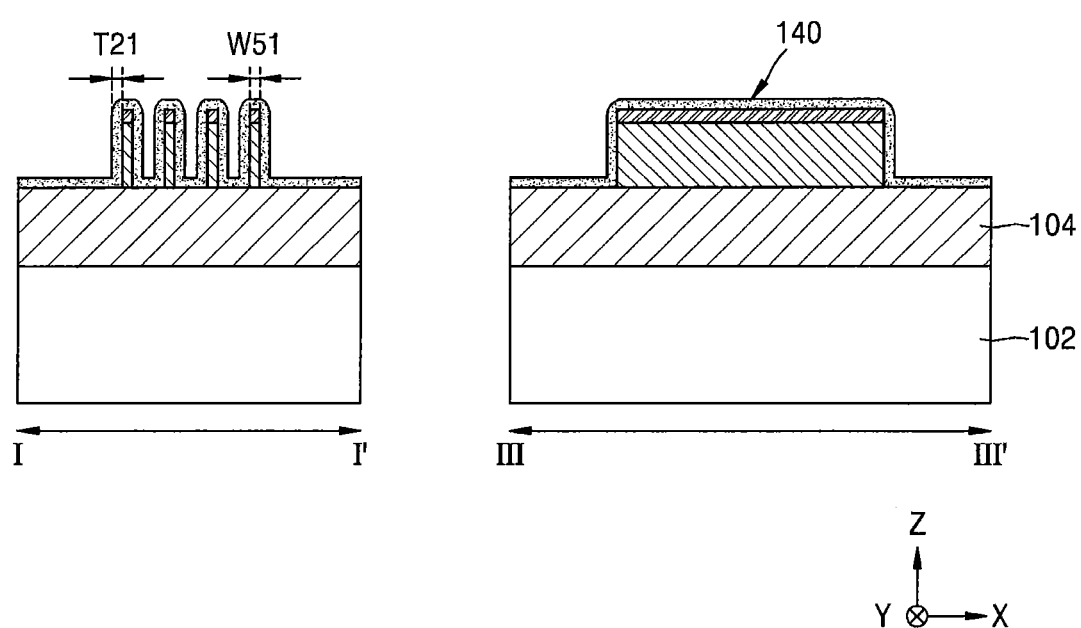

FIG. 31 shows a cross-sectional view for explaining an operation of forming a second spacer material layer 140 to manufacture a semiconductor device according to some embodiments. In detail, FIG. 31 shows cross-sectional views taken along lines I-I' and III-III' of FIG. 29.

Referring to FIG. 31, the second spacer material layer 140 is formed on the substrate 102 including the second base pattern 106P and the cover base pattern 108P. The second spacer material layer 140 may be formed to a uniform thickness to cover exposed surfaces of the second base pattern 106P and the cover base pattern 108P and an exposed surface of the feature layer 104. For example, the second spacer material layer 140 may have a second thickness T21. The second thickness T21 may be the same as or similar to, for example, the eighth width W51. The second spacer material layer 140 may be formed of a material having an etch selectivity with respect to the feature layer 104, the second base pattern 106P, and the cover base pattern 108P. In some embodiments, the second spacer material layer 140 may be formed of a silicon oxide film that is formed by using ALD.

Figure 32:
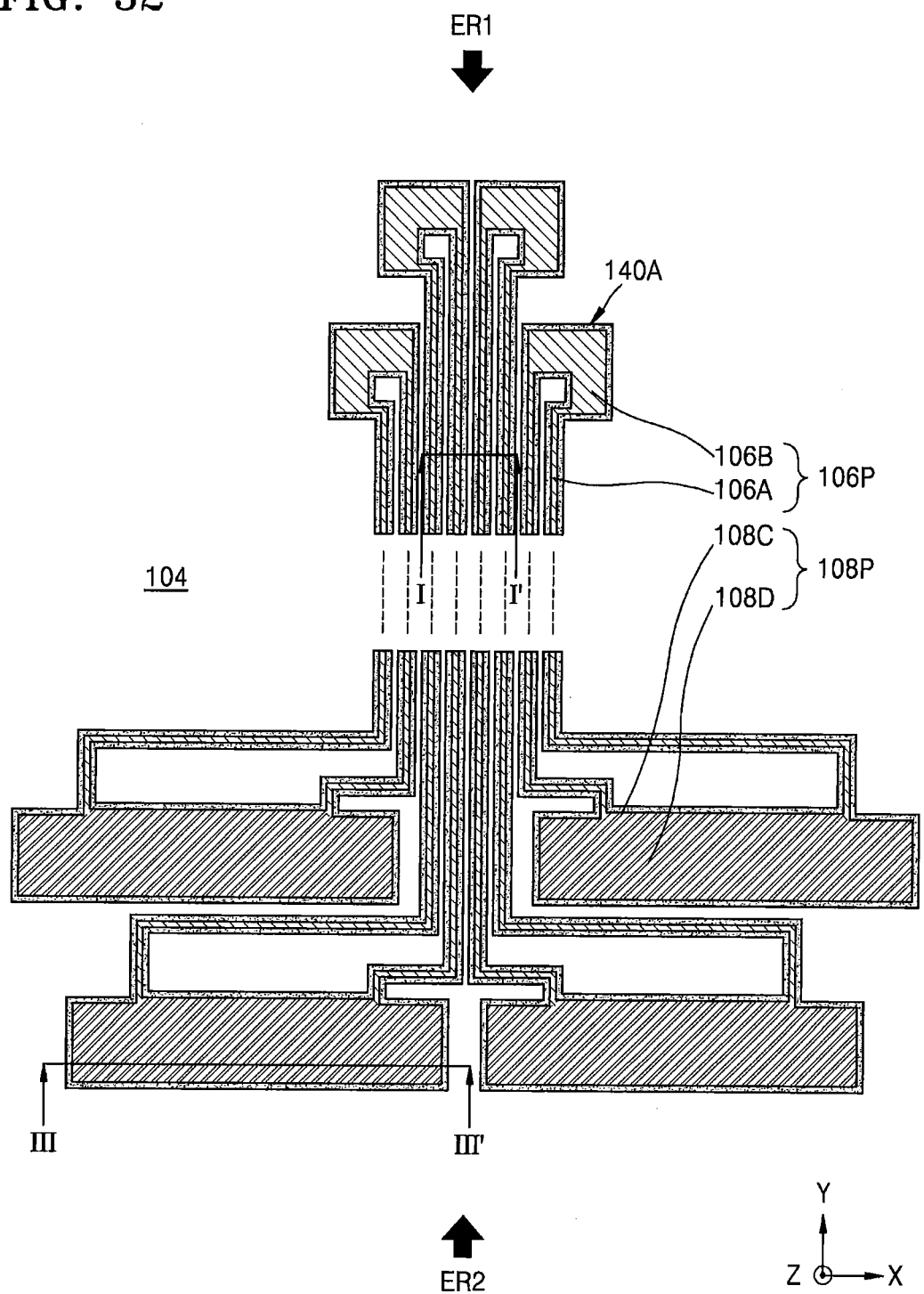
Figure 33:
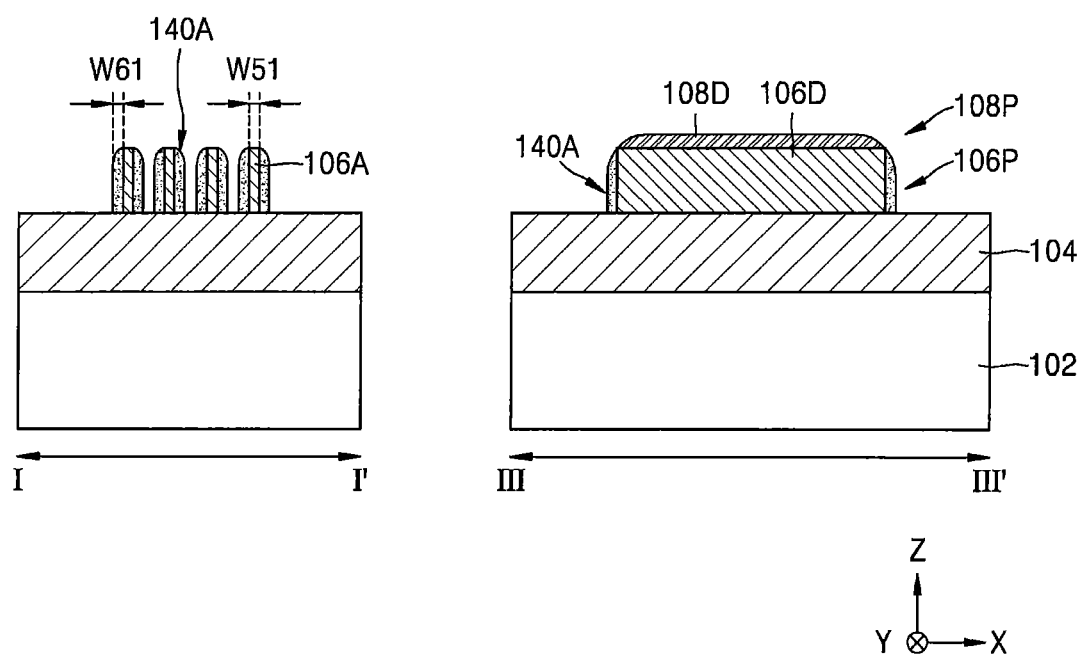
Figure 34:
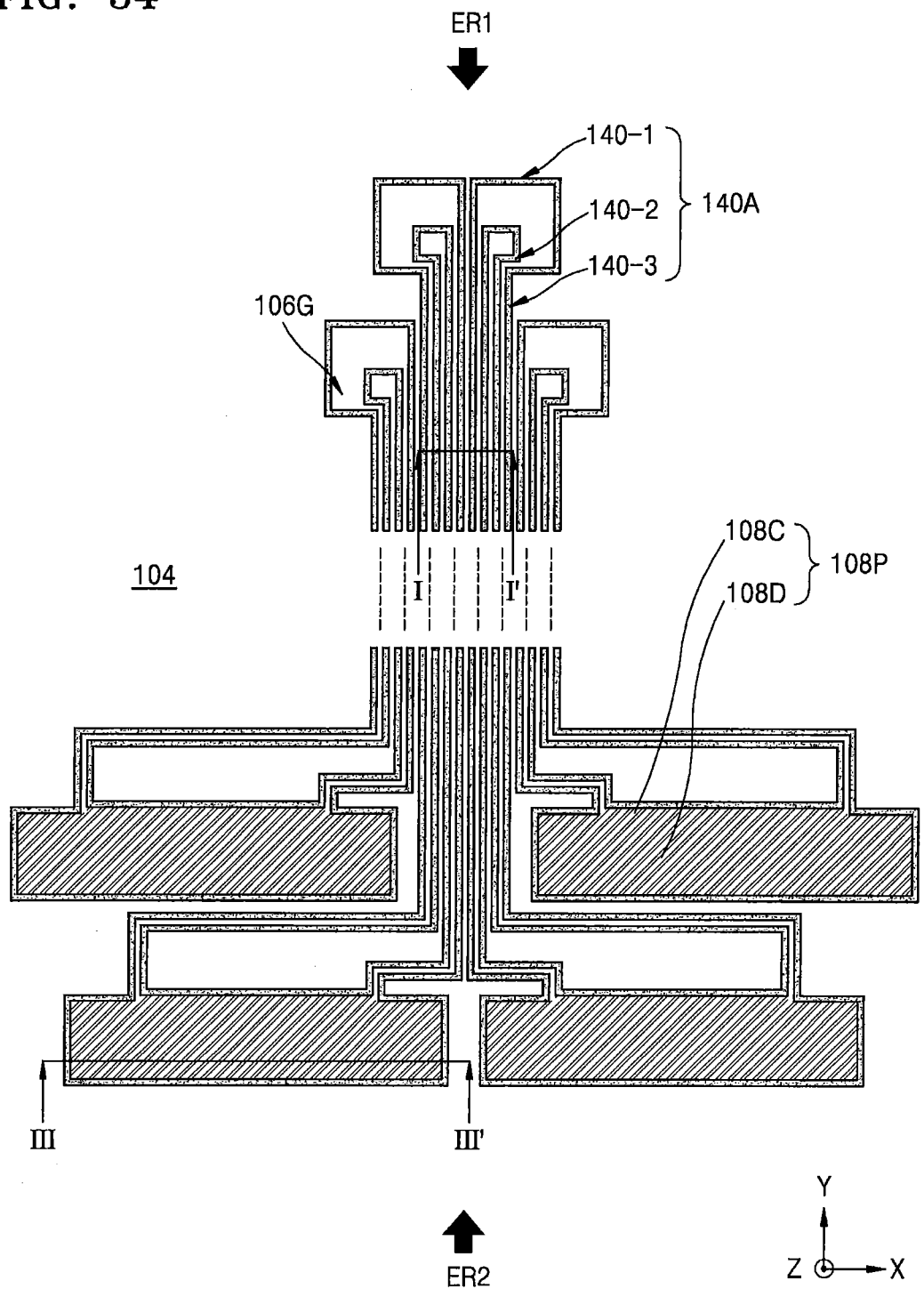
Figure 35:
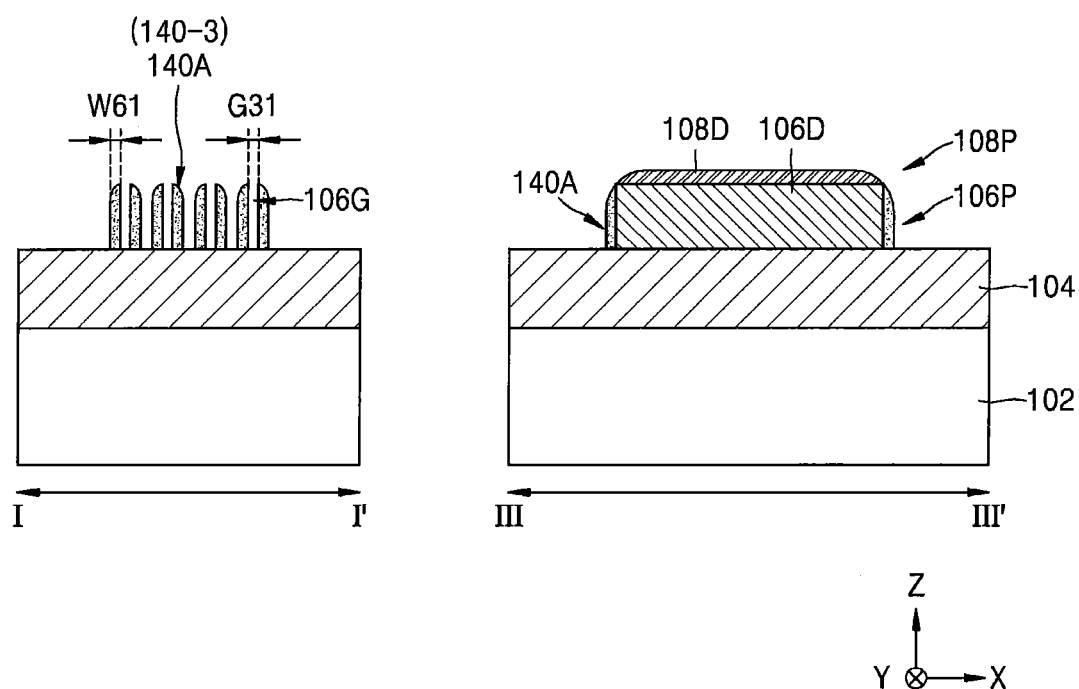

FIGS. 32 through 35 show plan views and cross-sectional views for explaining an operation of forming a second spacer layer 140A to manufacture a semiconductor device according to some embodiments. In detail, FIGS. 33 and 35 are respectively cross-sectional views taken along lines I-I' and III-III' of FIGS. 32 and 34.

Referring to FIGS. 32 and 35, the second spacer layer 140A that covers side walls of the second base pattern 106P and the cover base pattern 108P is formed by performing etch-back on the spacer material layer 140 of FIG. 31. The second spacer layer 140A may expose a part of a top surface of the feature layer 104 and a top surface of the cover base pattern 108P.

When the second base pattern 106P and the cover base pattern 108P are formed, edges between the top surface and both side walls of the cover base pattern 108P may be cut due to a three-dimensional (3D) etching effect. Accordingly, a portion of the cover base pattern 108P that has a relatively small width may have a thickness that is less than that of a portion of the cover base pattern 108P that has a relatively large width. Accordingly, the portion of the cover base pattern 108P that has a relatively small width may be lost when the second spacer layer 140A is formed, and thus a top surface of the second base pattern 106P may be entirely or partially exposed. For example, the main cover base pattern 108A and the sub-cover base pattern 108B of FIG. 32 may be entirely or partially lost when the second spacer layer 140A is formed, and top surfaces of the second main base pattern 106A and the second sub-base pattern 106B may be entirely or partially exposed.

The second spacer layer 140A may have a tenth width W61. The tenth width W61 may be the same as the second thickness T21 of FIG. 31, and may be the same as or similar to the eighth width W51. In some embodiments, the tenth width W61 may be 1 F.

Referring to FIGS. 34 and 35, the second spacer layer 140A, the second auxiliary base pattern 106C, the auxiliary cover base pattern 108C, the second pad base pattern 106D, and the pad cover base pattern 108D may be caused to remain on the feature layer 104 by removing the second main base pattern 106A and the second sub-base pattern 106B of FIGS. 32 and 33. A second base space 106G may be formed in a portion obtained by removing the second main base pattern 106A and the second sub-base pattern 106B.

Portions of the second spacer layer 140A that surround the first base space 106G may include an outer spacer layer 140-1, an inner spacer layer 140-2, and main spacer layers 140-3. The outer spacer layer 140-1 and the inner spacer layer 140-2 may be portions of the second spacer layer 140A that respectively cover an outer side wall and an inner side wall of the second sub-base pattern 106B of FIG. 32, and the main spacer layers 24-3 may be portions of the second spacer layer 140A that cover both side walls of the main base pattern 106A of FIG. 32.

Two outer main spacer layers 140-3 among four continuous main spacer layers 140-3 may be connected to each other by the outer spacer layer 140-1, and two inner main spacer layers 140-3 among the four continuous main spacer layers 140-3 may be connected to each other by the inner spacer layer 140-2.

The second spacer layer 140A may have the tenth width W61. The plurality of main spacer layers 140-3 may have a third gap G31 therebetween and may extend in the second direction Y. The third gap G31 may be the same as or similar to the eighth width W51 of FIG. 33. In some embodiments, the third gap G31 may be 1 F.

Figure 36:
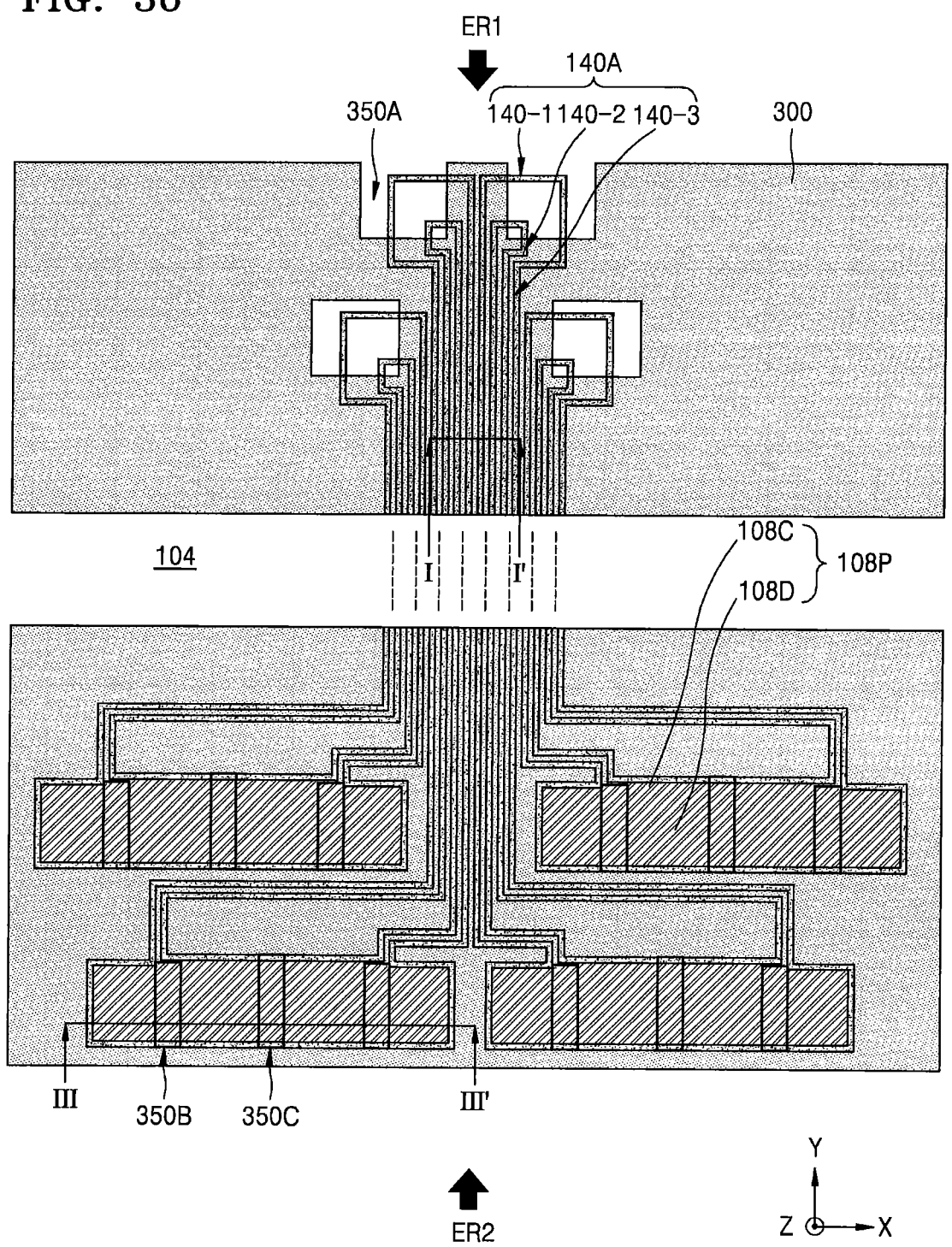
Figure 37:
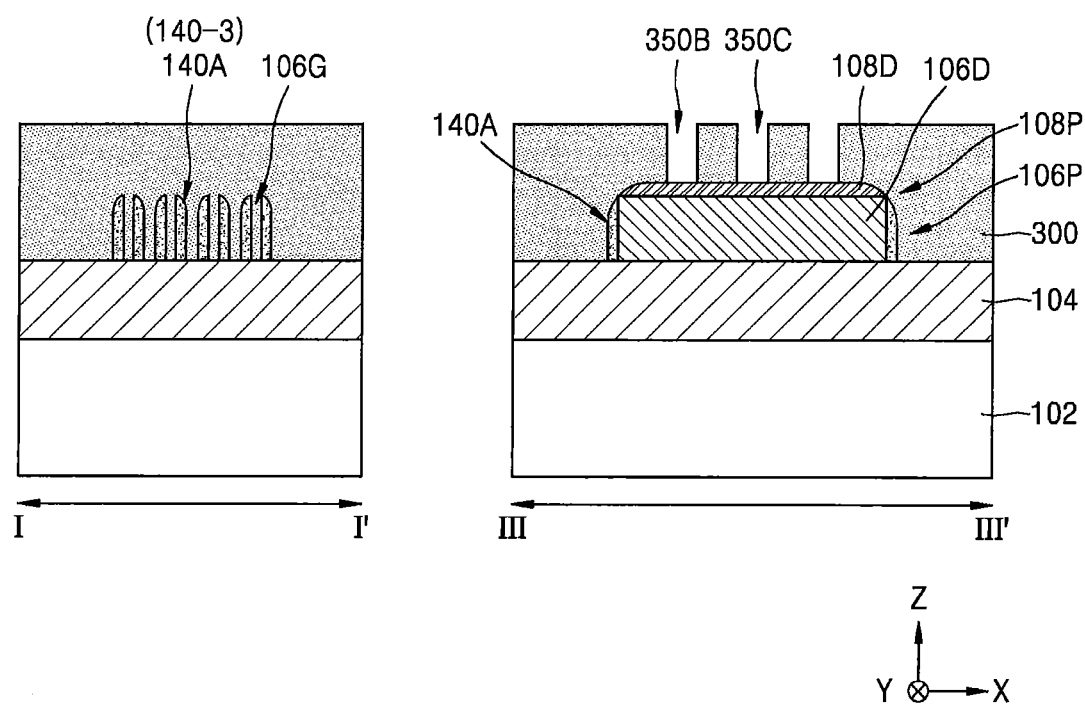

FIGS. 36 and 37 show a plan view and cross-sectional views for explaining an operation of forming a second mask pattern 300 to manufacture a semiconductor device according to some embodiments. In detail, FIG. 37 shows cross-sectional views taken along lines I-I' and III-III' of FIG. 36.

Referring to FIGS. 36 and 37, the second mask pattern 300 having second through fourth openings 350A, 350B, and 350C is formed on the substrate 102 including the second spacer layer 140A. The second opening 350A may expose portions of the outer spacer layer 140-1 and the inner spacer layer 140-2 that are adjacent one another. The second mask pattern 300 may entirely cover the main spacer layers 140-3, and may cover a portion of the outer spacer layer 140-1 and a portion of the inner spacer layer 140-2 that are connected to the main spacer layers 140-3.

The third and fourth openings 350B and 350C may expose portions of the auxiliary cover base pattern 108C and the pad cover base pattern 108D and a portion of the second spacer layer 140A that contacts the auxiliary cover base pattern 108C and the pad cover base pattern 108D. In the second mask pattern 300, one cover base pattern 108P including the auxiliary cover base pattern 108C and the pad cover base pattern 108D may be separated into four portions and may be covered.

The third opening 350B may expose a portion of the auxiliary cover base pattern 108C, a portion of the pad cover base pattern 108D, and a portion of the second spacer layer 140A that contacts the pad cover base pattern 108D. The fourth opening 350C may expose a portion of the auxiliary cover base pattern 108C, a portion of the pad cover base pattern 108D, and portions of the second pacer layer 140A that contact the auxiliary cover base pattern 108C and the pad cover base pattern 108D.

The second mask pattern 300 may be formed of a photoresist that is formed by using, for example, photolithography.

Figure 38:
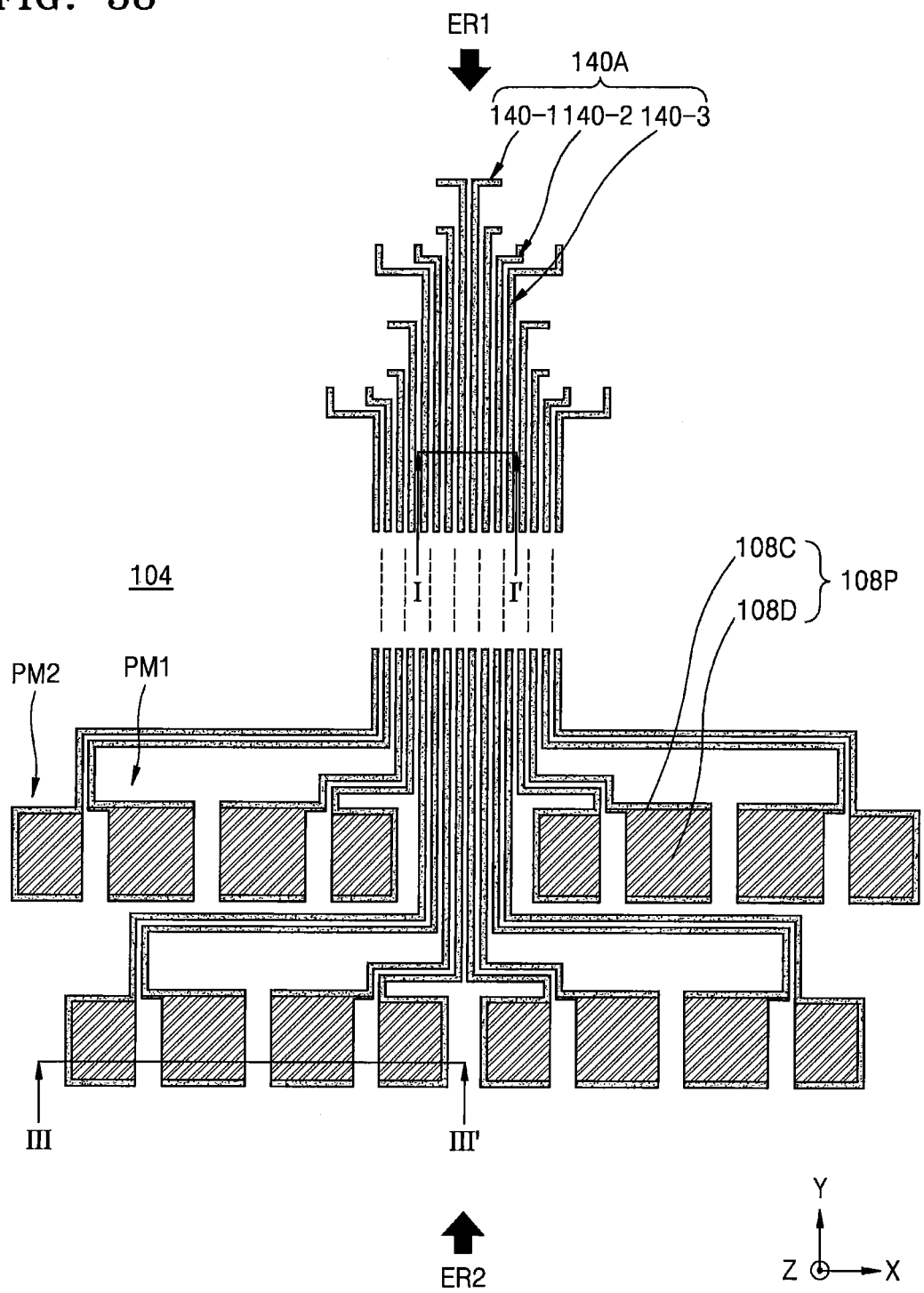
Figure 39:
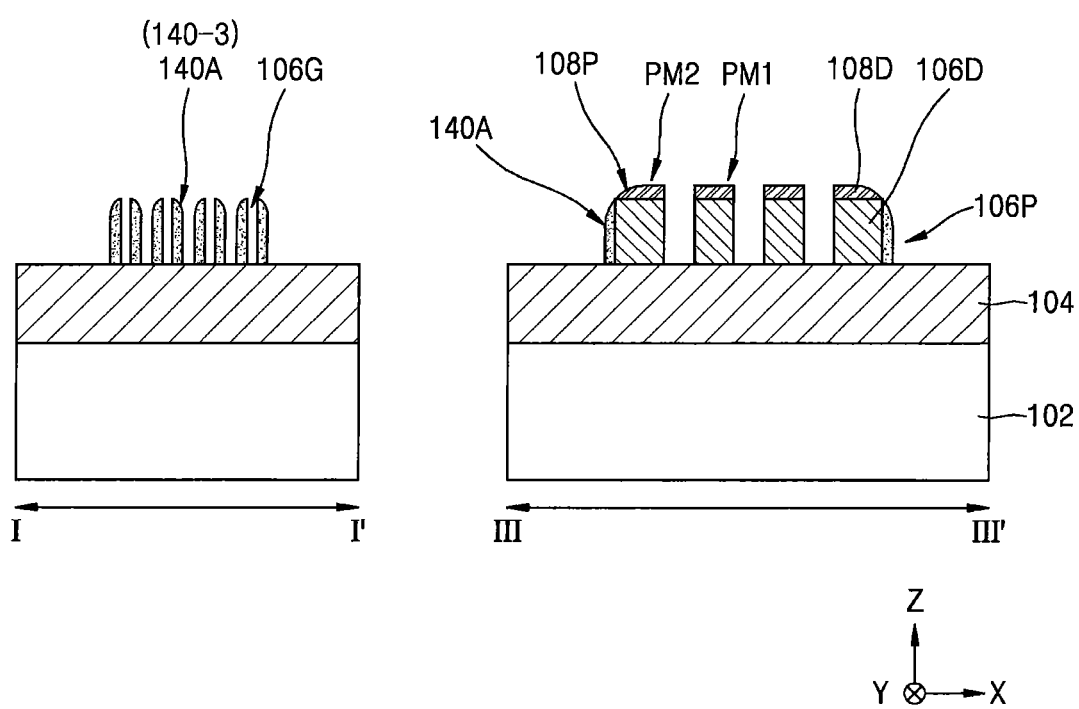

FIGS. 38 and 39 show a plan view and cross-sectional views for explaining an operation of removing portions of the second spacer layer 140A, the cover base pattern 108P, and the second base pattern 106P to manufacture a semiconductor device according to some embodiments. In detail, FIG. 39 shows cross-sectional views taken along lines I-I' and III-III' of FIG. 38.

Referring to FIGS. 38 and 39, portions of the second spacer layer 140A, the cover base pattern 108P, and the second base pattern 106P that are exposed through the second through fourth openings 350A, 350B, and 350C are removed by using the second mask pattern 300 of FIGS. 36 and 37 as an etching mask.

The outer spacer layer 140-1 and the inner spacer layer 140-2 may be cut by performing a trimming process for removing portions of the outer spacer layer 140-1 and the inner spacer layer 140-2 through the second opening 350A. Accordingly, two main spacer layers 1403 that are connected by the outer spacer layer 140-1 or the inner spacer layer 140-2 may be separated from each other.

Each of two outer main spacer layers 140-3 among four continuous main spacer layers 140-3 may be connected to a portion of the outer spacer layer 140-1, and each of two inner main spacer layers 140-3 among the four continuous main spacer layers 140-3 may be connected to a portion of the inner spacer layer 140-2.

Pad mask patterns PM1 and PM2 may be formed by removing portions of the second spacer layer 140A, the cover base pattern 108P, and the second base pattern 106P through the third and fourth openings 350B and 350C. The pad mask patterns PM1 and PM2 may include remaining portions of the cover base pattern 108P and the second base pattern 106P, and portions of the second spacer layer 140A that contact the cover base pattern 108P and the second base pattern 106P. The first pad mask pattern PM1 includes a portion of the auxiliary cover base pattern 108C. a portion of the pad cover base pattern 108D, and a portion of the second base pattern 106P that is disposed under the auxiliary cover base pattern 108C and the pad cover base pattern 108D whereas the second pad mask pattern PM1 does not include a portion of the auxiliary cover base pattern 108C and a portion of the second base pattern 106P that is disposed under the auxiliary cover base pattern 108C.

Each separated main spacer layer 140-3 may be connected to any one of the first and second pad mask patterns PM1 and PM2. Each of two inner main spacer layers 140-3 among four continuous main spacer layers 140-3 may be connected to the first pad mask pattern PM1 and each of two outer main spacer layers 140-3 among the four continuous main spacer layers 140-3 may be connected to the second pad mask pattern PM2.

Next, the second mask pattern 300 may be removed.

Figure 40:
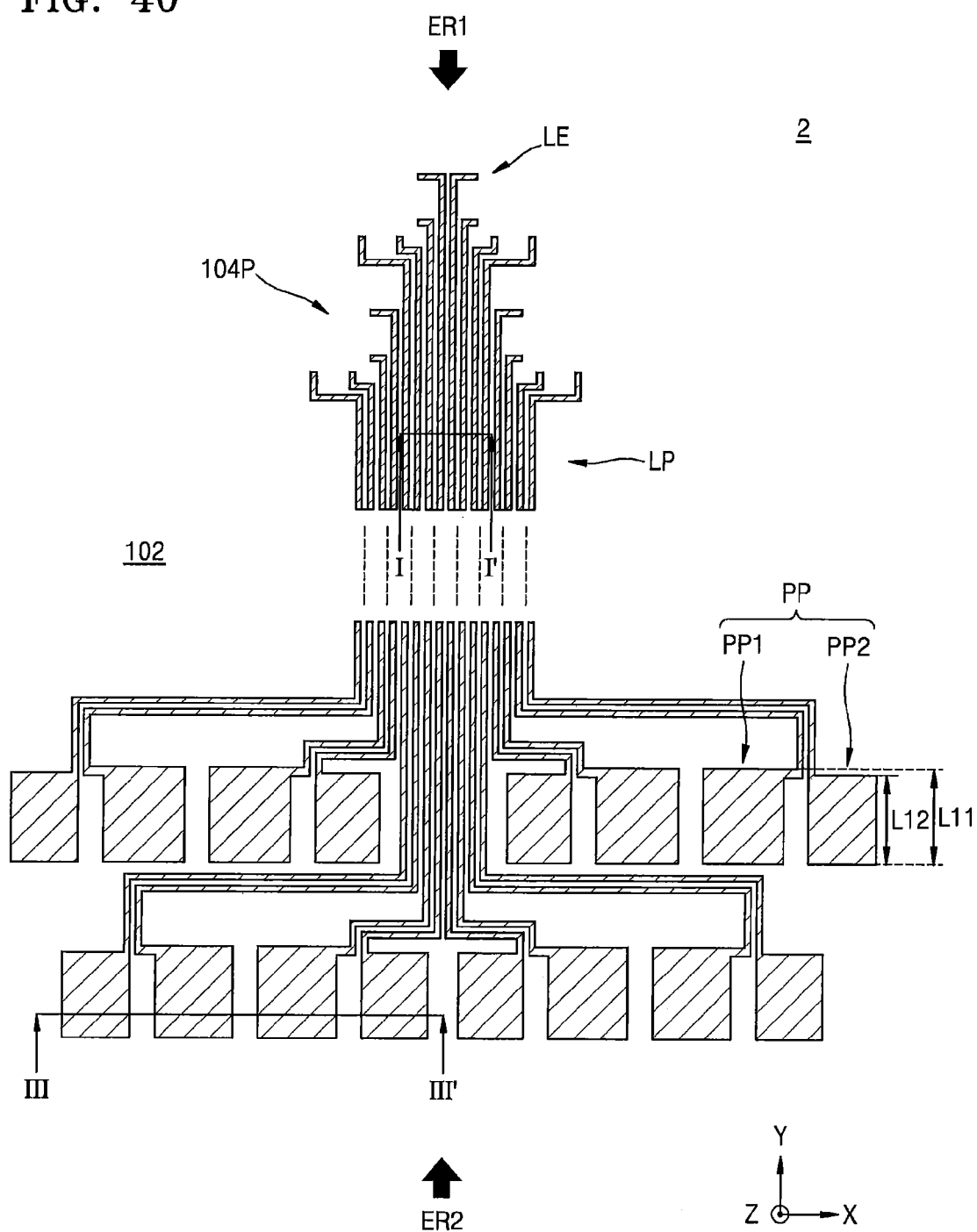
Figure 41:
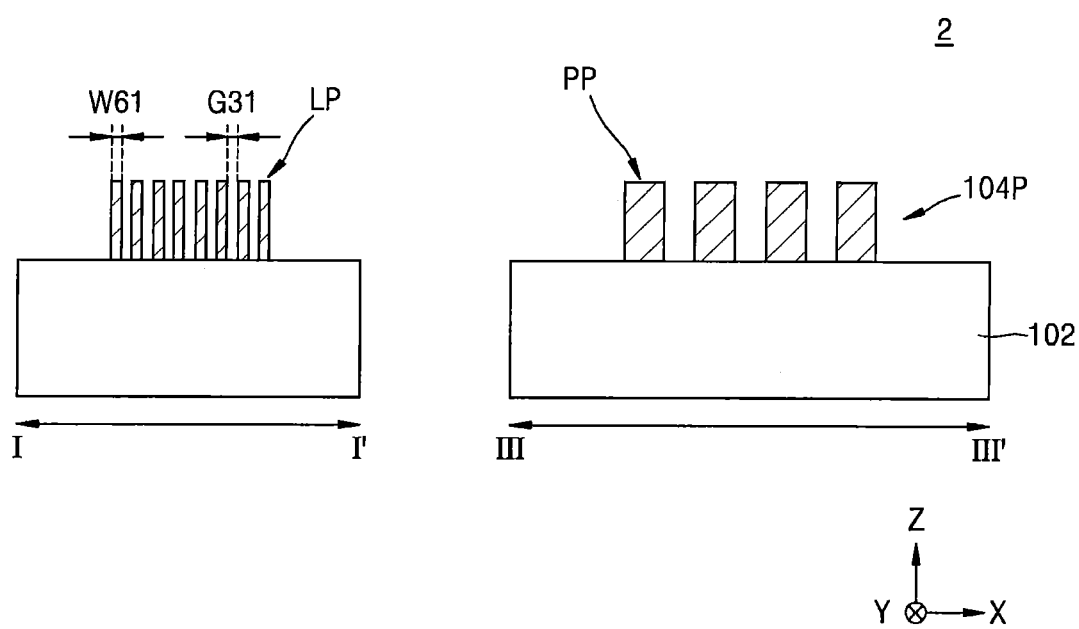

FIGS. 40 and 41 show a plan view and a cross-sectional view of a feature pattern 104P included in a semiconductor device 2 according to some embodiments. In detail, FIG. 41 shows cross-sectional views taken along lines I-I' and III-III' of FIG. 40.

Referring to FIGS. 40 and 41, the semiconductor device 2 includes the feature pattern 104P. The feature pattern 104P may be formed by etching the feature layer 104 by using the second spacer layer 140A and the first and second pad mask patterns PM1 and PM2 of FIGS. 38 and 39 as an etching mask. The feature pattern 104P may have a shape obtained by transferring shapes of the second spacer layer 140A and the first and second pad mask patterns PM1 and PM2 of FIGS. 10 and 11. The feature pattern 104P may include the plurality of line patterns LP that are spaced apart from one another.

The plurality of line patterns LP each having the tenth width W61 may have the third gap G31 therebetween and may extend in the second direction Y. The line ends LE of the plurality of line patterns LP at the first edge area ER1 may be spaced apart from extension lines that extend in the second direction Y from the line patterns LP.

A direction which the line ends LE of one adjacent pair of line patterns LP among four continuous line patterns LP face and a direction which the line ends of LE of another adjacent pair of line patterns LP among the four continuous line patterns LP face may be different from each other.

A direction which the line ends LE of one adjacent pair of line patterns LP among four continuous line patterns LP face may be the first direction X and a direction which the line ends LE of another adjacent pair of line patterns LP among the four continuous line patterns LP face may be the second direction Y. That is, among four continuous line patterns LP, one adjacent pair of line patterns LP may extend in the second direction Y, may be bent, and may extend in the first direction X, and may have the line ends LE face the first direction X, and another adjacent pair of line patterns LP may extend in the second direction Y, may be bent, may extend in the first direction X, may be bent, and may extend in the second direction, and may have the line ends LE face the second direction Y. Among the adjacent pair of line patterns LP whose line ends LE face the second direction Y, portions that extend in the first direction X may have the third gap G3 therebetween.

When a direction which the line ends LE of one adjacent pair of line patterns LP among four continuous line patterns LP face is the first direction X, the line ends LE of the adjacent pair of line patterns LP may be located on a straight line that extends in the second direction Y. When a direction which the line ends LE of another adjacent pair of line patterns LP among the four continuous line patterns LP face is the second direction Y, the line ends LE of the adjacent pair of line patterns LP may be located on a straight line that extends in the first direction X.

In one pair of adjacent line patterns LP that have the third gap G31 and whose line ends LE face the same direction, lengths between portions that extend in the second direction Y and the line ends LE of the line patterns LP may be different from each other.

In one adjacent pair of line patterns LP that extend in the second direction Y, are bent, and extend in the first direction X, and have the line ends LE face the first direction X, lengths of portions that extend in the first direction X may be different from each other. In another adjacent pair of line patterns LP that extend in the second direction Y, are bent, extend in the first direction X, are bent, and extend in the second direction Y, and have the line ends LE face the second direction Y, lengths of portions that extend in the first direction X, are bent, and extend in the second direction Y to the line ends LE may be different from each other.

In two pairs of line patterns LP whose line ends LE face different directions and that have the third gap G31 therebetween among four continuous line patterns LP, sums of lengths between portions that extend in the second direction Y and the line ends LE of the line patterns LP may be different from each other. For example, a sum of lengths between portions that extend in the second direction Y and the line ends LE of the line patterns LP in one pair of line patterns LP whose line ends LE face the first direction X and that have third gap G31 therebetween may be less than a sum of lengths between portions that extend in the second direction Y and the line ends LE of the line patterns LP in another pair of line patterns LP whose line ends LE face the second direction Y and that have the third gap G31 therebetween.

The plurality of line patterns LP may have the third gap G31 therebetween in the first direction, may be continuously arranged, and may extend in the second direction, and a distance between the line ends LE of the plurality of line patterns LP may be greater than the third gap G31. Accordingly, when the feature layer 104 is etched by using the second spacer layer 140A of FIGS. 38 and 39 which has been trimmed as an etching mask, even though an end portion of the feature pattern 104P, that is, the line end LE of each line pattern LP, has a thickness greater than the tenth width W61, bridge failure may be prevented. A distance between the line ends LE of the plurality of line patterns LP will be explained below in detail with reference to FIGS. 42A and 42B.

The plurality of line patterns LP may be connected to pad patterns PP at the second edge area ER2. Among four continuous line patterns LP, two inner line patterns LP may be connected to a first pad pattern PP1 and two outer line patterns LP may be connected to a second pad pattern PP2. Lengths of the first pad pattern PP1 and the second pad pattern PP2 in the second direction Y may be different from each other. The first pad pattern PP1 in the second direction Y may have a third length L11 and the second pad pattern PP2 in the second direction Y may have a fourth length L12. Since the first pad pattern PP1 has a shape obtained by transferring shapes of a portion of the auxiliary cover base pattern 108C, a portion of the pad cover base pattern 108D, and portions of the second spacer layer 140A that contact the auxiliary cover base pattern 108C and the pad cover base pattern 108D of FIG. 38 whereas the second pad pattern PP2 has a shape obtained by transferring shapes of a portion of the pad cover base pattern 108D and a portion of the second spacer layer 140A that contacts the pad cover base pattern 108D, the third length L11 may be greater than the fourth length L12.

In the plurality of line patterns LP formed according to some embodiments, a distance between the line ends LE may be relatively large, without additional photolithography, only by using photolithography that has to be used to form the pad patterns PP. Accordingly, a reliable semiconductor device may be formed without additional manufacturing costs and time.

Figure 42A:
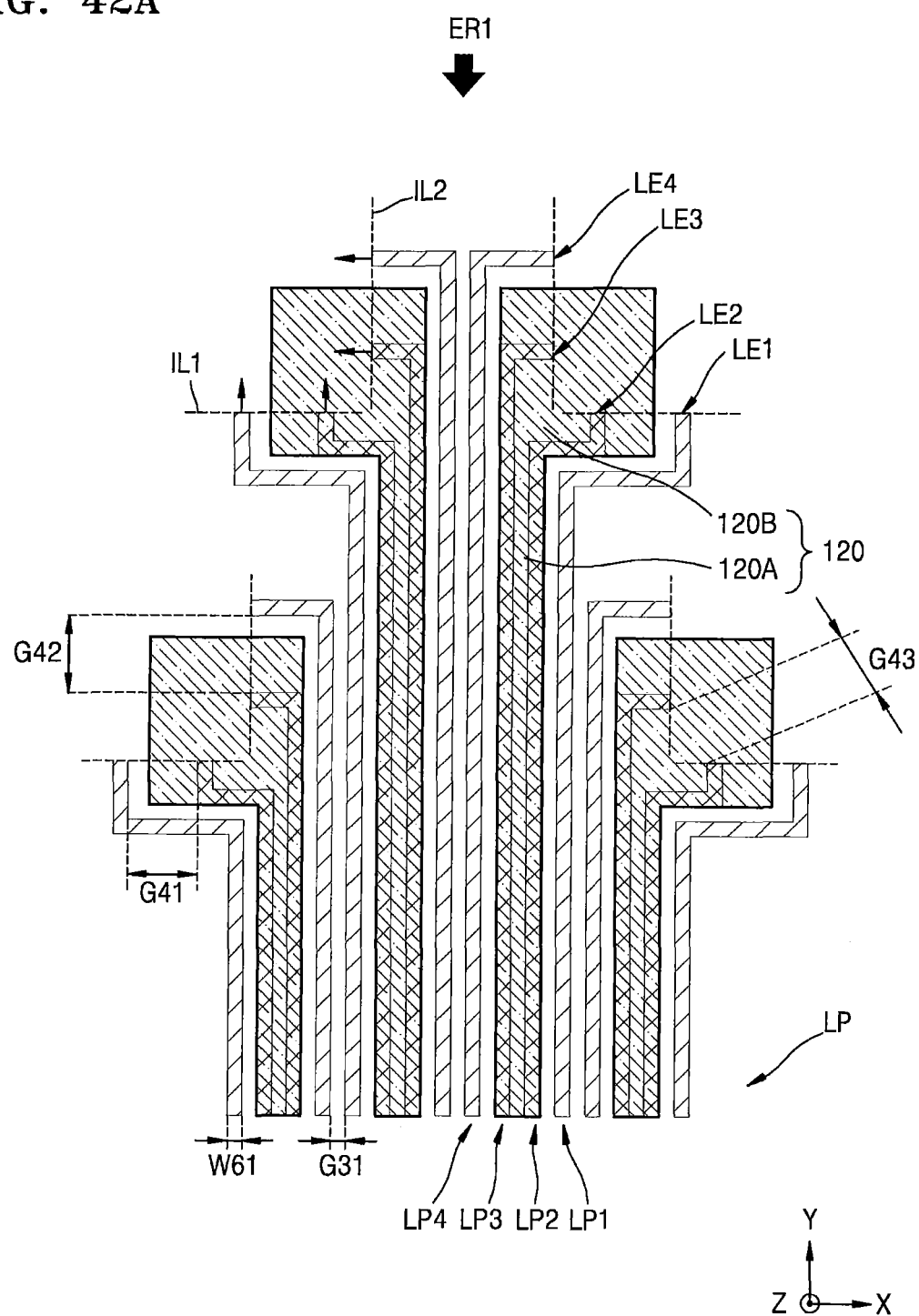
FIGS. 42A and 42B show plan views for explaining shapes of line patterns included in a semiconductor device according to some embodiments of the present inventive concept.
Figure 42B:
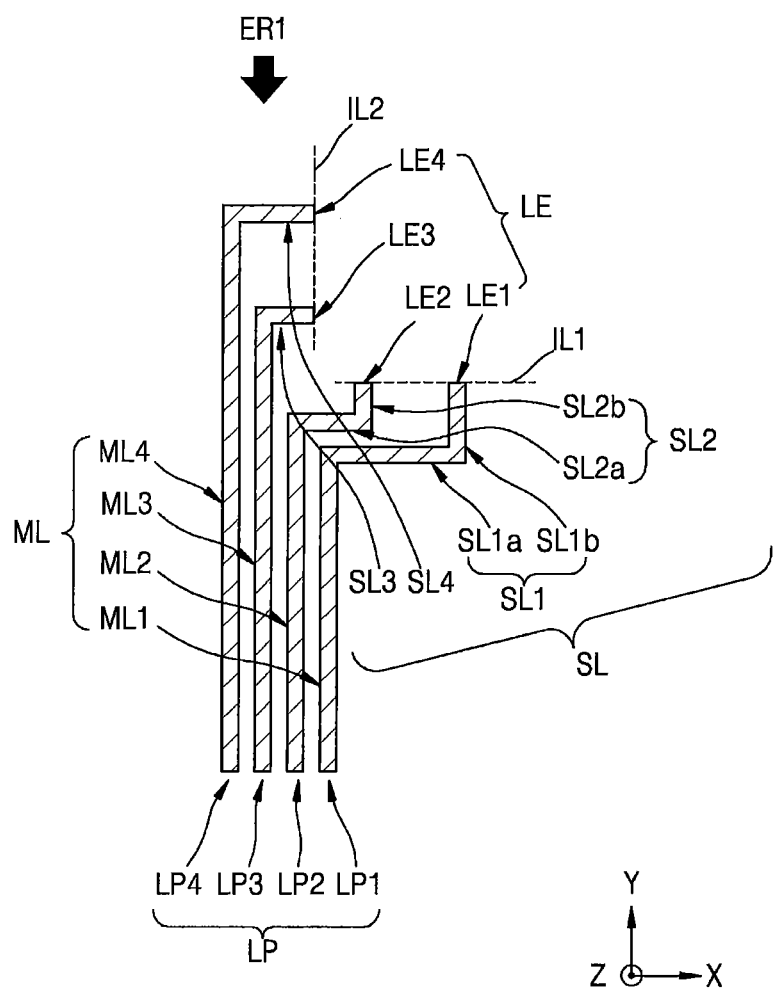

FIGS. 42A and 42B show plan views for explaining shapes of the line patterns LP included in a semiconductor device according to some embodiments.

Referring to FIG. 42A, the plurality of line patterns LP each having the tenth width W61 may have the third gap G31 therebetween and may extend in the second direction Y. Line ends LE1, LE2, LE3, and LE4 of first through fourth line patterns LP1, LP2, LP3, and LP4 at the first edge area ER1 may be spaced apart from extension lines that extend from the first through fourth line patterns LP1, LP2, LP3, and LP4 in the second direction Y.

A direction which line ends LE1 and LE2 of one adjacent pair of line patterns, that is, the first and second line patterns LP1 and LP2, that are a first subline set among the first through fourth line patterns LP1, LP2, LP3, and LP4 that are four continuous line patterns, face and a direction which line ends LE3 and LE4 of another adjacent pair of line patterns, that is, the third and fourth line patterns LP3 and LP4 that are a second subline set face may be different from each other.

A direction which the line ends LE1 and LE2 of the first and second line patterns LP1 and LP2 face may be the second direction Y and a direction which the line ends LE3 and LE4 of the third and fourth line patterns LP3 and LP4 face may be the second direction Y. That is, the first subline set LP1 and LP2 among the four continuous line patterns LP may extend in the second direction Y, may be bent, and may extend in the first direction X, and may have the line ends LE1 and LE2 face the first direction X, and the second subline set LP3 and LP4 among the four continuous line patterns LP may extend in the second direction Y, may be bent, may extend in the first direction X, may be bent, and may extend the second direction Y, and may have the line ends LE3 and LE4 face the second direction Y. Portions of the first and second line patterns LP1 and LP2 that extend in the first direction X may have the third gap G31 therebetween.

The line ends LE1 and LE2 of the first subline set LP1 and LP2 may be located on a straight line IL1 that extends in the first direction X, and the line ends LE3 and LE4 of the second subline set LP3 and LP4 may be located on the straight line IL2 that extends in the second direction Y.

In the first and second line patterns LP1 and LP2 that have the third gap G31 therebetween, lengths between portions that extend in the second direction Y and the line ends LE1 and LE2 may be different from each other. In the third and fourth line patterns LP3 and LP4 that have the third gap G31 therebetween, lengths between portions that extend in the second direction Y and the line ends LE3 and LE4 may be different from each other.

In the first and second line patterns LP1 and LP2, lengths of portions that extend in the first direction X, are bent, and extend to the line ends LE1 and LE2 in the second direction Y may be different from each other.

In the third and fourth line patterns LP3 and LP4, lengths of portions that extend to the line ends LE3 and LE4 in the first direction X may be different from each other.

In the first subline set LP1 and LP2 and the second subline set LP3 and LP4 that have the third gap G3 therebetween, sums of lengths between portions that extend in the second direction Y and the line ends LE1, LE2, LE3, and LE4 of the first through fourth line patterns LP1, LP2, LP3, and LP4 may be different from each other. For example, a sum of lengths between portions in the second direction Y and the line ends LE3 and LE4 of the second subline set LP3 and LP4 that have the third gap G31 therebetween may be less than a sum of lengths between portions that extend in the second direction Y and the line ends LE1 and LE2 of the first subline set LP1 and LP2 that have the third gap G31 therebetween.

The first through fourth line patterns LP1, LP2, LP3, and LP4 may have the third gap G31 in the first direction X, may be continuously arranged, and may extend in the second direction Y, and a distance between the line ends LE1, LE2, LE3, and LE4 may be greater than the third gap G31.

A distance between the line ends LE1 and LE2 of the first line pattern LP1 and the second line pattern LP2 may be a fourth gap G41. A distance between the line ends LE3 and LE4 of the third line pattern LP3 and the fourth line pattern LP4 may be a fifth gap G42. A distance between the line ends LE2 and LE3 of the second line pattern LP2 and the third line pattern LP3 may be a sixth gap G43.

Each of the fourth through sixth gaps G41, G42, and G43 may be greater than the third gap G31. The sixth gap G43 may be greater than the fourth gap G41 or the fifth gap G42. The sixth gap G43 may be increased or reduced by increasing or reducing a portion of the inner spacer layer 140-2 that is exposed through the second opening 350A of FIG. 36.

The fourth gap G41 and the fifth gap G42 may be the same, but the present embodiments are not limited thereto and the fourth gap G41 may be greater or less than the fifth gap G42. The fourth gap G41, the fifth gap G42, or the sixth gap G43 may range, for example, from about 2 F to about 6 F.

The second line pattern LP2 and the third line pattern LP3 may be disposed to overlap the first base pattern 120. The first line pattern LP1 and the fourth line pattern LP4 may be disposed not to overlap the first base pattern 120. The line ends LE2 and LE3 of the second line pattern LP2 and the third line pattern LP3 may be disposed to overlap an inner portion of the first base pattern 120.

Referring to FIG. 42B, each of the plurality of line patterns LP that are spaced apart from one another include a main line ML that extends in the second direction Y and a subline SL that is bent from one end of the main line ML and extends. Four line patterns, that is, the first through fourth line patterns LP1, LP2, LP3, and LP4, that are continuously arranged among the plurality of line patterns LP may be defined as one line set.

The one line set may include a first subline set including the first line pattern LP1 and the second line pattern LP2 and a second subline set including the third line pattern LP3 and the fourth line pattern LP4.

The first through fourth line patterns LP1, LP2, LP3, and LP4 may respectively include first through fourth main lines ML1, ML2, ML3, and ML4 that extend in the second direction Y and first through fourth sublines SL1, SL2, SL3, and SL4 that are bent from one end of each of the first through fourth main lines ML1, ML2, ML3, and ML4 and extend to the line ends of LE1, LE2, LE3, and LE4.

The first through fourth main lines ML1, ML2, ML3, and ML4 and the first through fourth sublines SL1, SL2, SL3, and SL4 may extend to have the same width, for example, the tenth width W61 of FIG. 42A.

The first through fourth sublines SL1, SL2, SL3, and SL4 that are included in the one line set may be bent into the same direction, for example, the first direction X, from one end of each of the first through fourth main lines ML1, ML2, ML3, and ML4 and may extend.

The first and second sublines SL1 and SL2 may include portions that extend in the second direction Y. The portions of the first and second sublines SL1 and SL2 that extend in the second direction Y may have therebetween the fourth gap G41 of FIG. 42A. Portions of the third and fourth sublines SL3 and SL4 that extend in the first direction X may have therebetween the fifth gap G42 of FIG. 42A.

A direction which the first and second line ends LE1 and LE2 that are end portions of the first and second sublines SL1 and SL2 face may be different from a direction which the third and fourth line ends LE3 and LE4 that are end portions of the third and fourth sublines SL3 and SL4 face.

The first and second line ends LE1 and LE2 that are ends of the first and second sublines SL1 and SL2 may be located on the straight line IL1 that extends in the first direction X. The third and fourth line ends LE3 and LE4 that are ends of the third and fourth sublines SL3 and SL4 may be located on the straight line IL2 that extends in the second direction Y.

In the first subline SL1 and the second subline SL2, total lengths between the first and second main lines ML1 and ML2 and the line ends LE1 and LE2 that are end portions of the first subline SL1 and the second subline SL2 may be different from each other. For example, a total length of the first subline SL1 may be greater than a total length of the second subline SL2.

In the third subline SL3 and the fourth subline SL4, lengths between the third and fourth main lines ML3 and ML4 and the line ends LE3 and LE4 that are end portions of the third subline SL3 and the fourth subline SL may be different from each other. For example, a total length of the third subline SL3 may be less than a total length of the fourth subline SL4.

A sum of total lengths of the first subline SL1 and the second subline SL2 may be greater than a sum of total lengths of the third subline SL3 and the fourth subline SL4.

The first through fourth line patterns LP1, LP2, LP3, and LP4 may be sequentially arranged, and a distance between the line end LE2 that is an end of the second subline SL2 and the line end LE3 that is an end of the third subline SL3 may be greater than the fourth gap G41 that is a distance between the line end LE1 and the line end LE2 or the fifth gap G42 that is a distance between the line end LE3 and the line end LE4.

The first subline SL1 and the second subline SL2 may include first portions SL1a and SL2a that extend in the first direction X respectively from the first main line ML1 and the second main line ML2, and second portions SL1b and SL2b that extend in the second direction Y respectively from the first portions SL1a and SL2a. The first portions SL1a and SL2a of the first subline SL1 and the second subline SL2 may have therebetween the first gap G31 of FIG. 42A and may extend in the first direction X.

Figure 43:
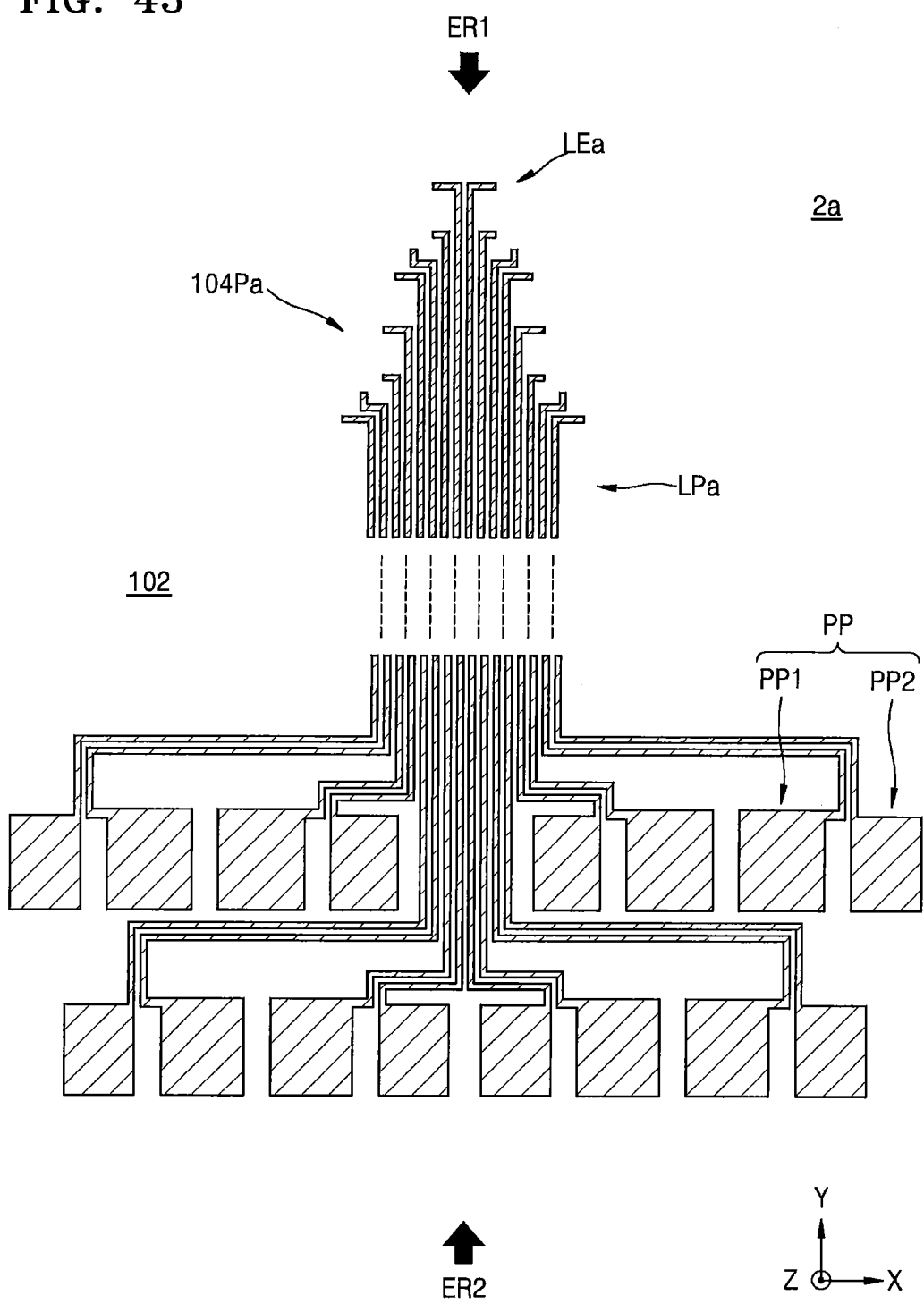
FIG. 43 shows a cross-sectional view of a feature pattern included in a semiconductor device according to some embodiments of the present inventive concept.

FIG. 43 shows a cross-sectional view of a feature pattern 104Pa included in a semiconductor device 2a according to some embodiments.

Referring to FIG. 43, the semiconductor device 2a includes the feature pattern 104Pa. The feature pattern 104Pa may be formed by using a method of manufacturing device described with reference to FIGS. 20 through 41 by using a mask pattern (not shown) having the opening 35A of FIG. 14, instead of the second opening 350A of the mask pattern 300 of FIG. 36, and thus a detailed explanation thereof will not be given.

In the feature pattern 104Pa, unlike in the feature pattern 104P of FIG. 40, directions which the line ends LE1 of three line patterns LPa among four continuous line patterns LP1 face may be parallel and a direction which the line end LEa of the remaining one line pattern LPa faces may be different. That is, directions which the line ends LEa of three line patterns LPa among four continuous line patterns LPa face may be the first direction X or a direction that is opposite to the first direction X, and a direction which the line end LEa of the remaining one line pattern LPa faces may be the second direction Y.

FIGS. 44 through 49 show plan views for explaining methods of manufacturing a semiconductor device according to some embodiments.

Figure 44:
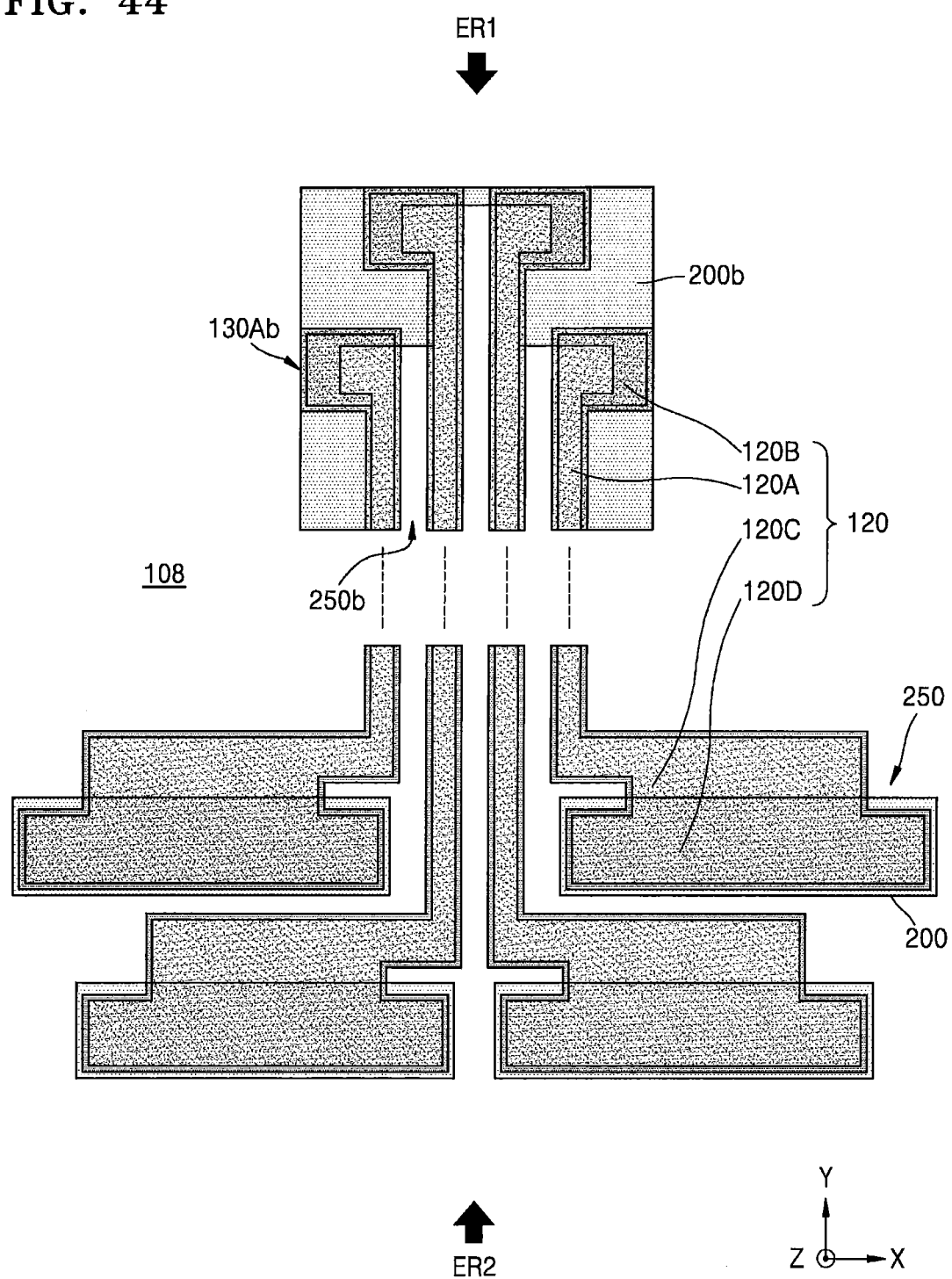
FIGS. 44 through 49 show plan views for explaining methods of manufacturing a semiconductor device according to some embodiments of the present inventive concept.

FIG. 44 shows a plan view for explaining an operation of forming a first mask pattern 200b to manufacture a semiconductor device according to some embodiments.

Referring to FIG. 44, after the first base pattern 120 and the first spacer layer 130A are formed, the first mask pattern 200b having a first opening 250b is formed. The first opening 250b may expose each of the first main base patterns 120A. The first opening 250b may expose a portion of the first sub-base pattern 120B that contacts the first main base pattern 120A.

The first opening 250 of the mask pattern 200 of FIG. 25 and the first opening 250b of the mask pattern 200b of FIG. 44 are different in a portion of the first sub-base pattern 120B that is exposed.

That is, there is a difference in that in the first base pattern 120 that is exposed through the first opening 250b of FIG. 44, a portion having a larger width in the first direction is a middle portion of the first sub-base pattern 120B in the second direction Y whereas in the first base pattern 120 that is exposed through the first opening 250 of FIG. 25, a portion having a larger width in the first direction X is a portion of the first sub-base pattern 120B that contacts the first main base pattern 120A.

Figure 45:
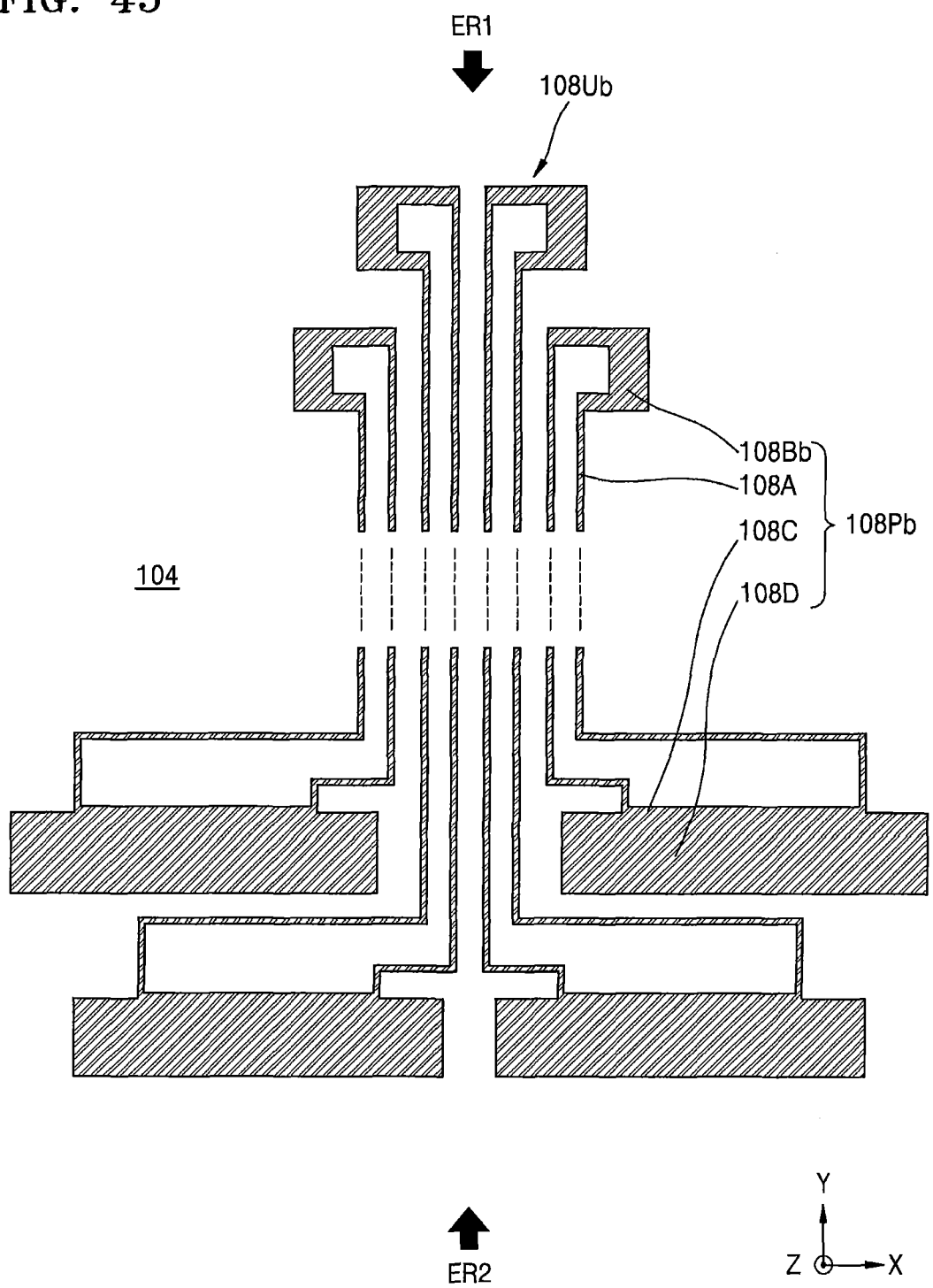

FIG. 45 shows a plan view for explaining an operation of forming a cover base pattern 108Pb to manufacture a semiconductor device according to some embodiments.

Referring to FIG. 45, after a portion of the first base pattern 120 that is exposed is removed using the mask pattern 200b of FIG. 44 as an etching mask, the cover base pattern 108Pb is formed by etching the first and second mask layers 106 and 108 (see FIGS. 27 and 28) by using remaining portions of the first base pattern 120 and the first spacer layer 130A as an etching mask. A second base pattern (not shown) that is a portion of the second mask pattern 106 may be disposed under the cover base pattern 108Pb.

Figure 46:
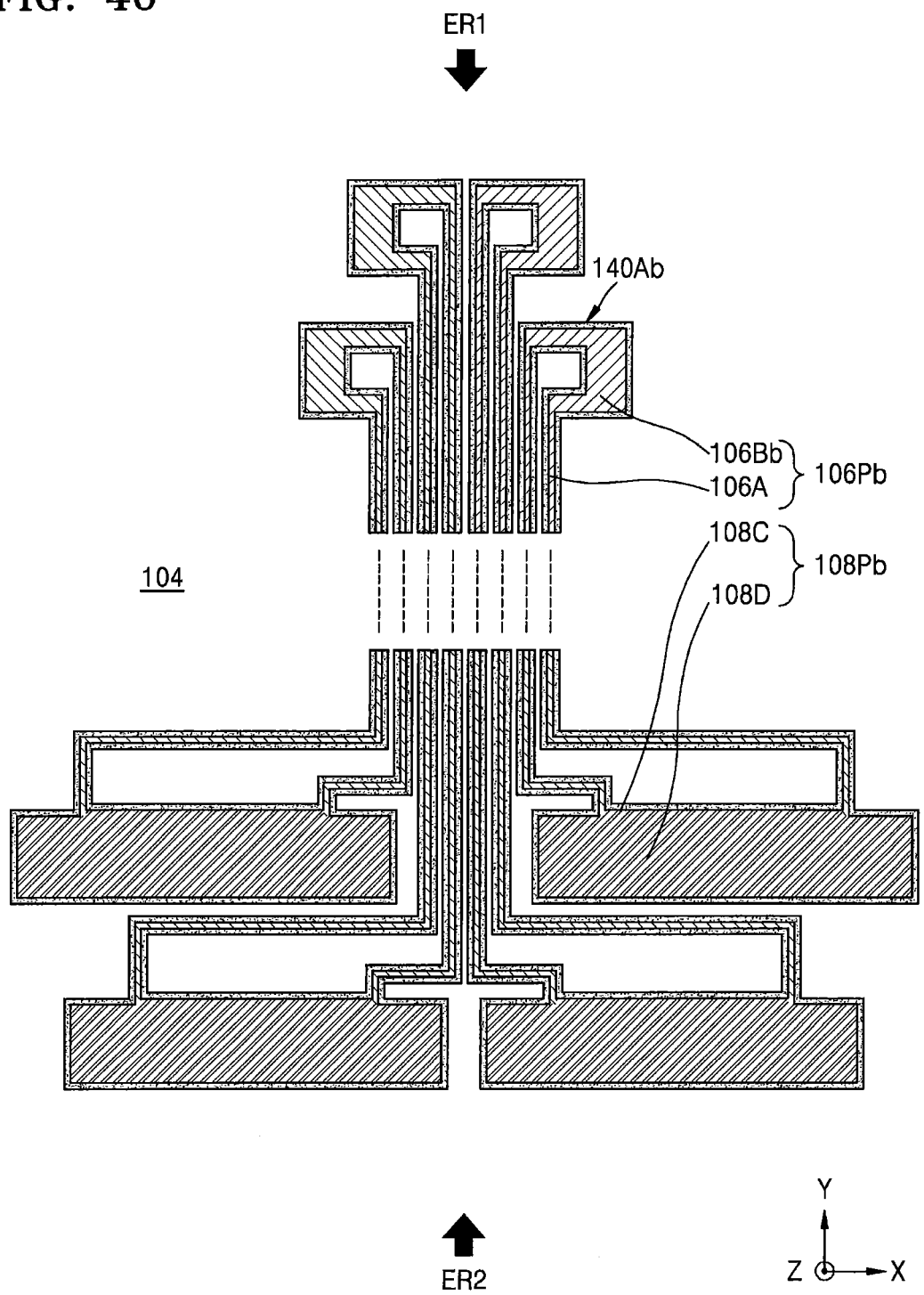
Figure 47:
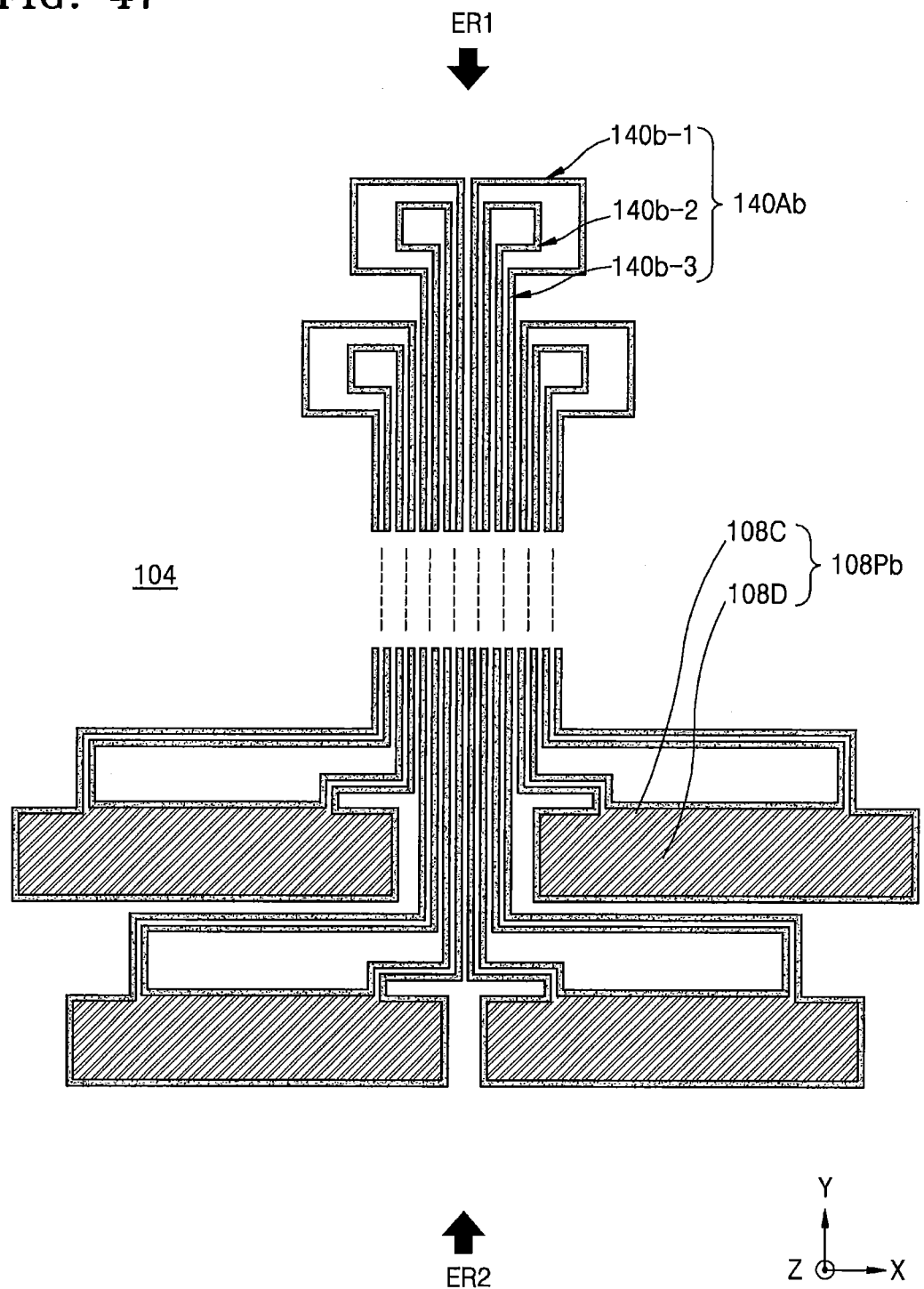

FIGS. 46 and 47 show plan views for explaining an operation of forming a second spacer layer 140Ab to manufacture a semiconductor device according to some embodiments.

Referring to FIG. 46, the second spacer layer 140Ab that coves side walls of a first base pattern 106Pb and a cover base pattern 108Pb is formed.

Referring to FIG. 47, the second main base pattern 106A and the second main sub-base pattern 106Bb of FIG. 46 are removed.

The second spacer layer 140Ab may be formed by using the same method as a method of forming the second spacer layer 140A described with reference to FIGS. 31 through 35, and thus a detailed explanation thereof will not be given.

Figure 48:
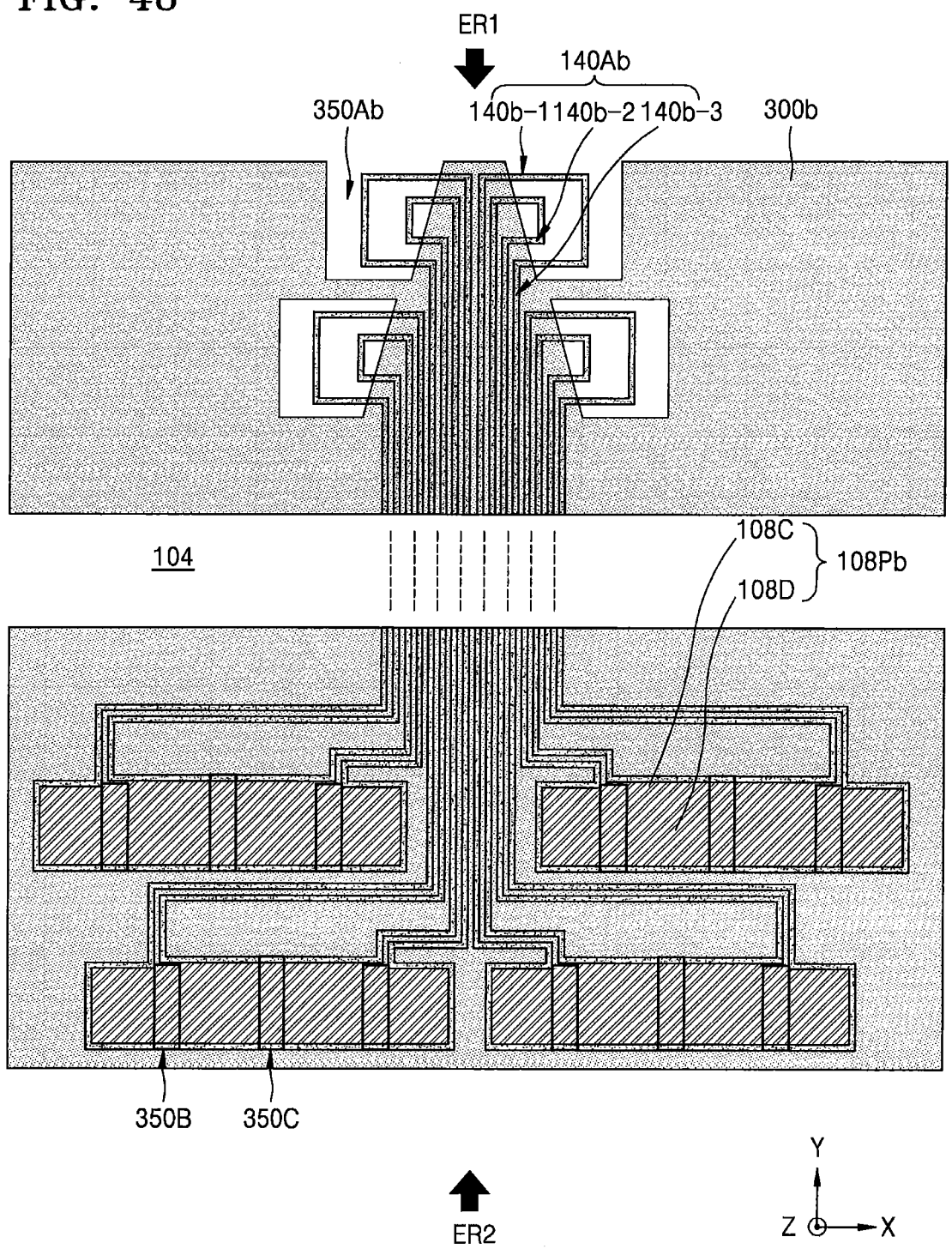

FIG. 48 shows a plan view for explaining an operation of forming a second mask pattern 300b to manufacture a semiconductor device according to some embodiments.

Referring to FIG. 48, the second mask pattern 300b having second through fourth openings 350Ab, 350B, and 350C is formed on the feature layer 104 including the second spacer layer 140Ab. The second mask pattern 300b has the same shape as that of the second mask pattern 300 of FIG. 36 except that the second opening 350Ab has a shape similar to that of the opening 35b of FIG. 18, and thus a detailed explanation thereof will not be given.

Figure 49:
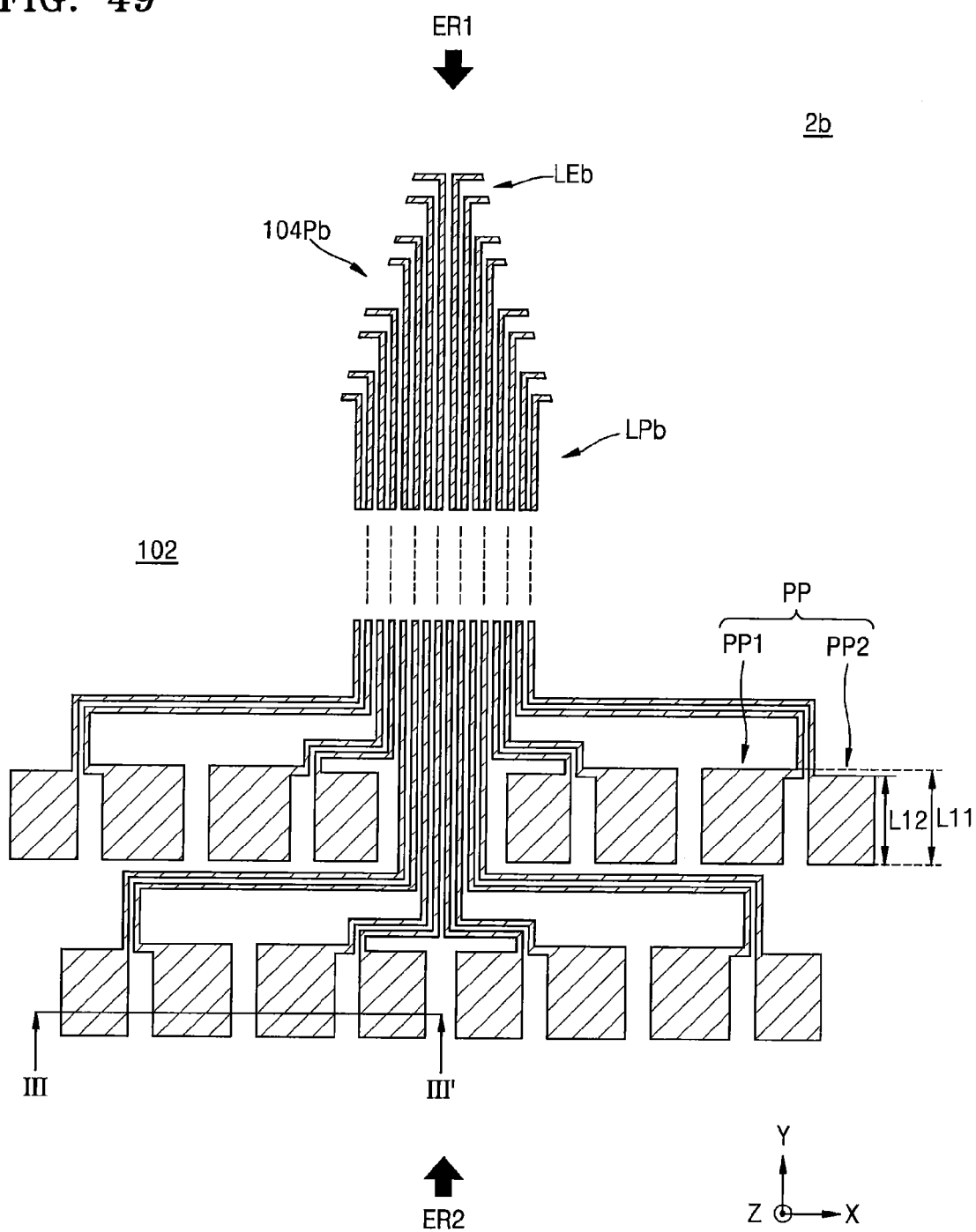

FIG. 49 shows a plan view of a feature pattern 104Pb included in a semiconductor device 2b according to some embodiments.

Referring to FIG. 49, the semiconductor device 2b includes the feature pattern 1040b. The feature pattern 104Pb may be formed by using a method of manufacturing a semiconductor device described with reference to FIGS. 38 through 41 by using the second mask pattern 300b of FIG. 48, and thus a detailed explanation thereof will not be given.

The feature pattern 104Pb may include the plurality of line patterns LPb that are spaced apart from one another. The line patterns LPb may extend in the second direction Y and may extend in the first direction X, and may have the line ends LEb face the first direction X. In the plurality of line patterns LPb, a distance between portions that extend in the first direction X may be greater than a distance between portions that extend in the second direction Y.

Figure 50A:
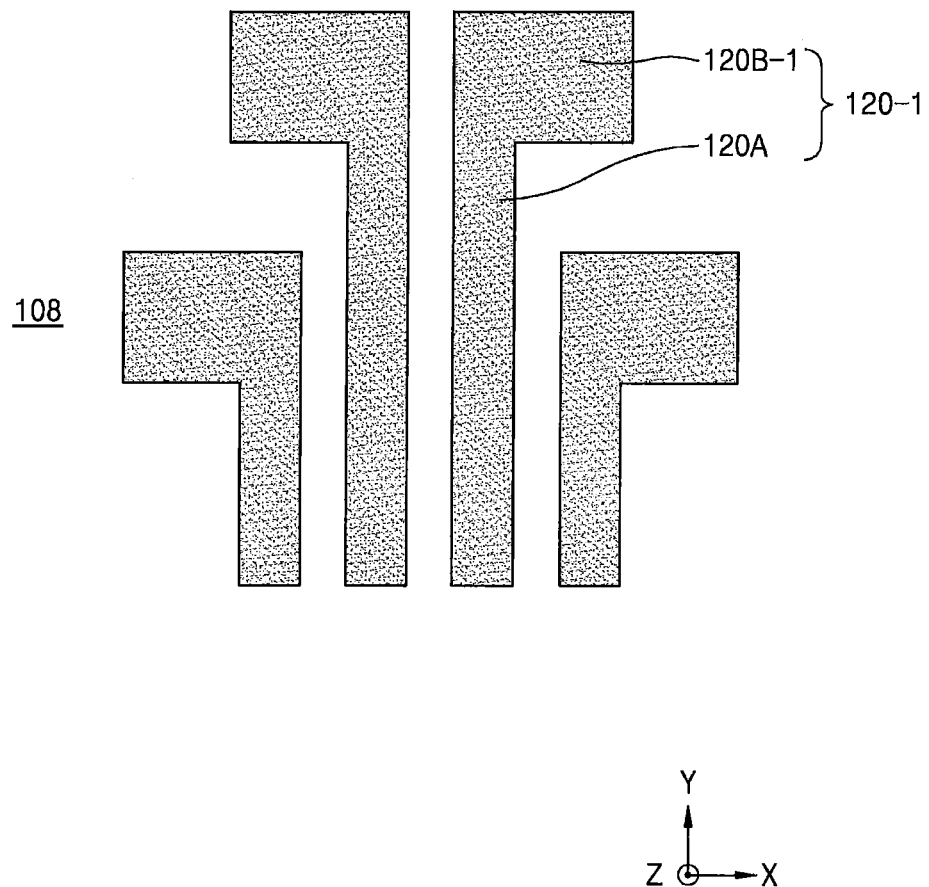
FIGS. 50A through 50C show plan views for explaining methods of manufacturing a semiconductor device according to some embodiments of the present inventive concept.
Figure 50B:
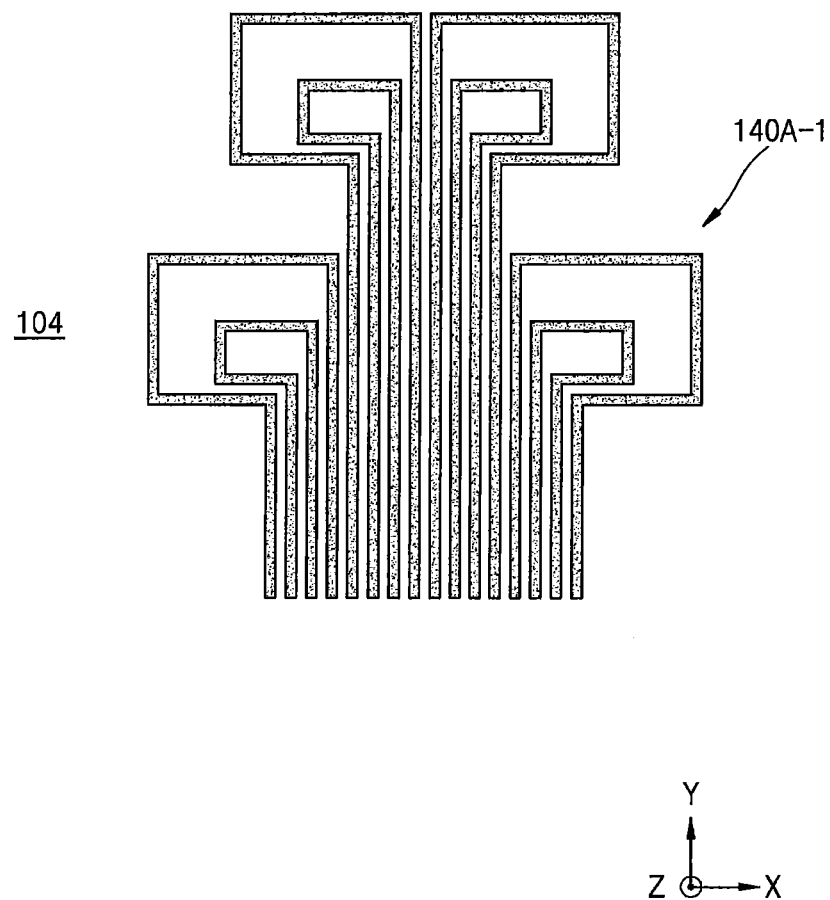
Figure 50C:
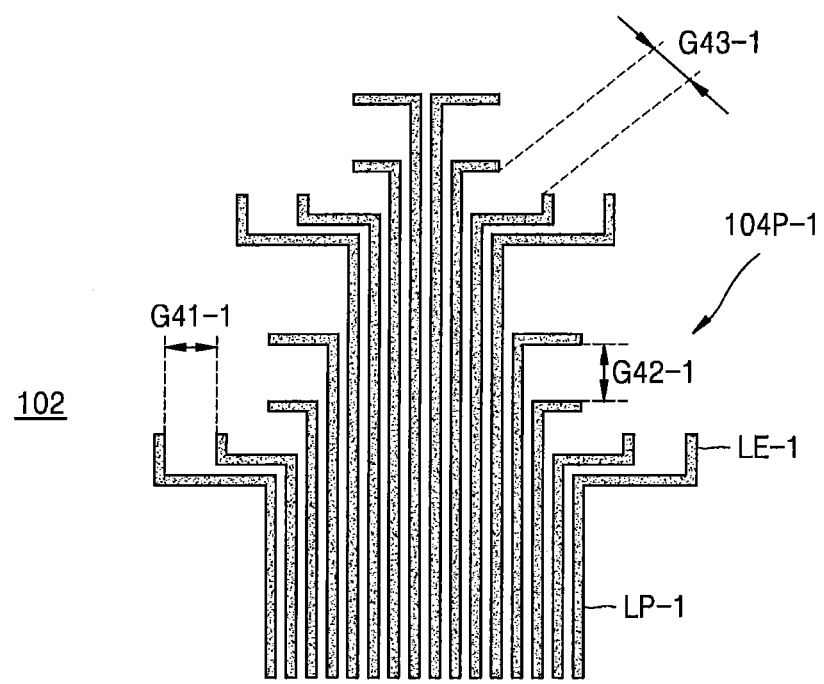

The feature pattern 104Pa is the same as the feature pattern 140P of FIG. 40 except that shapes of the line ends LEb of the line patterns LPb are the same as those of the line ends LEb of the line patterns LPb of FIG. 19, and thus a detailed explanation thereof will not be given. FIGS. 50A through 50C show plan views for explaining methods of manufacturing a semiconductor device according to some embodiments. FIGS. 50A, 50B, and 50C show plan views for explaining some of operations corresponding to FIGS. 20, 34, and 40, and other operations are the same as those of methods of manufacturing a semiconductor device described with reference to FIGS. 20 through 41, and thus a detailed explanation thereof will not be given.

Referring to FIG. 50A, a first base pattern 120-1 may include the plurality of first main base patterns 120A and first sub-base patterns 120B-1 that are connected to one end of each of the plurality of first main base patterns 120A.

Each of the first sub-base patterns 120B-1 may have a rectangular shape whose width in the first direction X is greater than a length in the second direction Y.

Referring to FIG. 50B, a width of a second spacer layer 140A-1 that extends in the first direction X to correspond to a shape of the first base pattern 120-1 of FIG. 50A may be greater than that of the second spacer layer 140A of FIG. 34.

Referring to FIG. 50C, a feature pattern 104P-1 may include a plurality of line patterns LP-1.

When a direction which line ends LE-1 of one adjacent pair of line patterns LP-1 among four continuous line patterns LP-1 face is the second direction Y, a distance between the line ends LE-1 of the adjacent pair of line patterns LP-1 may be a fourth gap G41-1. When a direction which the line ends LE-1 of another adjacent pair of line patterns LP-1 among the four continuous line patterns LP-1 face is the first direction X, a distance between the line ends LE-1 of the adjacent pair of line patterns LP-1 may be a fifth gap G42-1. A distance between the line ends LE-1 of two inner line patterns LP-1 among the continuous four line patterns LP-1 may be a sixth gap G43-1.

Since the first base pattern 120-1 of FIG. 50A includes the first sub-base pattern 120B-1 that has a relatively large rectangular shape whose width in the first direction X is relatively large, the fourth gap G41-1 may be greater than the fifth gap G42-1.

Figure 51A:
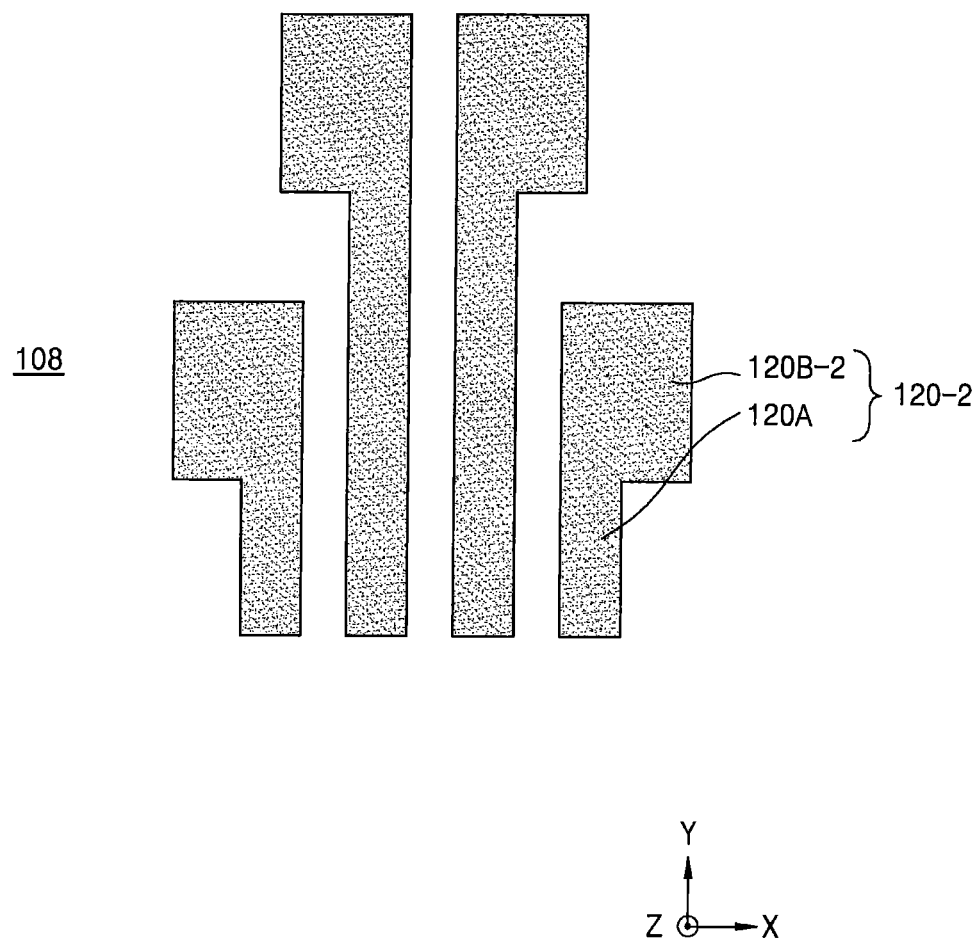
FIGS. 51A through 51C show plan views for explaining methods of manufacturing a semiconductor device according to some embodiments of the present inventive concept.
Figure 51B:
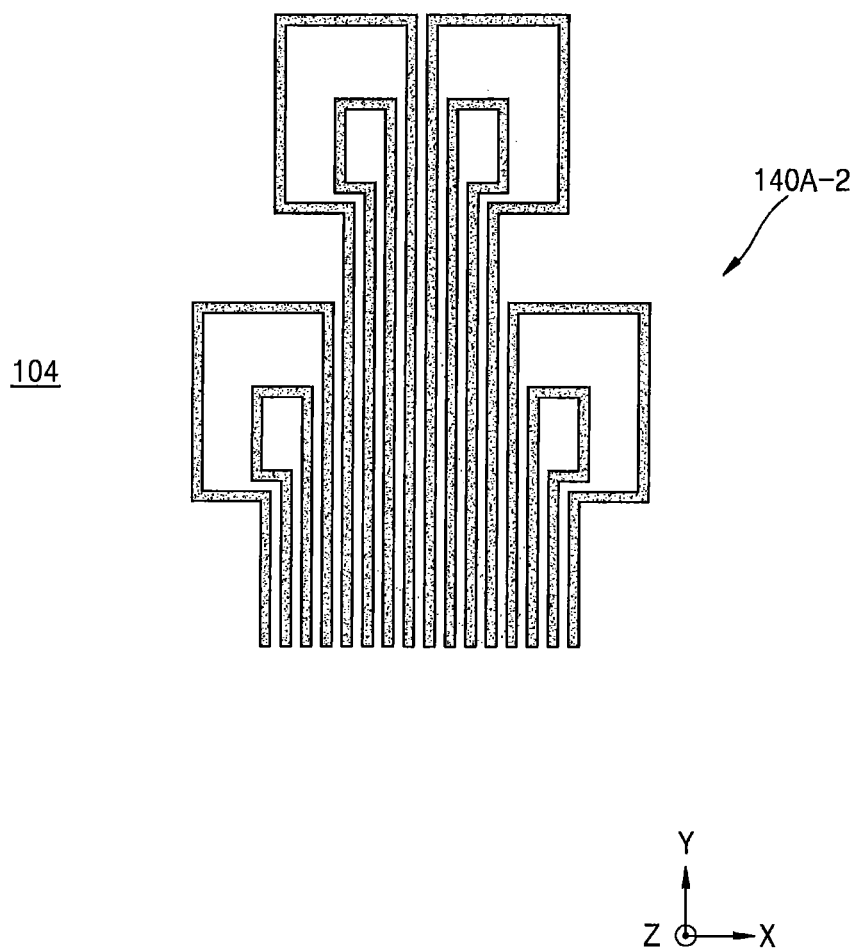
Figure 51C:
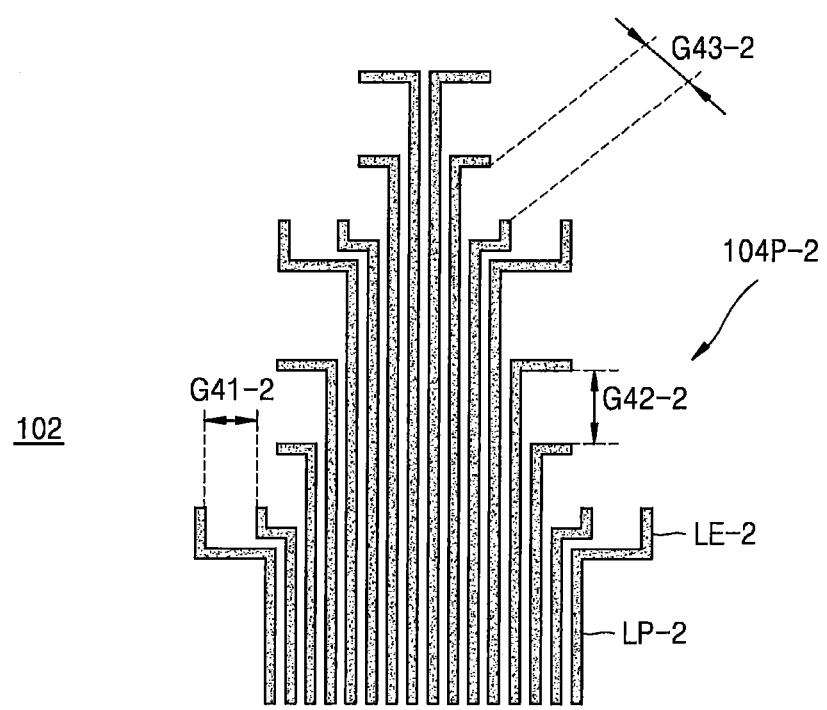

FIGS. 51A through 51C show plan views for explaining methods of manufacturing a semiconductor device according to some embodiments. FIGS. 51A, 51B, and 51C show plan views for explaining some of operations corresponding to FIGS. 20, 34, and 40, and other operations are similar to those of a method of manufacturing a semiconductor device described with reference to FIGS. 20 through 41, and thus intermediate operations and a detailed explanation thereof will not be given.

Referring to FIG. 51A, a first base pattern 120-2 may include the plurality of first main base patterns 120a and first sub-base patterns 120B-2 that are connected to one end of each of the plurality of first main base patterns 120A.

Each of the first sub-base pattern 120B-2 may have a rectangular shape whose length in the second direction Y is greater than a width in the first direction X.

Referring to FIG. 51B, a length of a second spacer layer 140A-2 that extends in the second direction Y to correspond to a shape of the first base pattern 120-2 of FIG. 51A may be greater than that of the second spacer layer 140A of FIG. 34.

Referring to FIG. 51C, the feature pattern 104P-2 may include a plurality of line patterns LP-2.

When a direction which line ends LE-2 of one adjacent pair of line patterns LP-2 among four continuous line patterns LP-2 face is the second direction Y, a distance between the line ends LE-2 of the adjacent pair of line patterns LP-2 may be a fourth gap G41-2. When a direction which the line ends LE-2 of another adjacent pair of line patterns LP-2 among the four continuous line patterns LP-2 face is the first direction X, a distance between the line ends LE-2 of the adjacent pair of line patterns LP-2 may be a fifth gap G42-2. A distance between the line ends LE-2 of two inner line patterns LP-2 among the four continuous line patterns LP-2 may be a sixth gap G43-2.

Since the first base pattern 120-2 of FIG. 51A includes the first sub-base pattern 120B-2 that has a rectangular shape whose length in the second direction Y is relatively large, the fifth gap G42-2 may be greater than the fourth gap G41-2.

Figure 52A:
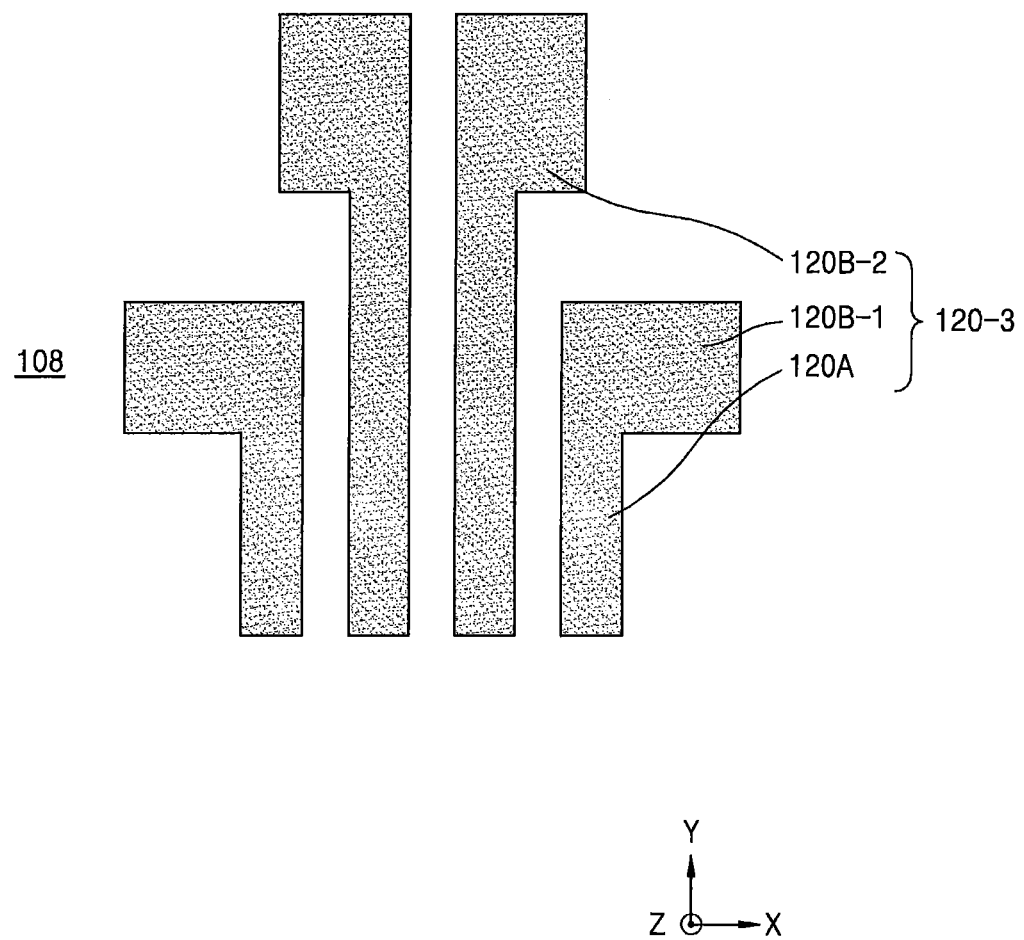
FIGS. 52A through 52C show plan views for explaining methods of manufacturing a semiconductor device according to an exemplary embodiment.
Figure 52B:
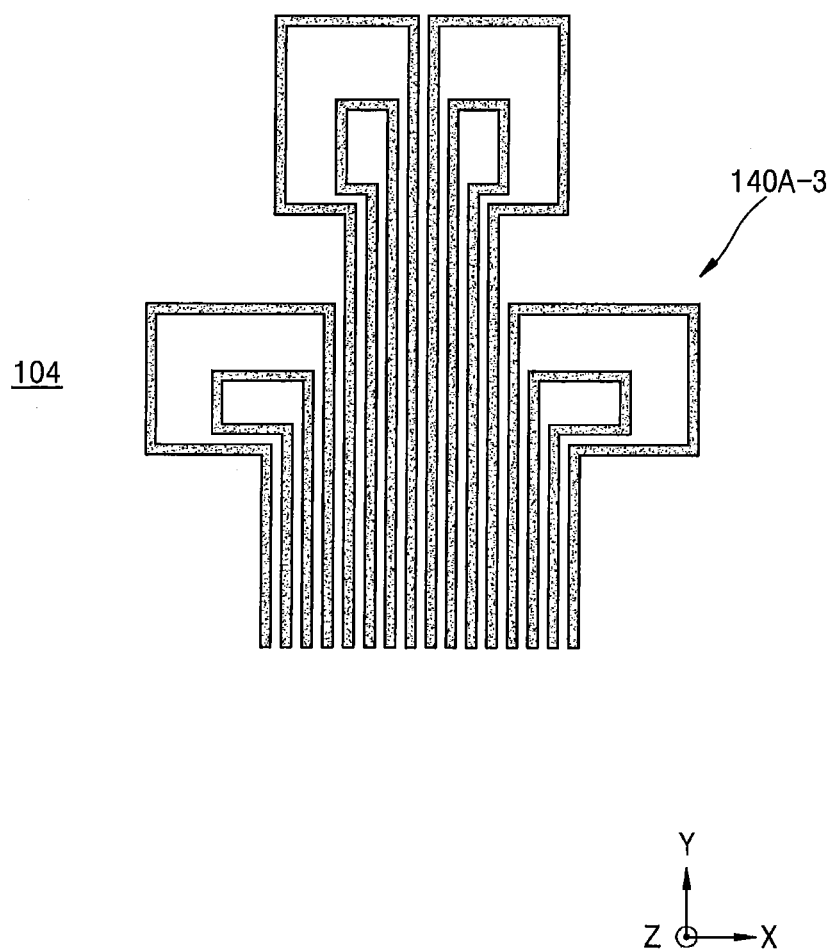
Figure 52C:
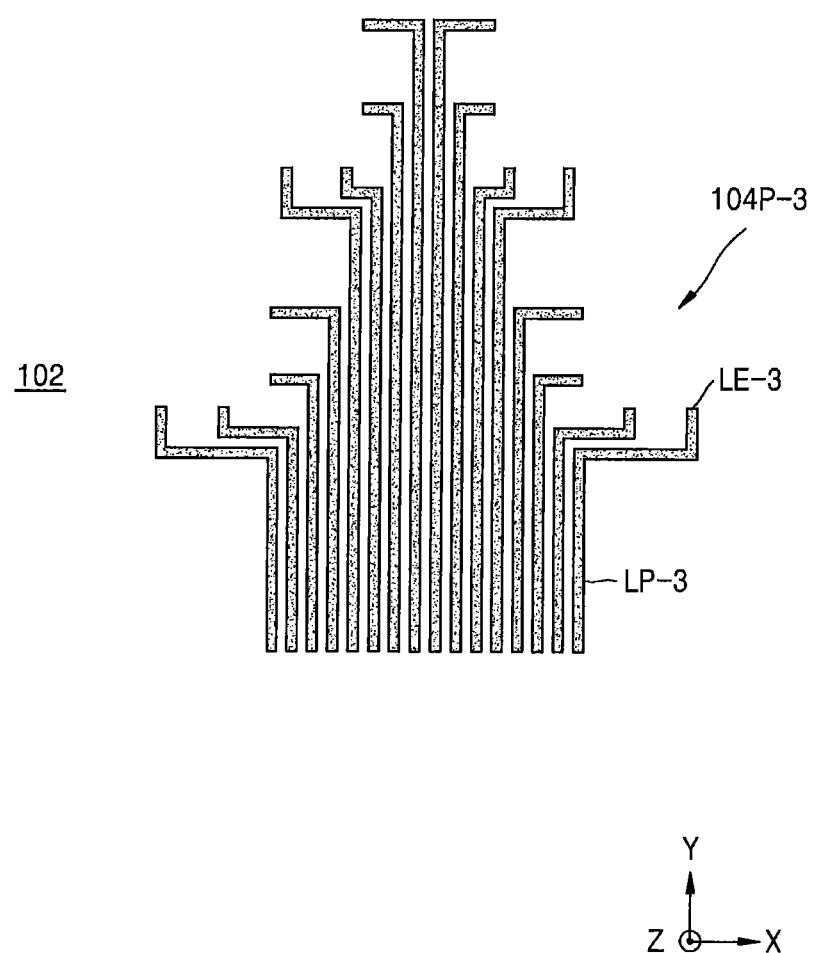

FIGS. 52A through 52C show plan views for explaining methods of manufacturing a semiconductor device according to some embodiments. In detail, FIGS. 52A through 52C show plan views for explaining a combination of methods of manufacturing a semiconductor device of FIGS. 50A through 50C and methods of manufacturing a semiconductor device of FIGS. 51A through 51C, and thus a detailed explanation thereof will not be given.

Referring to FIGS. 52A through 52C, a first base pattern 120-3 may include a plurality of first main base patterns 120A and first sub-base patterns 120B-1 and 120B-2 that are connected to one end of each of the plurality of first main base patterns 120A.

The first sub-base pattern 120B-1 may have a rectangular shape whose width in the first direction X is greater than a length in the second direction Y, and the first sub-base pattern 120B-2 may have a rectangular shape whose length in the second direction Y is greater than a width in the first direction X.

Accordingly, a width of a second spacer layer 140A-3 that extends in the first direction X to correspond to a shape of the first base pattern 120-3 of FIG. 52A may be greater than that of the second spacer layer 140A of FIG. 34, and a length of the second spacer layer 140A-3 that extends in the second direction Y may be greater than that of the second spacer layer 140A of FIG. 34.

A feature pattern 104P-3 may include a plurality of line patterns LP-3. In the plurality of line patterns LP-3, even when directions which line ends LE-3 of one adjacent pair of line patterns LP-3 face are the same, distances between the line ends LE-3 may be different. Accordingly, an arrangement of the feature pattern 104P-3 may be determined to prevent bridge failure in a process according to a pattern density.

Figure 53A:
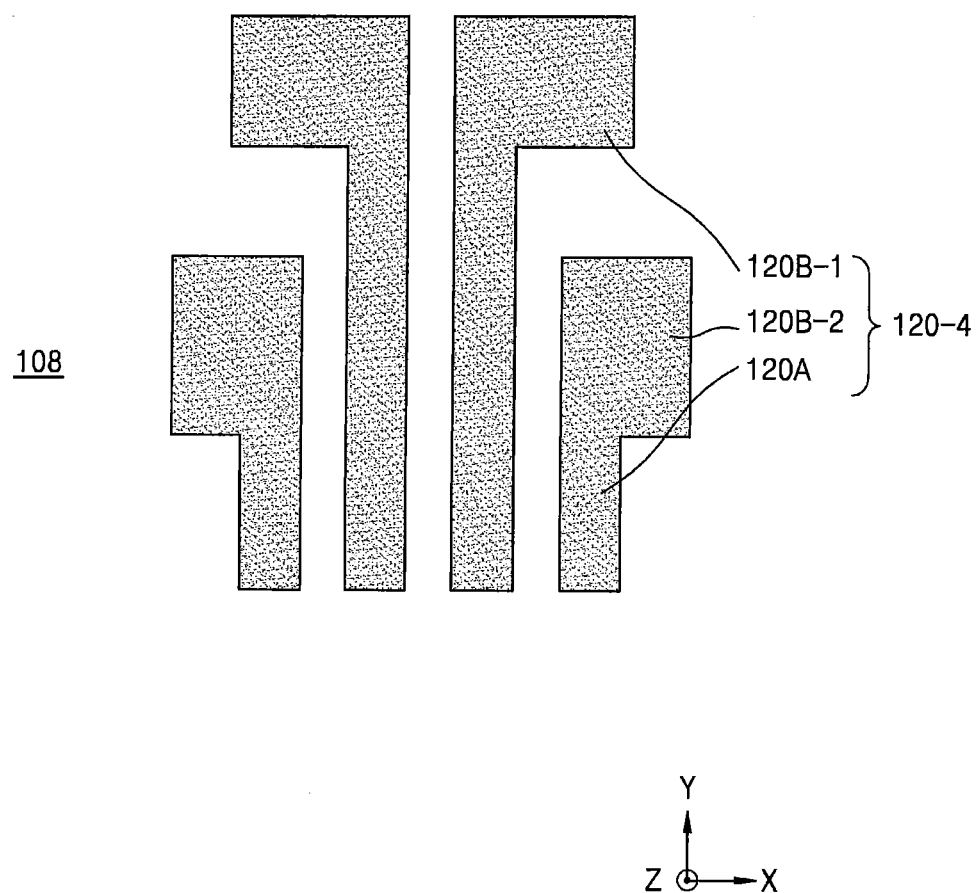
FIGS. 53A through 53C show plan views for explaining methods of manufacturing a semiconductor device according to some embodiments of the present inventive concept.
Figure 53B:
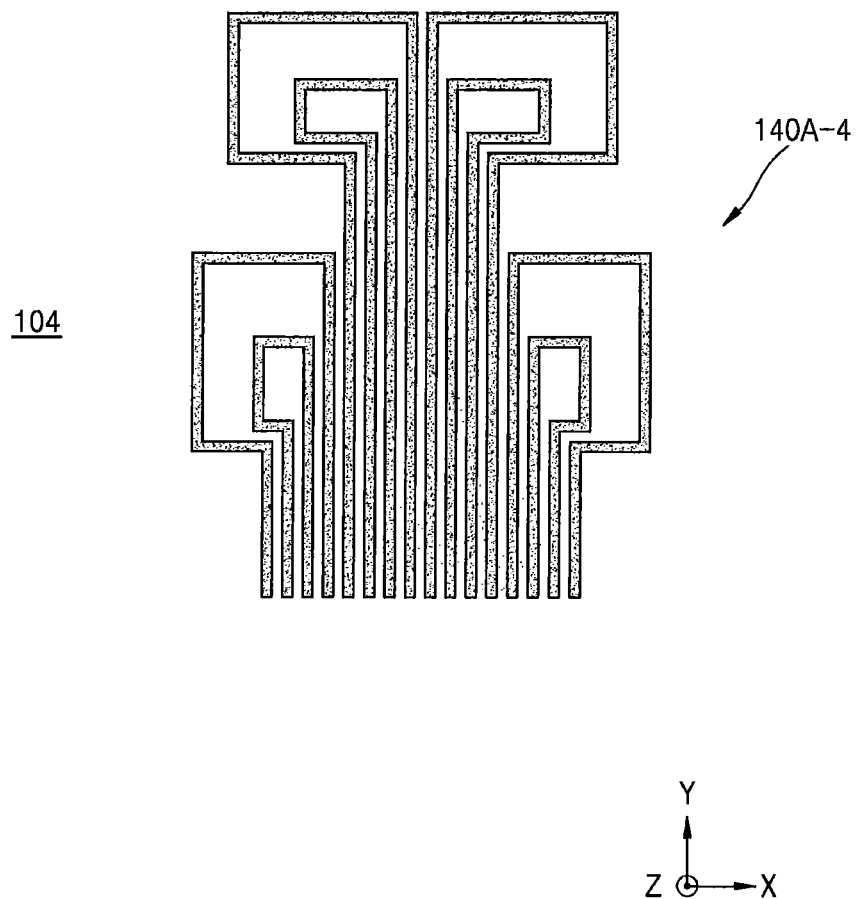
Figure 53C:
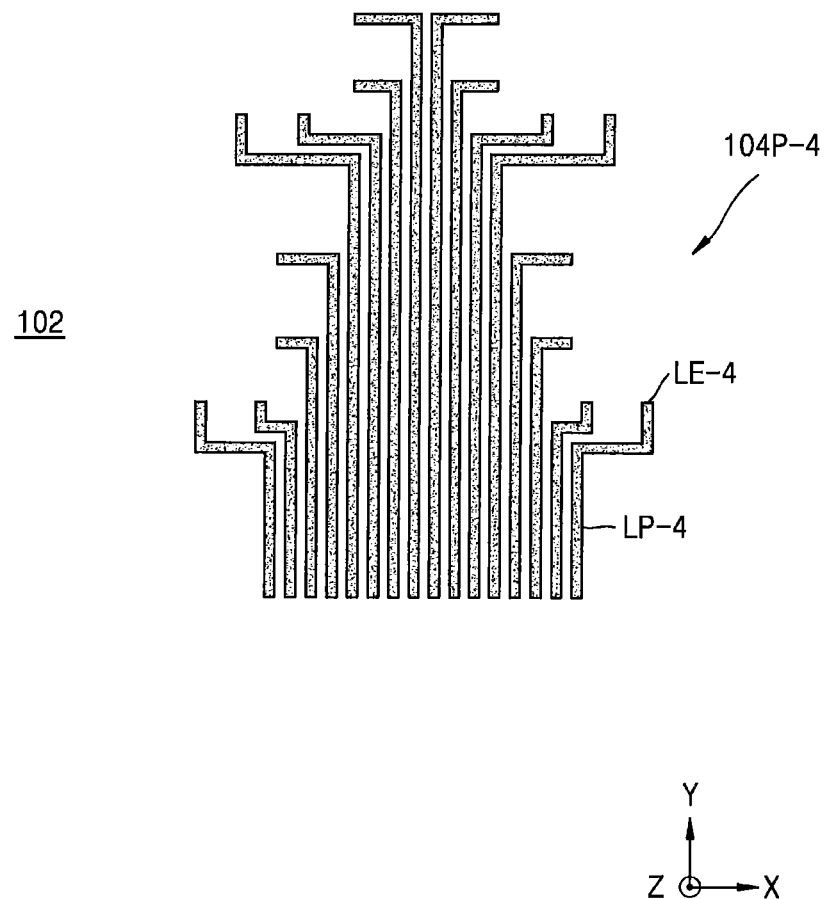

FIGS. 53A through 53C show plan views for explaining methods of manufacturing a semiconductor device according to some embodiments. The same description as that already made with reference to FIGS. 52A through 52C will not be repeated.

Referring to FIGS. 53A through 53C, a first base pattern 120-4 may include the plurality of main base patterns 120A, and first sub-base patterns 120B-1 and 12B-2 that are connected to one end of each of the plurality of first main base patterns 120A. The first main base patterns 120A and the first sub-base patterns 120B-1 and 120B-2 constituting the first base pattern 120-4 have shapes similar to those of the first base pattern 120-3 of FIGS. 52A through 52C, except some arrangement.

Accordingly, a space for arranging a plurality of line patterns LP-4 of a feature pattern 104P-4 may be less than a space for arranging the plurality of line patterns LP-3 of FIG. 52. Accordingly, a pattern density of the semiconductor device may be increased, thereby increasing a degree of integration.

Figure 54A:
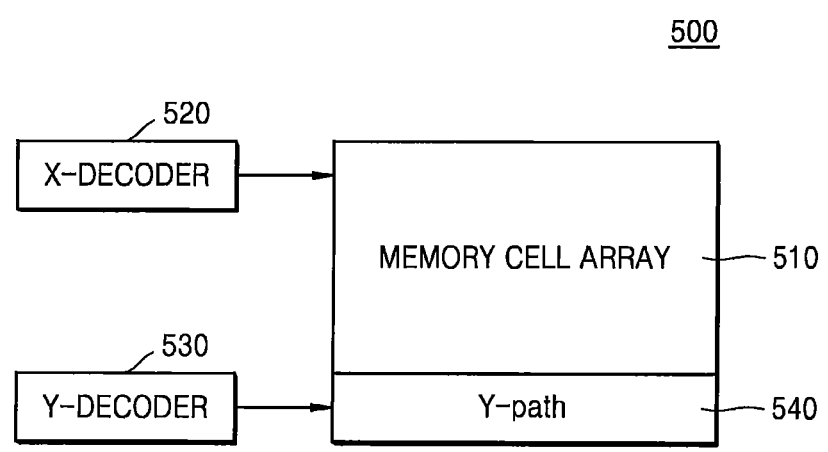
FIGS. 54A and 54B are respectively a block diagram of a semiconductor device to which some embodiments described herein are applied and a circuit diagram of a memory cell array included in the semiconductor device of FIG. 54A.
Figure 54B:
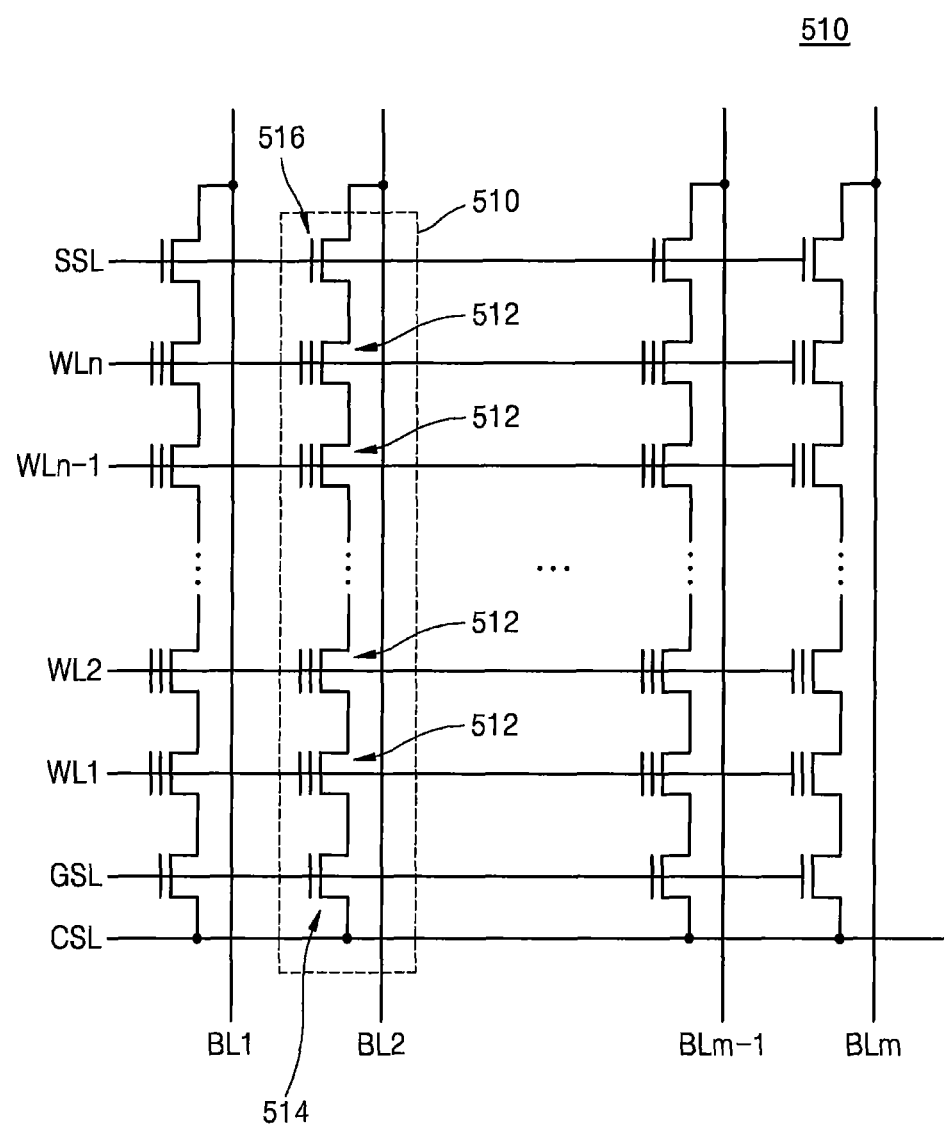

FIG. 54A is a block diagram of a semiconductor device 500 to which example embodiments are applied. FIG. 54B is a circuit diagram of a memory cell array 510 included in the semiconductor device 500 of FIG. 54A.

Referring to FIGS. 54A and 54B, the semiconductor device 500 may be a NAND flash memory device. The semiconductor device 500 includes the memory cell array 510 including an array of memory cells that are arranged at a high density. A peripheral circuit for accessing and driving the memory cell array 510 includes an X-decoder block 520 that selects any of word lines WL, for example, word lines WL1, WL2, . . . , WLn−1, and WLn, of the memory cell array 510 to be accessed. A Y-decoder block 530 selects any of bit lines BL, for example, bit lines BL1, BL2, . . . , BLm−1, and BLm, of the memory cell array 510 to be activated. A Y-path circuit 540 that is connected to the memory cell array 510 allocates a bit line path based on an output of the Y-decoder block 530.

Referring to FIG. 54B, a cell string 510 of the memory cell array 510 includes a plurality of memory cells 512 that are serially connected. Gate electrodes of the plurality of memory cells 512 that are included in one cell string 510 are connected to different word lines WL1, WL2, . . . , WLn−1, and WLn. A ground selection transistor 514 that is connected to a ground selection line GSL and a string selection transistor 516 that is connected to a string selection line SSL are disposed at both ends of the cell string 510. The ground selection transistor 514 and the string selection transistor 516 control electrical connection between the bit lines BL1, BL2, . . . , BLm−1, and BLm and a common source line CSL. Memory cells that are connected to one word line WL1, WL2, . . . , WLn−1, or WLn across a plurality of the cell strings 510 form a page unit or a byte unit.

In order to perform a read operation or a write operation by selecting a predetermined memory cell in the semiconductor device 500 of FIG. 54A, the predetermined memory cell is selected by selecting any of the word lines WL1, WL2, . . . , WLn−1, and WLn and the bit lines BL1, BL2, . . . , BLm−1, and BLm of the memory cell array 510 by using the X-decoder block 520 and the Y-decoder block 530.

A NAND flash memory device has a relatively high degree of integration due to a structure in which a plurality of memory cells are serially connected. However, it is required to further reduce design rules for a NAND flash memory device in order to shrink a size of a chip. Also, as design rules have reduced, a minimum pitch of patterns that are necessary to form the NAND flash memory device has also been greatly reduced. In order to form fine patterns according to reduced design rules, the inventive concept provides a semiconductor device having an arrangement structure that may secure a sufficient process margin while using patterns having sizes within a resolution limit of exposure equipment and exposure technology of lithography that has been developed so far and a method of manufacturing the semiconductor device.

For example, the feature patterns 14P, 14Pa, 104Pb, 104P, 104Pa, 104Pb, 104P-1, 104P-2, 104P-3, and 104P-4 of FIGS. 1 through 53C may correspond to the word lines WL1, WL2, . . . , WLn−1, and WLn of FIG. 54B.

Figure 54C:
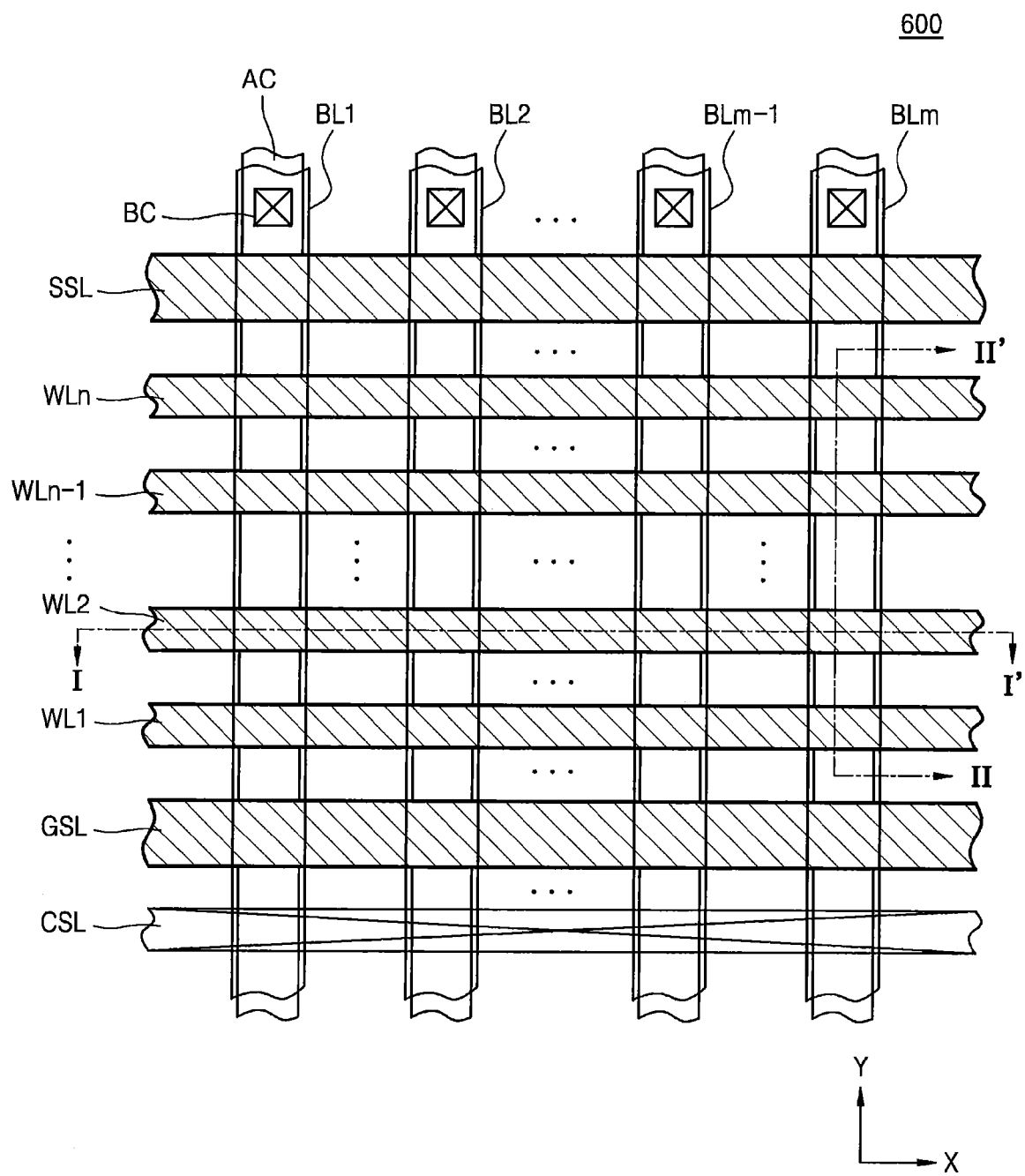
FIG. 54C is a layout illustrating some elements of a memory cell array of the semiconductor device 600 according to some embodiments.
Figure 54D:
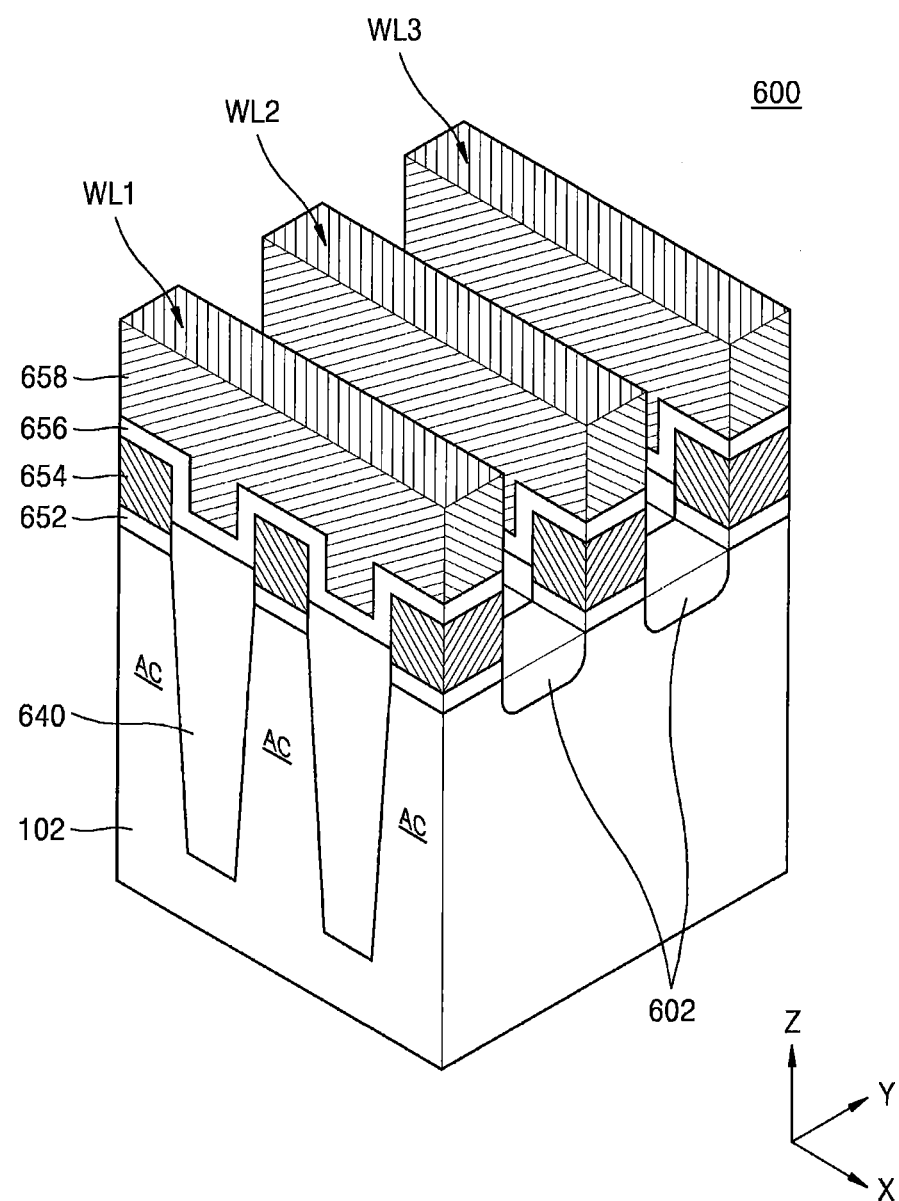
FIG. 54D is a perspective view illustrating some elements of the memory cell array of the semiconductor device 600 according to some embodiments.

FIGS. 54C and 54D are views for explaining a semiconductor device 600 and methods of a manufacturing the semiconductor device 600 according to some embodiments. FIG. 54C is a layout illustrating some elements of a memory cell array of the semiconductor device 600 according to some embodiments. FIG. 54D is a perspective view illustrating some elements of the memory cell array of the semiconductor device 600 according to some embodiments.

FIGS. 54C and 54D illustrate some elements of a memory cell array of a NAND flash memory device that is a nonvolatile memory device. In FIG. 54D, some elements, for example, bit lines, of the semiconductor device 600 that is a NAND flash memory device of FIG. 54C are not shown. In FIGS. 54C and 54D, the same elements as those in FIG. 54B are denoted by the same reference numerals, and a detailed explanation thereof will not be given.

Referring to FIGS. 54C and 54D, the semiconductor device 600 may include a plurality of active regions AC that are defined by a plurality of device isolation regions 640 that are formed on the substrate 102. The plurality of active regions AC may include a plurality of line patterns that are parallel to one another.

The string selection line SSL and the ground selection line GSL that cross over the plurality of active regions AC may be disposed on the plurality of active regions AC. The plurality of word lines WL1, WL2, . . . , WLn−1, and WLn that cross over the plurality of active regions AC may be disposed between the string selection line SSL and the ground selection line GSL. The string selection line SSL, the ground selection line GSL, and the plurality of word lines WL1, WL2, . . . , WLn−1, and WLn may be parallel to one another.

A plurality of impurity regions 602 may be formed in the plurality of active regions AC that are adjacent to both sides of the plurality of word lines WL1, WL2, . . . , WLn−1, and WLn, the string selection line SSL, and the ground selection line GSL. Accordingly, a string selection transistor, memory cell transistors, and a ground selection transistor that are serially connected may be formed. The string selection transistor, the ground selection transistor, and the memory cell transistors that are located between the string selection transistor and the ground selection transistor may constitute one unit memory string.

The plurality of active regions AC that are adjacent the string selection line SSL and are located opposite to the ground selection line GSL may be defined as a drain region of each string selection transistor. Also, the plurality of active regions AC that are adjacent the ground selection line GSL and are located opposite to the string selection line SSL may be defined as a source region of each ground selection transistor.

The plurality of word lines WL1, WL2, . . . , WLn−1, and WLn may extend to intersect the plurality of active regions AC. Each of the plurality of word lines WL1, WL2, . . . , WLn−1, and WLn may include a tunneling insulating layer 652, a charge storage layer 654, a blocking insulating layer 656, and a gate electrode layer 658 that are sequentially stacked on the substrate 102.

The tunneling insulating layer 652 and the charge storage layer 654 may be be included in each of memory cell transistors two of which are adjacent to each other in a direction in which the plurality of word lines WL1, WL2, . . . , WLn−1, and WLn extend.

The tunneling insulating layer 652 may be formed of silicon oxide, silicon oxynitride, silicon oxide doped with impurities, or a low-k material having a dielectric constant lower than that of silicon oxide. The charge storage layer 654 may be a charge trap layer or a conductive layer. The charge storage layer 654 may include a semiconductor doped with a dopant, for example, doped polysilicon. The charge storage layer 654 may be electrically insulated due to the tunneling insulating layer 652 and the blocking insulating layer 656.

The blocking insulating layer 656 may be shared by the memory cell transistors that are adjacent in the direction in which the plurality of word lines WL1, WL2, . . . , WLn−1, and WLn extend. The blocking insulating layer 656 may be formed of a silicon oxide film, a silicon nitride film, or may have a stacked structure formed of a combination of a silicon oxide film and a silicon nitride film. In some embodiments, the blocking insulating layer 656 may be formed of an oxide-nitride-oxide (ONO) film. In some embodiments, the blocking insulating layer 656 may include a high-k material having a dielectric constant higher than that of silicon oxide.

The gate electrode layer 658 may be an electrode that controls a program operation and an erase operation. The gate electrode layer 658 may be formed to be connected between the memory cell transistors that are adjacent in the direction in which the plurality of word lines WL1, WL2, . . . , WLn−1, and WLn extend. In some embodiments, the gate electrode layer 658 may be a conductive film including a doped semiconductor, metal silicide, or a combination thereof. For example, the gate electrode layer 658 may include doped polysilicon.

At least one of the string selection line SSL and the ground selection line GSL may have the same stacked structure as a stacked structure of the plurality of word lines WL1, WL2, . . . , WLn−1, and WLn at intersections between the at least one of the string selection line SSL and the ground selection line GSL and the plurality of active regions AC. In some embodiments, the charge storage layer 654 and the gate electrode layer 658 may be electrically connected to each other. A width of each of the string selection line SSL and the ground selection line GSL may be greater than a width of each of the plurality of word lines WL1, WL2, . . . , WLn−1, and WLn. However, the present embodiments are not limited thereto.

As shown in FIG. 54C, the semiconductor device 600 may include the plurality of bit lines BL1, BL2, . . . , BLm−1, and BLm that cross over the plurality of word lines WL1, WL2, . . . , WLn−1, and WLn. The plurality of bit lines BL1, BL2, . . . , BLm−1, and BLm may connect to a drain region of the string selection line SSL through a bit line contact BC. The plurality of bit lines BL1, BL2, . . . , BLm−1, and BLm may be disposed parallel to the plurality of active regions AC.

In some embodiments, the plurality of word lines WL1, WL2, . . . , WLn−1, and WLn of FIGS. 54C and 54D may have an arrangement of the feature patterns 14P, 14Pa, 104Pb, 104P, 104Pa, 104Pb, 104P-1, 104P-2, 104P-3, and 104P-4 of FIGS. 1 through 53C or a modification thereof without departing from the scope of the inventive concept.

In some embodiments, the plurality of active regions AC and/or the plurality of word lines WL1, WL2, . . . , WLn−1, and WLn of FIGS. 54C and 54D may have an arrangement of the feature patterns 14P, 14Pa, 104Pb, 104P, 104Pa, 104Pb, 104P-1, 104P-2, 104P-3, and 104P-4 of FIGS. 1 through 53C or a modification thereof without departing from the scope of the inventive concept.

In some embodiments, a 3D memory array is provided. The 3D memory array is monolithically formed at at least one physical level of memory cell arrays having an active region that is disposed on a silicon substrate and a circuit that is related to operations of the memory cells and is formed on or in the silicon substrate. When first layers in an array are 'monolithically' formed, it means that the first layers are directly stacked over second layers whose levers are lower than those of the first layers.

In some embodiments, the 3D memory array includes vertical NAND strings that are vertically disposed so that at least one memory cell is located over another memory cell. The at least one memory cell may include a charge trap layer.

U.S. Pat. Nos. 7,679,133, 8,553,466, 8,654,587, and 8,559,235 and US Patent Application Publication No. 2011/0233648, which are referred to herein, disclose a 3D memory array that is configured to have a plurality of levels and in which word lines and bit lines are shared between the levels.

Figure 55:
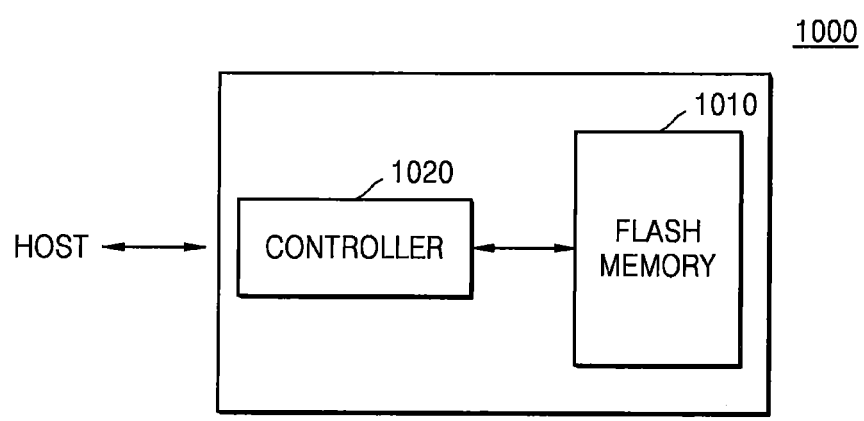
FIG. 55 is a block diagram of a memory card including a semiconductor device formed according to some embodiments of the present inventive concept.

FIG. 55 is a block diagram of a memory card 1000 including a semiconductor device formed according to some embodiments.

Referring to FIG. 55, the memory card 1000 includes a flash memory 1010 and a controller 1520.

The flash memory 1010 may store data. In some embodiments, the flash memory 1010 may be nonvolatile and thus may retain stored data even when power supply thereto is cut off. The flash memory 1010 may be formed by using methods of a manufacturing a semiconductor device according to some embodiments of FIGS. 1 through 54D or a modification thereof without departing from the scope of the inventive concept.

The controller 1020 may read data that is stored in the flash memory 1010 or may store data in the flash memory 1010 in response to a read/write request of a host HOST.

Figure 56:
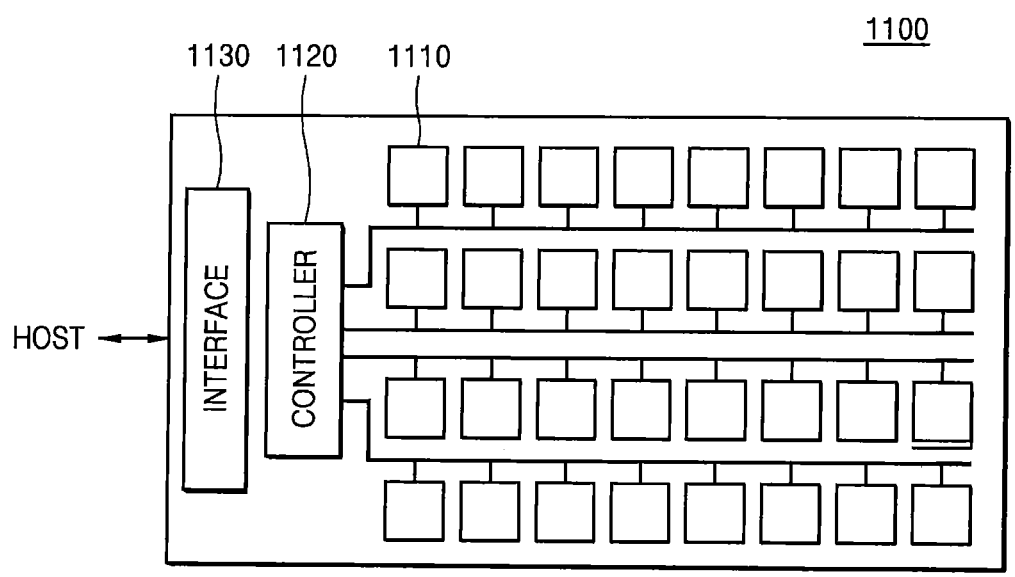
FIG. 56 is a block diagram of a solid-state drive (SSD) including a semiconductor device formed according to some embodiments of the present inventive concept.

FIG. 56 is a block diagram of a solid-state drive (SSD) 1100 including a semiconductor device formed according to some embodiments.

Referring to FIG. 56, the SSD 1100 includes a plurality of flash memories 1110 and a controller 1120. The flash memories 1110 may store data. In some embodiments, the flash memories 1110 may be nonvolatile and thus may retain stored data even when power supply thereto is cut off. The flash memories 1110 may be formed by methods of a manufacturing a semiconductor device according to some embodiments of FIGS. 1 through 54D or a modification thereof without departing from the scope of the inventive concept.

The controller 1120 may read data that is stored in the flash memory 1110 or may store data in the flash memory 1110 in response to a read/write request of the host HOST.

An interface 1130 may transmit or receive a command and an address signal to or from the host HOST, and may transmit or receive a command and an address signal to or from the flash memory 1110 through the controller 1120.

The SSD 1110 may further include a passive device such as a filter capacitor or a resistor, a DC-DC converter, a quartz crystal for generating a clock signal, a temperature sensor, and/or a cache memory.

Figure 57:
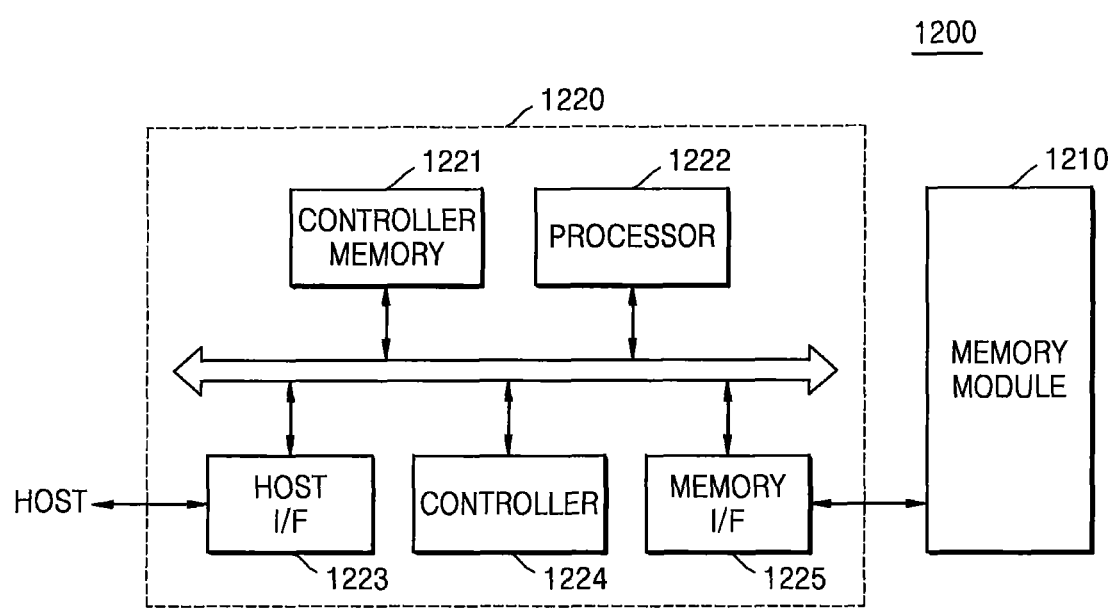
FIG. 57 is a block diagram of a memory card including a semiconductor device formed according to some embodiments of the present inventive concept.

FIG. 57 is a block diagram of a memory card 1200 including a semiconductor device formed according to some embodiments.

Referring to FIG. 57, the memory card 1200 includes a memory controller 1220 that generates a command and an address signal, a memory module 1210, and a flash memory including, for example, one or more flash memory devices. The memory controller 1220 includes a host interface 1223 that transmits or receives a command and an address signal to or from a host, and a memory interface 1225 that transmits or receives a command and an address signal to or from the memory module 1210. The host interface 1223, the controller 1224, and the memory interface 1225 communicate with a controller memory 1221 such as a static random-access memory (SRAM) and a processor 1222 such as a central processing unit (CPU) via a common bus.

The memory module 1210 receives a command and an address signal from the memory controller 1220, stores data in at least one of memory devices on the memory module 1210 as a response, and searches for the data in the at least one of the memory devices. Each memory device includes a plurality of addressable memory cells, and a decoder that receives a command and an address signal and generates a row signal and a column signal in order to access at least one of the addressable memory cells during a program operation and a read operation.

At least one of the elements of the memory card 1200 including the memory controller 1220, that is, electronic devices (e.g., 1221, 1222, 1223, 1224, and 1225) included in the memory controller 1220, and the memory module 1210, may be formed by using methods of a manufacturing a semiconductor device according to some embodiments of FIGS. 1 through 54D or a modification thereof without departing from the scope of the inventive concept.

Figure 58:
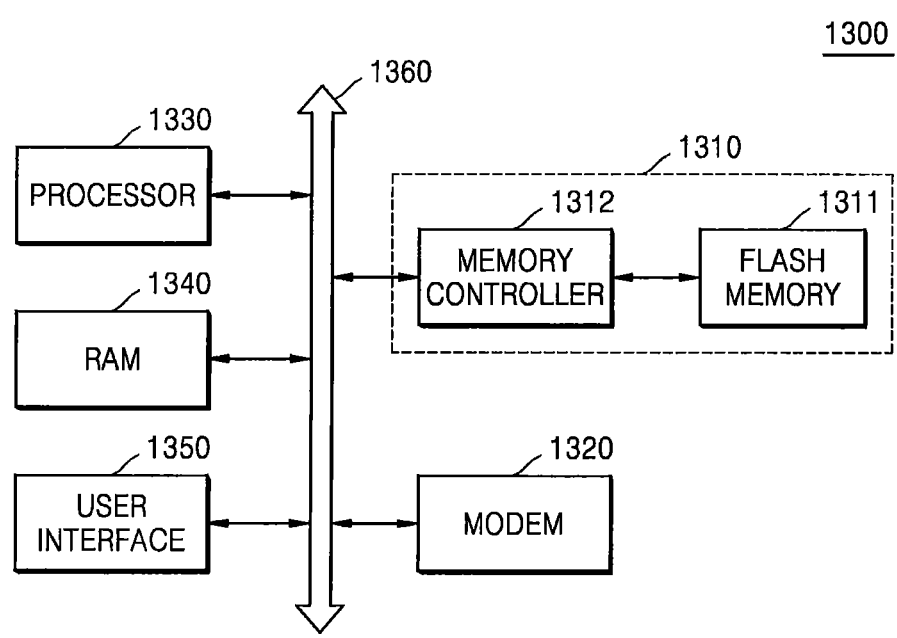
FIG. 58 is a block diagram of a memory system including a memory card including a semiconductor device according to some embodiments of the present inventive concept.

FIG. 58 is a block diagram of a memory system 1300 including a memory card 1310 including a semiconductor device according to some embodiments.

Referring to FIG. 58, the memory system 1300 may include a processor 1330, such as a CPU, a random-access memory (RAM) 1340, a user interface 1350, and a modem 1320 which communicate with one another via a common bus 1360. Each device transmits a signal to the memory card 1310 and receives a signal from the memory card 1310 via the bus 1360. The memory card 1310 may include a flash memory 1311 and a memory controller 1312. The flash memory 1310 may store data. In some embodiments, the flash memory 1310 may be nonvolatile and thus may retain data even when power supply thereto is cut off. At least one of elements of the memory system 1300 including the memory card 1310, that is, the processor 1330, the RAM 1340, the user interface 1350, and the modem 1320, may be formed by using methods of a manufacturing a semiconductor device according to some embodiments of FIGS. 1 through 54D or a modification thereof without departing from the scope of the inventive concept.

The memory system 1300 may be applied to various electronic products. For example, the memory system 1300 may be applied to a SSD, a CMOS image sensor (CIS), and a computer application chipset.

Memory systems and devices disclosed herein may be packaged int various forms by using, but not limited to, a ball grid array (BGA), a chip scale package (CSP), a plastic leaded chip carrier (PLCC), a plastic dual in-line package (PDIP), a multi-chip package (MCP), a wafer-level fabricated package (WFP), and a wafer-level processed stock package (WSP).

According to the one or more embodiments herein, a semiconductor device may prevent bridge failure even when end portions of line patterns that are formed by etching a feature layer by using a spacer layer that has been trimmed as an etching mask are relatively thick.

A distance between ends of line patterns may be relatively large, without additional photolithography, only by using photolithography that has to be used to form pad patterns connected to the line patterns.

Accordingly, a reliable semiconductor device may be formed without additional manufacturing costs and time.

While the inventive concept has been particularly shown and described with reference to some embodiments thereof, they are provided for the purposes of illustration and it will be understood by those of ordinary skill in the art that various modifications and equivalent other embodiments can be made from the inventive concept.

While the inventive concept has been particularly shown and described with reference to some embodiments thereof by using specific terms, the embodiments and terms have merely been used to explain the inventive concept and should not be construed as limiting the scope of the inventive concept as defined by the claims. Therefore, the scope of the inventive concept is defined not by the detailed description of the inventive concept but by the appended claims, and all differences within the scope will be construed as being included in the inventive concept.

What is claimed is:

1. A semiconductor device comprising a plurality of line patterns that are spaced apart from one another, each of the plurality of line patterns comprising a main line that extends in a first direction and a subline that is bent from one end of the main line,
    wherein the plurality of line patterns comprise a plurality of line sets, wherein four line patterns that are continuously arranged form one line set,
    wherein at least one line set among the plurality of line sets comprises:
    a first subline set comprising a first main line and a second main line that have a first gap therebetween and extend in the first direction, and a first subline and a second subline that are bent respectively from one end of each of the first main line and the second main line have therebetween a second gap that is greater than the first gap, and comprise portions that extend in the first direction; and
    a second subline set comprising a third main line and a fourth main line that have the first gap therebetween and extend in the first direction, and a third subline and a fourth subline that have therebetween a third gap that is greater than the first gap and extend in a second direction, which is different from the first direction, respectively from one end of each of the third main line and the fourth main line.

2. The semiconductor device of claim 1, wherein a direction that end portions of the first and second sublines face is different from a direction that end portions of the third and fourth sublines face.

3. The semiconductor device of claim 2, wherein in the first subline and the second subline, lengths between the first and second main lines and the end portions of the first subline and the second subline are different from each other.

4. The semiconductor device of claim 2, wherein in the third subline and the fourth subline, lengths between the third and fourth main lines and the end portions of the third subline and the fourth subline are different from each other.

5. The semiconductor device of claim 2, wherein a sum of lengths of the first subline and the second subline between the first and second main lines and the end portions of the first subline and the second subline is greater than a sum of lengths of the third subline and the fourth subline between the third and fourth main lines and the end portions of the third subline and the fourth subline.

6. The semiconductor device of claim 2, wherein ends of the first subline and the second subline are located on a straight line that extends in the second direction.

7. The semiconductor device of claim 2, wherein ends of the third subline and the fourth subline are located on a straight line that extends in the first direction.

8. The semiconductor device of claim 2, wherein the at least one line set comprises first through fourth line patterns sequentially arranged, and a distance between an end of the second subline and an end of the third subline is greater than the second gap or the third gap.

9. The semiconductor device of claim 1, wherein the first subline and the second subline comprise first portions that respectively extend from the first main line and the second main line in the second direction and second portions that extend from the first portions in the first direction.

10. The semiconductor device of claim 9, wherein the first portions of the first subline and the second subline have the first gap therebetween and extend in the second direction.

11. The semiconductor device of claim 1, wherein the second gap and the third gap are the same size.

12. The semiconductor device of claim 1, wherein the second gap is greater than the third gap.

13. The semiconductor device of claim 1, wherein the third gap is greater than the second gap.

14. The semiconductor device of claim 1, wherein the first through fourth sublines are bent in the same direction respectively from the one end of each of the first through fourth main lines.

15. A semiconductor device comprising: a plurality of line patterns that are spaced apart from one another and comprise a plurality of main lines that have a first gap therebetween and extend in a first direction; and a plurality of sublines that are bent from one end of each of the plurality of main lines,
wherein ends of the plurality of sublines are spaced apart in a second direction from a line on which each of the plurality of main lines is disposed,
wherein the plurality of line patterns comprise a plurality of line sets, wherein four continuously arranged line patterns of the plurality of line patterns form one line set, and
wherein at least one line set among the plurality of line sets comprises:
a first subline set comprising a first main line and a second main line that have a first gap therebetween and extend in the first direction, and a first subline and a second subline that are bent respectively from one end of each of the first main line and the second main line, that have therebetween a second gap that is greater than the first gap, and comprise portions that extend in the first direction; and
a second subline set comprising a third main line and a fourth main line that have the first gap therebetween and extend in the first direction, and a third subline and a fourth subline that have therebetween a third gap that is greater than the first gap and extend in a second direction, which is different from the first direction, respectively from one end of each of the third main line and the fourth main line.

16. The semiconductor device of claim 15, wherein a direction that end portions of some sublines of the plurality of sublines face is different from a direction that end portions of other sublines of the plurality of sublines face.

17. The semiconductor device of claim 15, wherein the plurality of line patterns constitute a plurality of flash memory devices, and at least one of the plurality of flash memory devices comprises a three-dimensional (3D) memory array.

18. The semiconductor device of claim 17, wherein the 3D memory array comprises a nonvolatile memory that is monolithically formed at at least one physical level of memory cells having active regions disposed on a silicon substrate.

19. A semiconductor device comprising a plurality of line patterns that are spaced apart from one another, each of the plurality of line patterns comprising a main line that extends in a first direction and a subline that is bent from one end of the main line,
wherein the plurality of line patterns comprise a plurality of line sets, wherein four continuously arranged line patterns of the plurality of line patterns form one line set,
wherein at least one line set among the plurality of line sets comprises:
a first subline set comprising a first main line and a second main line that have a first gap therebetween and extend in the first direction, and a first subline and a second subline that are bent respectively from one end of each of the first main line and the second main line, that have therebetween a second gap that is greater than the first gap, and comprise portions that extend in the first direction;
a second subline set comprising a third main line and a fourth main line that have the first gap therebetween and extend in the first direction, and a third subline and a fourth subline that have therebetween a third gap that is greater than the first gap and extend in a second direction, which is different from the first direction, respectively from one end of each of the third main line and the fourth main line; and
a plurality of pad patterns that are connected to a second end of each of the main lines.

20. The semiconductor device according to claim 19, wherein a direction that end portions of the first and second sublines face is different from a direction that end portions of the third and fourth sublines face.

* * * * *